US007683703B2

(12) United States Patent  
Cavazzoni

(10) Patent No.: US 7,683,703 B2
(45) Date of Patent: Mar. 23, 2010

(54) ACTIVE FILTER

(76) Inventor: Roberto Cavazzoni, Via Fattori, 47, 42044 Gualtieri (Reggio Emilia) (IT)

( * ) Notice: Subject to any disclaimer, the term of this patent is extended or adjusted under 35 U.S.C. 154(b) by 282 days.

(21) Appl. No.: 10/566,456

(22) PCT Filed: Jul. 30, 2004

(86) PCT No.: PCT/IB2004/002485

§ 371 (c)(1),
(2), (4) Date: Jan. 30, 2006

(87) PCT Pub. No.: WO2005/011112

PCT Pub. Date: Feb. 3, 2005

(65) Prior Publication Data

US 2006/0197587 A1    Sep. 7, 2006

(30) Foreign Application Priority Data

Jul. 31, 2003    (IT)    ................ MI2003A1566

(51) Int. Cl.
*H03K 5/00* (2006.01)
(52) U.S. Cl. .................. 327/552; 327/554
(58) Field of Classification Search .......... 327/551–559
See application file for complete search history.

(56) References Cited

U.S. PATENT DOCUMENTS

| | | |
|---|---|---|
| 3,999,137 A | 12/1976 | Fucito |
| 4,001,712 A * | 1/1977 | Chambers et al. ............ 330/85 |
| 4,453,132 A | 6/1984 | Stamler |
| 4,659,995 A * | 4/1987 | Feistel ........................ 327/555 |
| 5,886,580 A * | 3/1999 | Ikeda et al. ................. 330/293 |

FOREIGN PATENT DOCUMENTS

| | | | |
|---|---|---|---|
| EP | PCT/EP88/00454 | * | 5/1988 |
| IT | RE 98U 000057 | | 12/1998 |

OTHER PUBLICATIONS

Soliman, Ahmed M. and Ismail, Mohammed, "A Universal Variable Phase 3-Port VCVS and Its Application in Two-Integrator Loop Filters"; XP-002240261; IEEE, C+1564-4/80/0000-0083500.75, 1980; P.D. 00-00-1920, pp. 83-86.

* cited by examiner

*Primary Examiner*—Dinh T. Le
(74) *Attorney, Agent, or Firm*—Pearne & Gordon LLP

(57) ABSTRACT

An active filter comprising a first stage (10), a second stage (20) and a third stage (30), each of them being provided with a respective operational amplifier (11, 21, 31); a feedback branch (50) defined by a resistor (51) connects the output (31c) of the third operational amplifier (31) to the inverting input (11a) of the first operational amplifier (11). A main resistor (60) is connected between the inverting input (11a) of the first operational amplifier (11) and a fixed-potential node, and in particular a grounded node.

37 Claims, 38 Drawing Sheets

FIG. 2.1

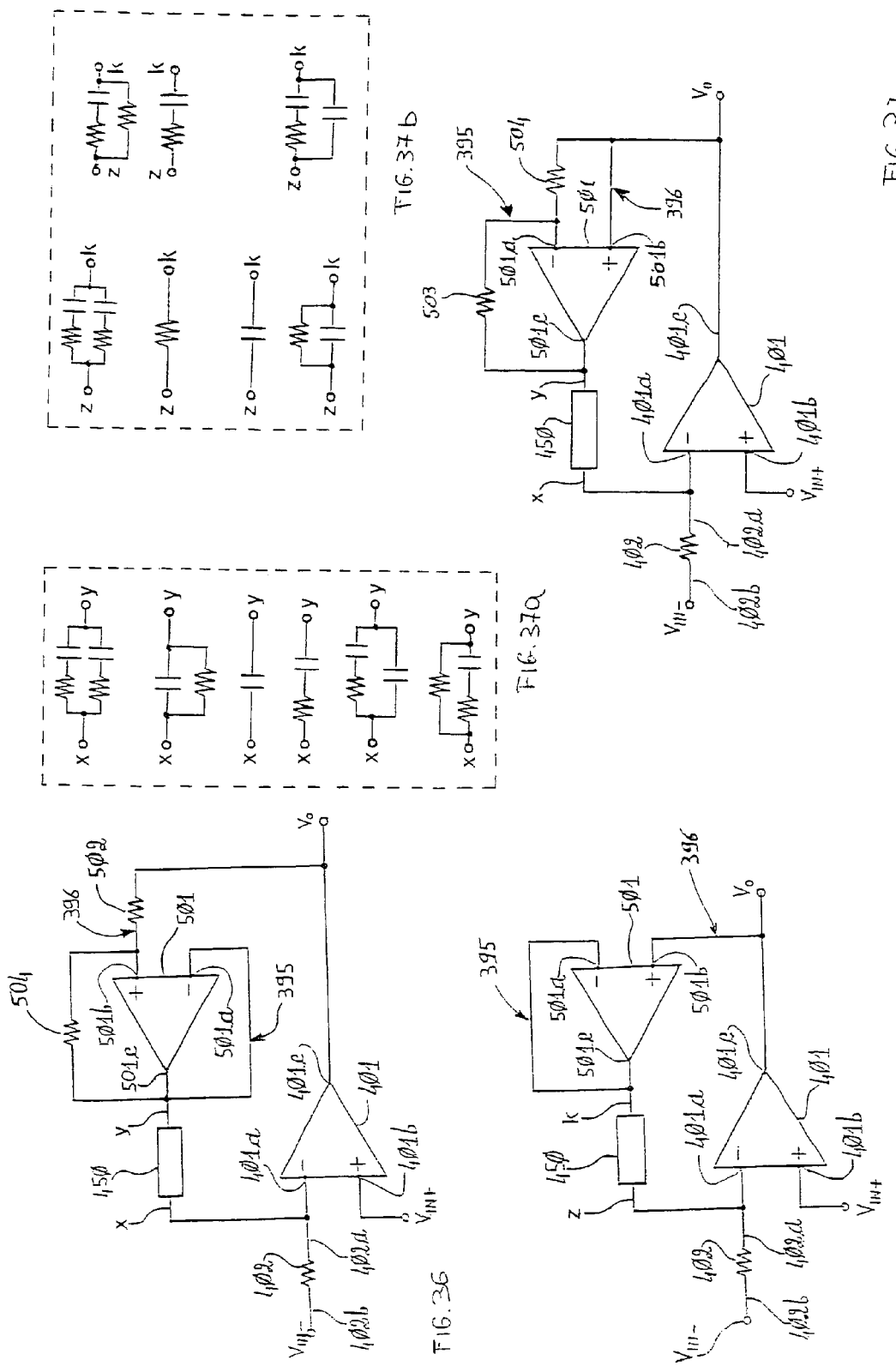

"Q" distribution histogram of the filter being the object of the invention (Fig. 17):

n samples = 392  sigma = 6.46999  median = 98.3578
n divisions = 2  minimum = 84.7776  90th %ile = 108.176
mean = 99.08  10th %ile = 91.0455  maximum = 116.224

"Q" distribution histogram relating to the filter in Fig. 1c:

| | | |
|---|---|---|
| n samples = 392 | sigma = 13.4131 | median = 102.897 |
| n divisions = 6 | minimum = 78.1725 | 90th %ile = 123.186 |
| mean = 104.839 | 10th %ile = 89.8247 | maximum = 158.455 |

ACTIVE FILTER

The present invention relates to an active filter and, more particularly, to techniques adapted to compensate for the parasitic poles generated by the amplifiers used in the filter itself.

It is known that in carrying out circuit analyses, mathematical models are used to describe the behaviour of the different electronic components and to calculate magnitudes of interest relating to the circuit under examination, through suitable algorithms and functions. A typical example of the mathematical models used is represented by the so-called transfer function describing exactly in a functional manner, the relationship existing between a signal placed at a given-stage input and the corresponding signal read at the output.

Obviously, the mathematical models used are not able to exactly describe the circuit reality to which they refer; they only constitute approximate descriptions and the accuracy of each model is directly connected with the precision it is wished as regards the obtained results. Therefore, the greater the precision and accuracy required for the results must be, the greater the accuracy and complexity of the utilised model.

Generally the differences existing between the "real" behaviour of an electronic component and the "ideal" model used for mathematical simulations relating to such a component are called "non-idealities".

In the specific sector concerning active filters, in particular of the resonant type, the most important non-idealities are caused by the so-called parasitic poles of the active stages composing the filter itself. A first solution proposed by the known art to compensate for the effects of the parasitic poles is diagrammatically shown in FIG. 1a: the resistor Rf is introduced in series with the feedback capacitor of an inverting integrator, by means of which the operational amplifier rectifies its answer.

A second compensating technique is diagrammatically shown in FIG. 1b. This circuit diagram refers to an active filter made up of three stages, each of them obtained with a suitably feedbacked operational amplifier; in particular, the opamp of the input stage is feedbacked through a parallel of a capacitor and a resistor whereas the opamp of the intermediate stage is disposed in a typical inverting configuration; the operational amplifier of the third stage is feedbacked through a capacitor so as to form a conventional inverting integrator stage. The additional connection, made for compensation purposes is denoted by letter "X"; this connection generally aims at eliminating the parasitic effects due to one of the active elements therein preset and, more particularly, at limiting the dependence of the filter behaviour on the thermal drifts of its components; in fact, as known, each electronic component varies its behaviour depending on the temperature at which it is. In this way, the quality factor "Q" of the third stage is enhanced making said stage more precise in the neighbourhood of its operating frequency, which leads the filter to have a degree of selectivity "Q" that is closer to the wished degree during the design or planning step.

However, this quality factor "Q" keeps in any case rather low; for the particular configuration illustrated, to low frequencies it is of:

$$Q = \frac{1}{2\left(\frac{1}{|A|^2} + \frac{1}{A_o}\right)}$$

wherein $|A|$ and $A_o$ are the open-loop dynamic gain and static gain respectively, of a general operational amplifier and correspondingly the filter is in any case not fully performing.

A drawback in the solutions briefly described above refers to the fact that these techniques are able to compensate for the non-idealities introduced by a single active stage without being able to efficiently operate on possible upstream-connected stages.

In other words, using the above mentioned known solutions, it is exclusively possible to compensate for the parasitic effects referable to only one singularity, without on the contrary being able to affect the non-idealities due to possible other parasitic poles.

It is therefore apparent that the obtained compensation is not satisfactory and does not allow the real filter behaviour to approach the ideal behaviour of said filter in an important manner.

A third known solution is shown in FIG. 1c in which a conventional biquadratic three-stage filter has been modified in such a manner that the first opamp A1 output is brought to the noninverting input of the second opamp A2, by means of resistor R, and the output of the third opamp A3 is brought to the noninverting input of the second opamp, by means of capacitor C; the inverting input of the second opamp on the contrary is grounded.

This circuit solution, unlike the two solutions previously shown, allows the effects of the parasitic poles of three stages composing a typical resonant active filter to be compensated for. However, in this case too, the obtainable results are of poor quality because in any case they do not enable operation with very high "Q" values, above all for relatively high frequencies. In addition, as a consequence of each known compensation technique, the opamp the circuit structure of which is modified for compensation purposes, in the last-mentioned case the second opamp A2, is frequency-destabilized; this means that for frequencies much higher than the work frequency "fo" of the filter, said filter can become unstable and output a signal of an amplitude comparable with that of the useful signal, which is clearly unacceptable.

An aim of the present invention is to make-available an active filter in which the non-ideal effects due to the parasitic poles introduced by the amplification stages utilised are compensated for.

It is a further aim of the present invention to provide an active filter in which the effects of a plurality of parasitic poles due to one or more amplification stages connected with each other in cascade or in parallel are compensated for.

Another aim of the present invention is to make available an efficient and functional active filter, characterised by a great simplicity from the point of view of circuit implementation and by a remarkable inexpensiveness in terms of manufacturing costs.

A still further aim of the invention is to provide an active filter in which the operational amplifiers are not destabilized at high frequency, due to the compensation itself.

Further features and advantages will become more apparent from the detailed description of a preferred but not limiting embodiment of an active filter, shown in the accompanying drawings, in which:

FIGS. 2-29 and 32 show several different embodiments of the active filter in accordance with the present invention;

FIGS. 30-31, 33-37 and 37a-37b show some circuit stages that can be used in the filter in accordance with the invention.

Figure 1A:
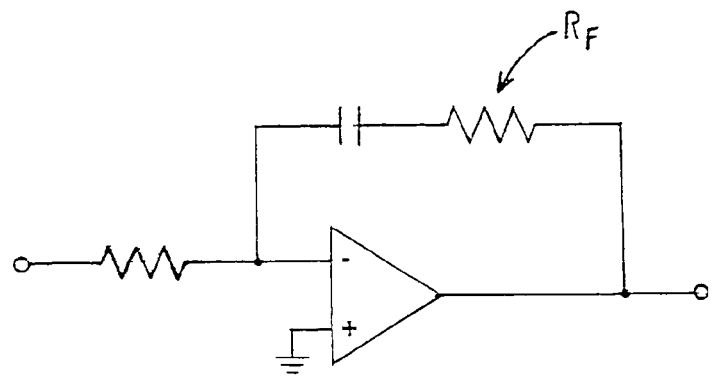
FIGS. 1a, 1b and 1c show the circuit diagram of compensated active filters in accordance with the known art.
Figure 1B:
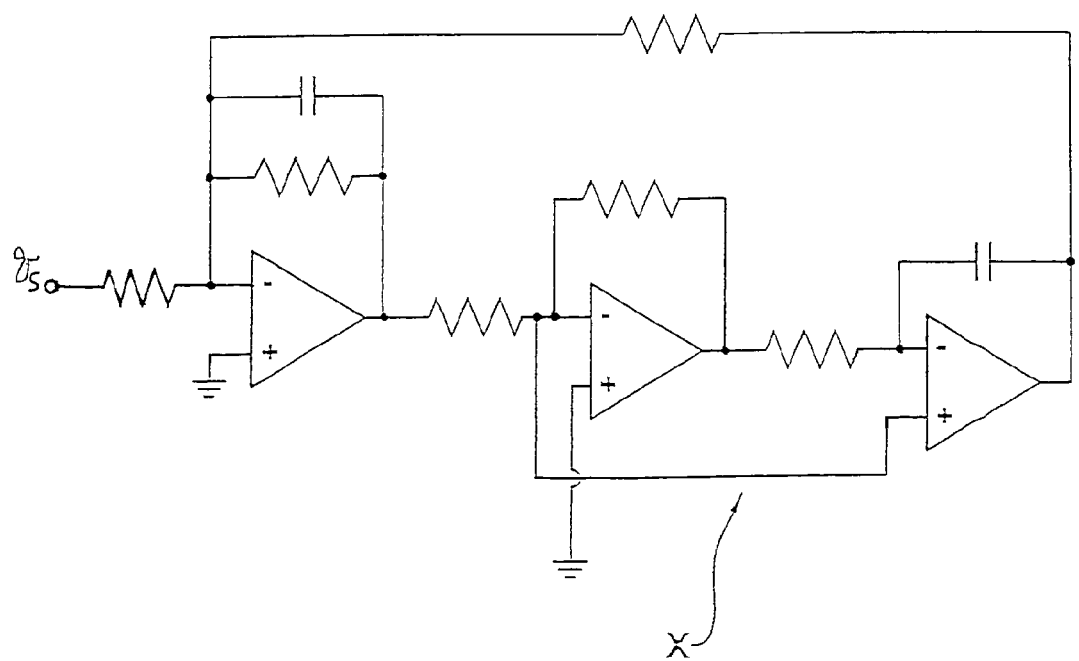

The active filter in accordance with the present invention is identified with reference numeral 1 in the accompanying figures.

The present invention relates to a multi-function active filter of the second order, substantially comprising a first stage 10 set to receive an input signal Vs, through a resistor 12, a second stage 20 and a third stage 30, connected with each other in cascade and provided with a first, a second and a third operational amplifiers 11, 21 and 31 respectively, each of which has an inverting input 11a, 21a, 31a, a noninverting input 11b, 21b, 31b and an output 11c, 21c, 31c.

Each output 11c, 21c, 31c is connected to the inverting input 11a, 21a, 31a of the same opamp through feedback means 13, 23, 33 defining respective negative-feedback branches 15, 25, 35.

Preferably, a resistor 22 is provided between the output 11c of the first opamp 11 and the inverting input 21a of the second opamp, and a resistor 32 is provided between the output 21c of the second opamp 21 and the inverting input 31a of the third opamp 31.

For sake of clarity, in the present description and in the following claims, the wording "element X connected between nodes A and node B" is intended to mean that the element X has an end connected to node A and another end connected to node B.

A main feedback branch 50, preferably defined by a resistor 51 has a first end 50a connected to the output 31c of the third opamp 31, and a second end 50b connected with the inverting input 11a of the first opamp 11.

In its main embodiment, filter 1 can further comprise a first connecting branch having a first end connected with the inverting input 11a, 21a, 31a of a predetermined one of the first, second and third operational amplifiers 11, 21 and 31, and a second end connected with at least one of the noninverting inputs of operational amplifiers different from the predetermined operational amplifier.

The noninverting input of the predetermined operational amplifier is connected to the ground either directly or through a resistor.

Filter 1 can further comprise a second connecting branch; the second connecting branch has a first end connected to the inverting input 11a, 21a, 31a of one of said first, second and third operational amplifiers 11, 21 and 31 and a second end connected with the noninverting input of another operational amplifier, different from the predetermined opamp (i.e. from the opamp to which the first end of the first connecting branch is connected).

Each connecting branch is defined by a direct connection or a respective fourth stage 40 comprising a fourth operational amplifier 41 having an inverting input 41a, a noninverting input 41b and an output 41c defining the second end of the corresponding connecting branch, whereas the noninverting input 41b defines the first end of the same connecting branch.

The output 41c is also connected with the inverting input 41a through a resistor 43. The fourth stage 40 further comprises a resistor 42 having a first end 42a connected with the inverting input 41a and a second end 42b connected to the ground.

Each fourth stage 40 is therefore in the form of a noninverting amplifier.

The embodiments briefly described above are represented in FIGS. 2-6, 11, 13, 13a, 14, 15, 18, 19, 20, 21, 22, 23 and 24.

In one particular case (FIG. 32) the two second ends of the first and second connecting branches are connected with the noninverting input of the same opamp (11, 21, 31) and the first end of the second connecting branch is connected with the inverting input of an opamp different than the predetermined operational amplifier 11, 21, 31; in other words the first and second connecting branches have their second ends in common (connected with the noninverting input of the same opamp), whereas the two first ends are connected with operational amplifiers distinct from each other.

Each of the two connecting branches is defined by a respective fourth or fifth stage 40, 40a that is preferably defined by a general voltage amplifier, having an input ("in") defining the first end of the respective connecting branch, and an output ("out") connected with the first end of a resistor; the second end of said resistor defines the second end of such a branch.

In a first set of alternative embodiments, filter 1 is not provided with the second connecting branch while it preferably comprises the first connecting branch that is defined by a direct connection. The fourth stage 40 is in particular in the form of an inverting amplifier the input of which is connected with the output 11c, 21c, 31c of one of said operational amplifiers 11, 21 and 31. More particularly, the inverting input 41a of the fourth operational amplifier 41 is directly connected with the noninverting input 11b, 21b, 31b of a predetermined one of the first, second and third operational amplifiers 11, 21 and 31, whereas the noninverting input 41b of the fourth operational amplifier 41 is directly connected with the inverting input of one of said opamp 11, 21 and 31, different from the opamp with which the inverting input 41a is connected (identified above as the predetermined operational amplifier).

Alternatively, the noninverting input 41b is directly connected with a fixed-potential node, preferably a grounded node (FIGS. 7-11, 12, 16, 17, 21 and 23).

In a second set of alternative embodiments, filter 1 is provided with at least the first connecting branch. At least one predetermined opamp of the mentioned operational amplifiers 11, 21 and 31 in its negative-feedback branch 15, 25, 35 comprises a respective fourth stage 40 provided with a fourth operational amplifier 41 having an inverting input 41a, a noninverting input 41b and an output 41c. The fourth operational amplifier 41 is in the form of a buffer or a phase shifter, and its noninverting input 41b is connected with the output 11c, 21c, 31c of said predetermined operational amplifier 11, 21, 31, either directly or through a resistor; the inverting input of the predetermined opamp is connected with the output 41c of the fourth opamp 41, through respective feedback means 13, 23, 33 (FIGS. 25-29).

According to the embodiment taken into consideration, filter 1 can further comprise one or two of the following resistors:

a main resistor 60 having a first end 60a connected with the inverting input 11a of the first operational amplifier 11, and a second end 60b connected with a fixed-potential node, preferably a grounded node;

a secondary resistor 62 having a first end 62a connected with the inverting input 21a of the second operational amplifier 21, and a second end 62b connected with a fixed-potential node, preferably a grounded node;

an auxiliary resistor 61 having a first end 61a connected with the inverting input 31a of the third operational amplifier 31, and a second end 61b connected with a fixed-potential node, in particular a grounded node.

It is to be pointed out that in the diagrams of the accompanying figures different switches are present; these switches are not to be intended as physically present within the circuit, but their task is only to indicate possible different configurations that can be taken by the same circuit, depending on the operating condition thereof. By way of non-limiting example, in the following specification, in addition to the switches introducing essential components, and depending on the circumstances, also the switches relating to a component or a circuit solution that does not change the filter nature to an important degree have been arbitrarily considered as closed, irrespective of the typical configuration that the filter can take in the specific case under examination; all cases are duly contemplated in the appended claims. In more detail, in the circuits in FIGS. 2-6, the feedback means 12 of the first opamp 11 is defined by a single capacitor or a branch defined by a capacitor and a resistor connected in series with each other, whereas the second opamp 21 is feedbacked by means of a resistor 23. The third opamp 31 is feedbacked by means of a single capacitor, or by means of a branch defined by a capacitor connected in series with a resistor; it can be also provided for this branch to be connected in parallel with another branch comprising a single capacitor or a capacitor connected in series with a resistor.

Preferably, a feedback resistor 74 has a first end 74a connected with the inverting input 11a of the first opamp 11 and a second end 74b that can be connected either to the output 11c of the first opamp 11 or to the output 21c of the second opamp 21.

In the diagrams in FIGS. 2, 3, 5 and 6 a main resistor 60 is connected between the inverting input 11a of the first opamp 11 and the fixed-potential node, preferably a grounded node. In the diagrams in FIGS. 4 and 5, an auxiliary resistor 61 is connected between the inverting input 31a of the third opamp and a fixed-potential node, preferably a grounded node.

Figure 2:
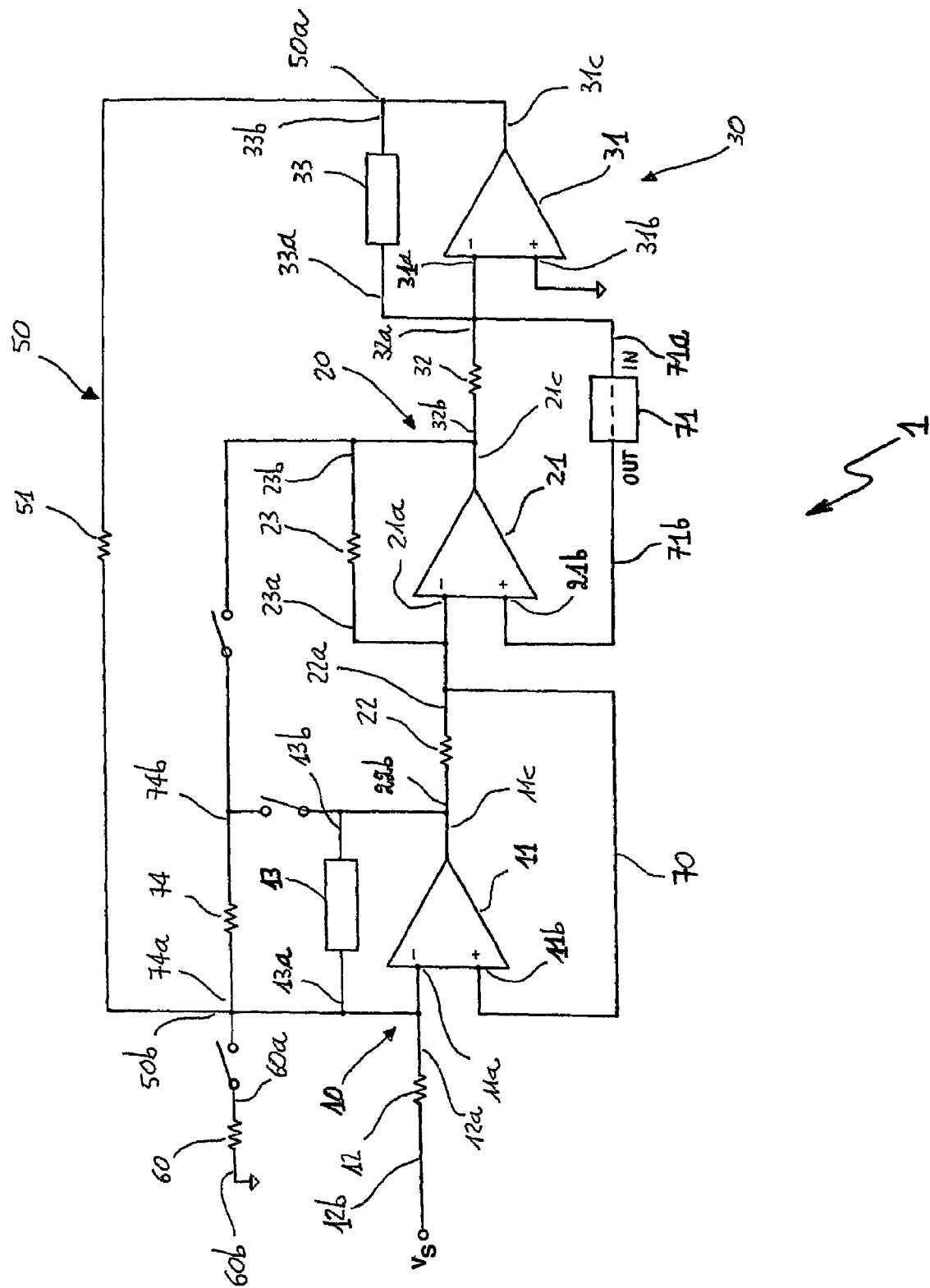

The circuit in FIG. 2 further has a direct connection 70 between the noninverting input 11b of the first opamp 11 and the inverting input 21a of the second opamp 21; the inverting input 31 of the third opamp 31 and the noninverting input 21b of the second opamp 21 are connected with each other by a feedback branch 71 that can be made either as a direct connection or as an amplifier. The noninverting input 31b of the third opamp 31 is connected to the ground. In relation to the input signal Vs, the output 11c of the first opamp 11 is an output of the band-pass type, which is −180° out of phase, the output 21c of the second opamp 21 is an output of the band-pass type not out of phase and the output 31c of the third opamp 31 is a 90° out of phase low-pass output.

Figure 3:
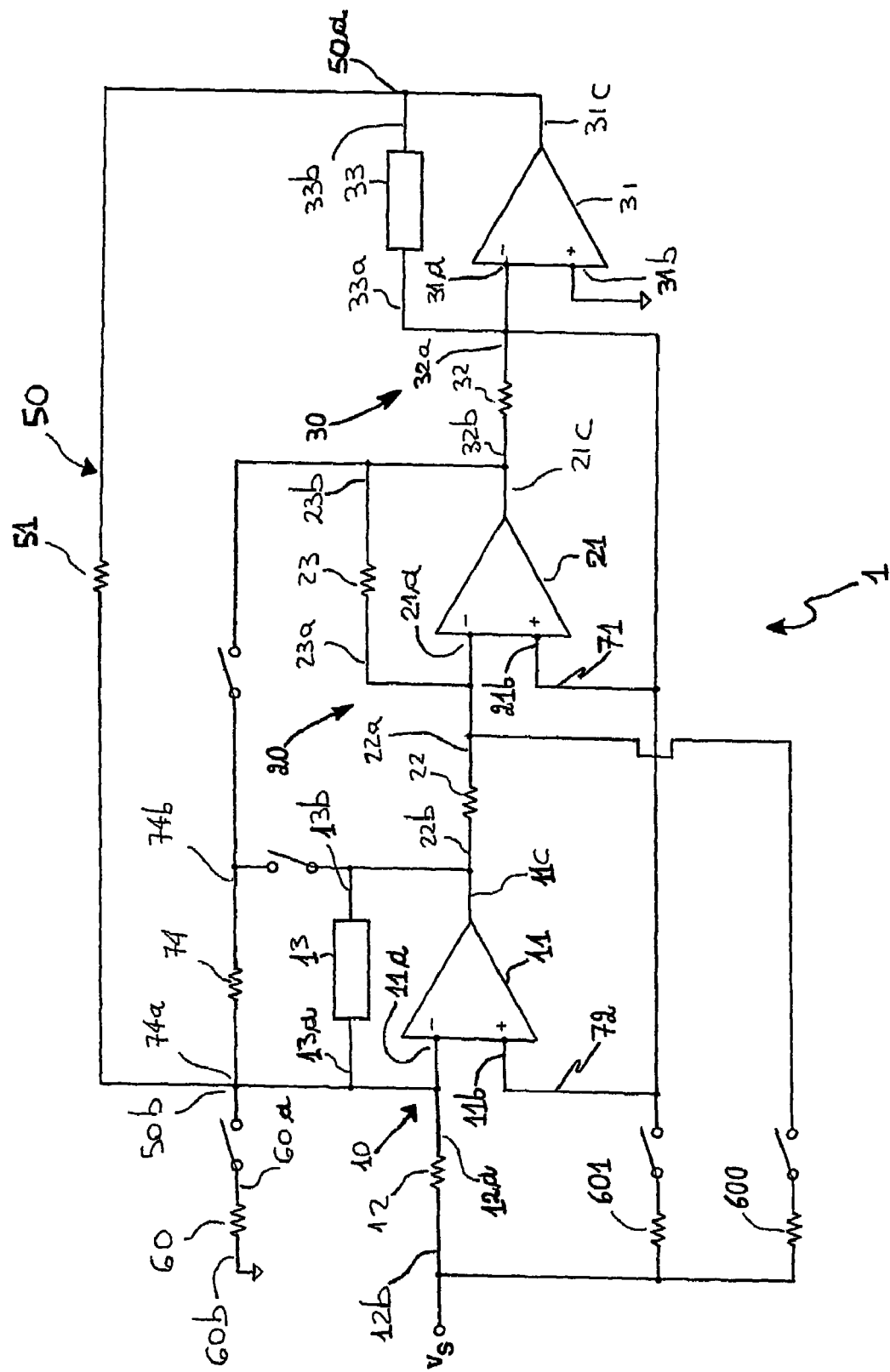

The circuit in FIG. 3 shows a direct connection 72 between the noninverting input 11b of the first opamp 11 and the inverting input 31a of the third opamp 31; also provided is a direct connection 71 between the noninverting input 21b of the second opamp 21 and the inverting input 31a of the third opamp 31. The noninverting input 31b of the third opamp 31 is connected to the ground.

Figure 4:
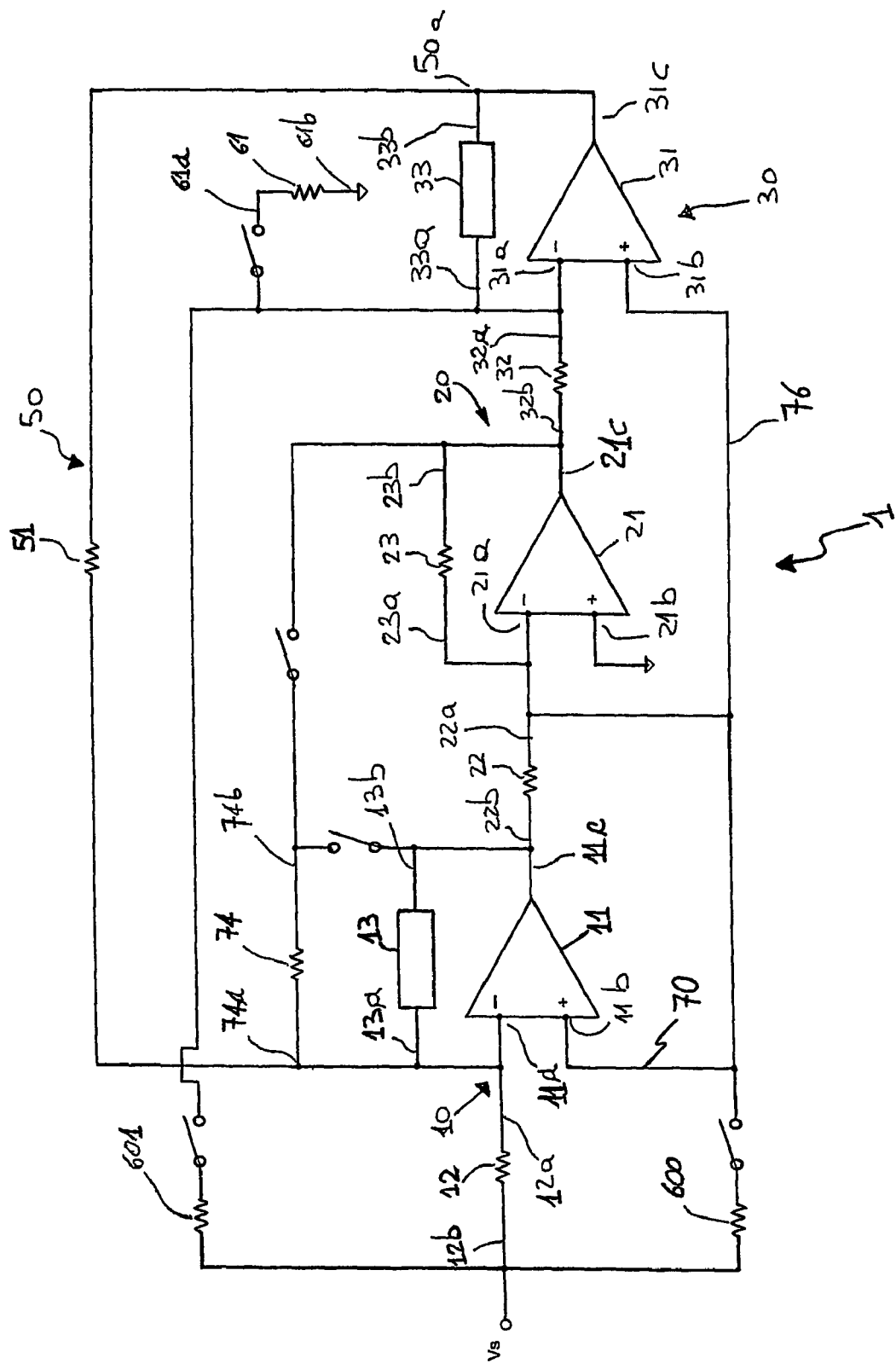

The circuit in FIG. 4 shows a direct connection 70 between the noninverting input 11b of the first opamp 11 and the inverting input 21a of the second opamp 21, together with a direct connection 76 between the inverting input 21a of the second opamp 21 and the noninverting input 31b of the third opamp 31. The noninverting input 21b of the second opamp 21 is connected to the ground.

Figure 5:
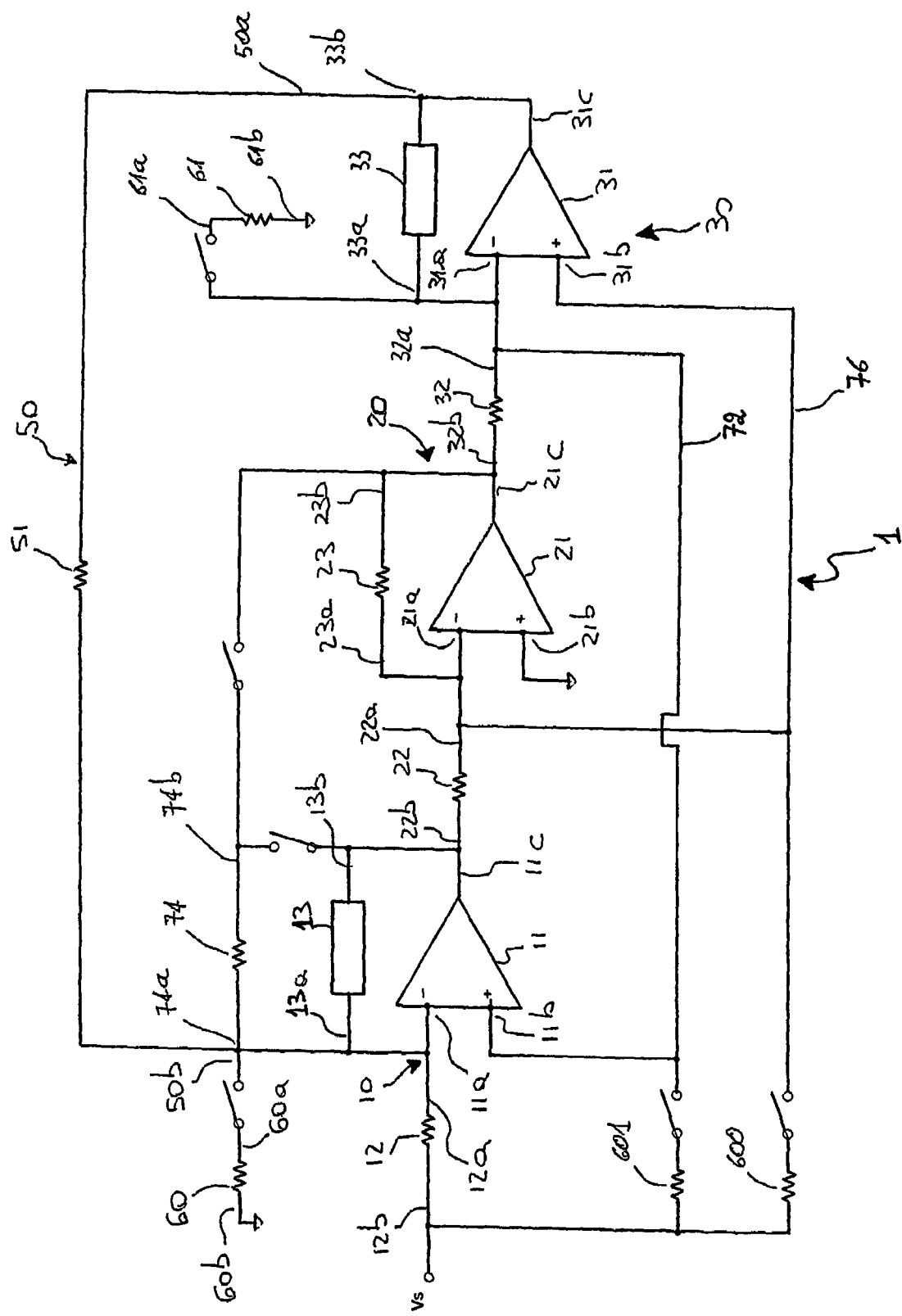

The circuit in FIG. 5 has a direct connection 72 between the noninverting input 11b of the fist opamp 11 and the inverting input 31a of the third opamp 31 together with a direct connection 76 between the noninverting input 31b of the third opamp 31 and the inverting input 21a of the second opamp 21. The noninverting input 21b of the second opamp 21 is connected to the ground.

Figure 6:
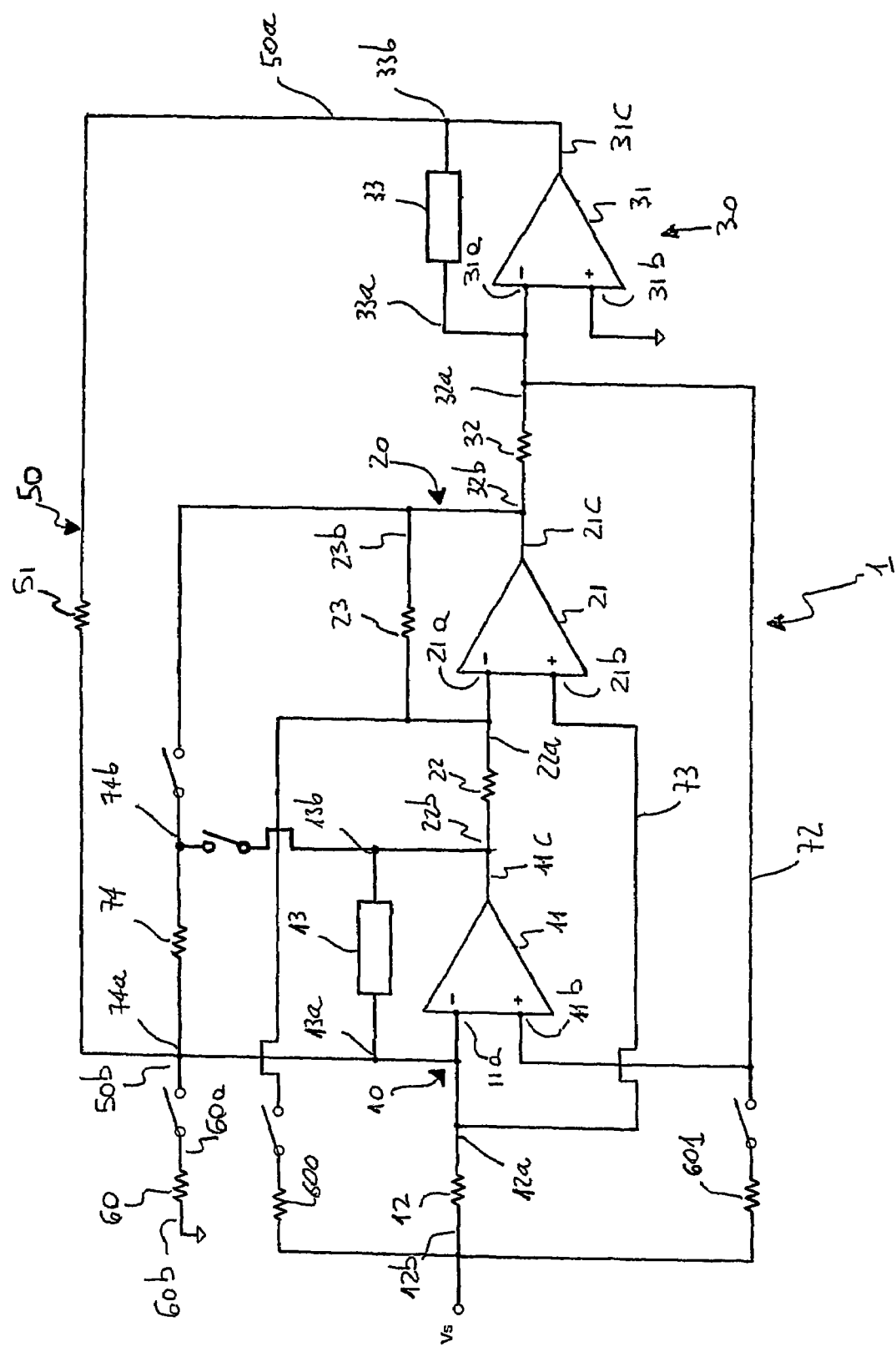

The circuit in FIG. 6 shows a direct connection 73 between the inverting input 11a of the first opamp 11 and the noninverting input 21b of the second opamp 21, together with a, direct connection 72 between the noninverting input 11b of the first opamp 11 and the inverting input 31a of the third opamp 31. The noninverting input 31b of the third opamp 31 is connected to the ground.

With reference to FIGS. 3-6, if resistors 600 and 601 are not used, in relation to the input signal Vs the output 11c of the first opamp 11 is an output of the band-pass type which is −180° out of phase, the output 21c of the second opamp 21 is an output of the band-pass type not out of phase, and the output 31c of the third opamp 31 is a 90° out of phase low-pass output; if resistors 600 and 601 are used, the output 11c of the first opamp 11 is a −180° out of phase band-pass output, the output 21c of the second opamp 21 is a notch output, in which the frequencies other than the one to be eliminated are 180° out of phase, and the output 31c of the third opamp 31 is a 90° out of phase low-pass output.

Figure 12:
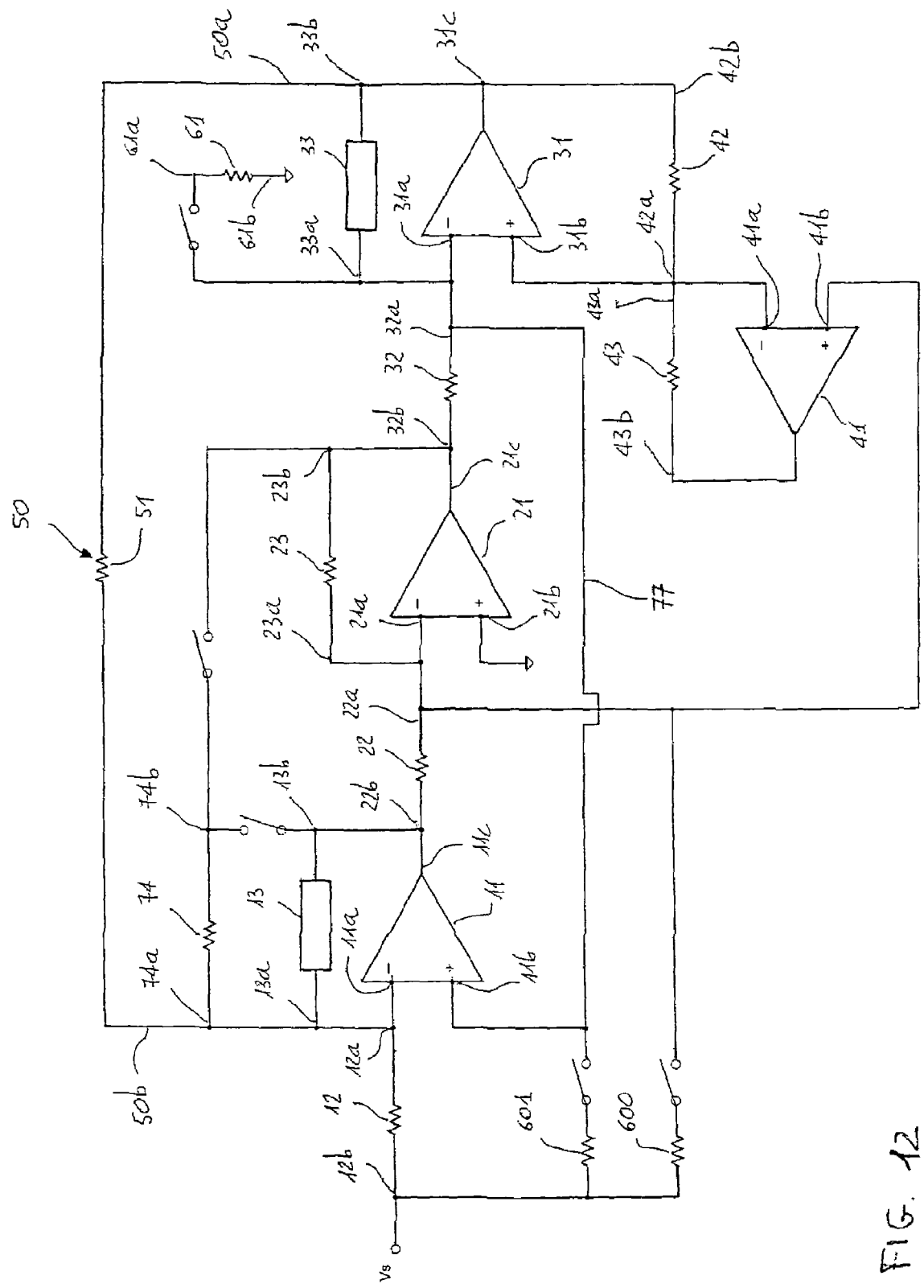

FIG. 12 shows a further embodiment of filter 1. In this circuits, the first opamp 11 is feedbacked by a single capacitor or by a branch defined by a capacitor and a resistor connected in series with each other, whereas the second opamp 21 is feedbacked by means of a resistor 23.

The third opamp 31 is feedbacked by means of a single capacitor, or by means of a branch defined by a capacitor connected in series with a resistor; it is also provided that this branch can be connected in parallel with another branch defined by a single capacitor or a capacitor connected in series with a resistor.

In addition, a feedback resistor 74 has a first end 74a connected with the inverting input 11a of the first opamp 11 and a second end 74b that can be connected to the output 11c of the first opamp 11 or to the output 21c of the second opamp 21.

The filter 1 shown in FIG. 12 further comprises a fourth stage 40 provided with a fourth operational amplifier 41 having an inverting input 41a, a noninverting input 41b and an output 41c; a first resistor 42 is connected between the inverting input 41a of the fourth opamp 41 and the output 31c of the third opamp 31, whereas a second resistor 43 is connected between the inverting input 41a and the output 41c of the fourth opamp 41.

In the diagram provision is also made for an auxiliary resistor 61 to be connected between the inverting input 31a of the third opamp 31 and a fixed-potential node, preferably a grounded node.

The noninverting input 41b of the fourth opamp 41 is directly connected to the inverting input 21a of the second opamp 21 and a direct connection 77 is interposed between the noninverting input 11b of the first opamp 11 and the inverting input 31a of the third opamp 31.

With reference to FIG. 12, if resistors 600 and 601 are not used, in relation to the input Vs the output 11c of the first opamp 11 is a −180° out of phase band-pass output, the output 21c of the second opamp 21 is band-bass output that is not out of phase, the output 31c of the third opamp 31 is a 90° out of phase low-pass output, and the output 41c of the fourth opamp 41 is a −90° out of phase low-pass output.

If resistors 600 and 601 are used, the output 11c of the first opamp 11 is a −180° out of phase band-pass output, the output 21c of the second opamp 21 is a notch output, in which the frequencies different from the one eliminated are 180° out of phase, the output 31c of the third opamp 31 is a 90° out of phase low-pass output, and the output 41c of the fourth opamp 41 is a −90° out of phase low-pass output.

FIGS. 7-10 show further embodiments of filter 1. The feedback means 13 of the first stage 10 can consist of a single capacitor or a capacitor connected in series to a resistor, whereas the feedback means 23 of the second stage 20 are defined by a resistor.

The feedback means 33 of the third stage 30 can consist of a single capacitor or a capacitor connected in series with a resistor.

The filter 1 shown in FIGS. 7-10 also comprises a fourth stage 40 provided with a fourth operational amplifier 41, a first resistor 42 and a second resistor 43.

The first resistor 42 has a first end 42a connected with the inverting input 41a of the fourth opamp 41, and a second end 42b connected to the output 21c of the second opamp 21; the second resistor 43 is connected between the inverting input 41a and the output 41c of the fourth opamp 41. In addition, also provided is a feedback resistor 74 having a first end 74a connected with the inverting input 11a of the first opamp 11 and a second end 74b connected either to the output 11c of the first opamp 11 or to the output 21c of the second opamp 21.

Figure 7:
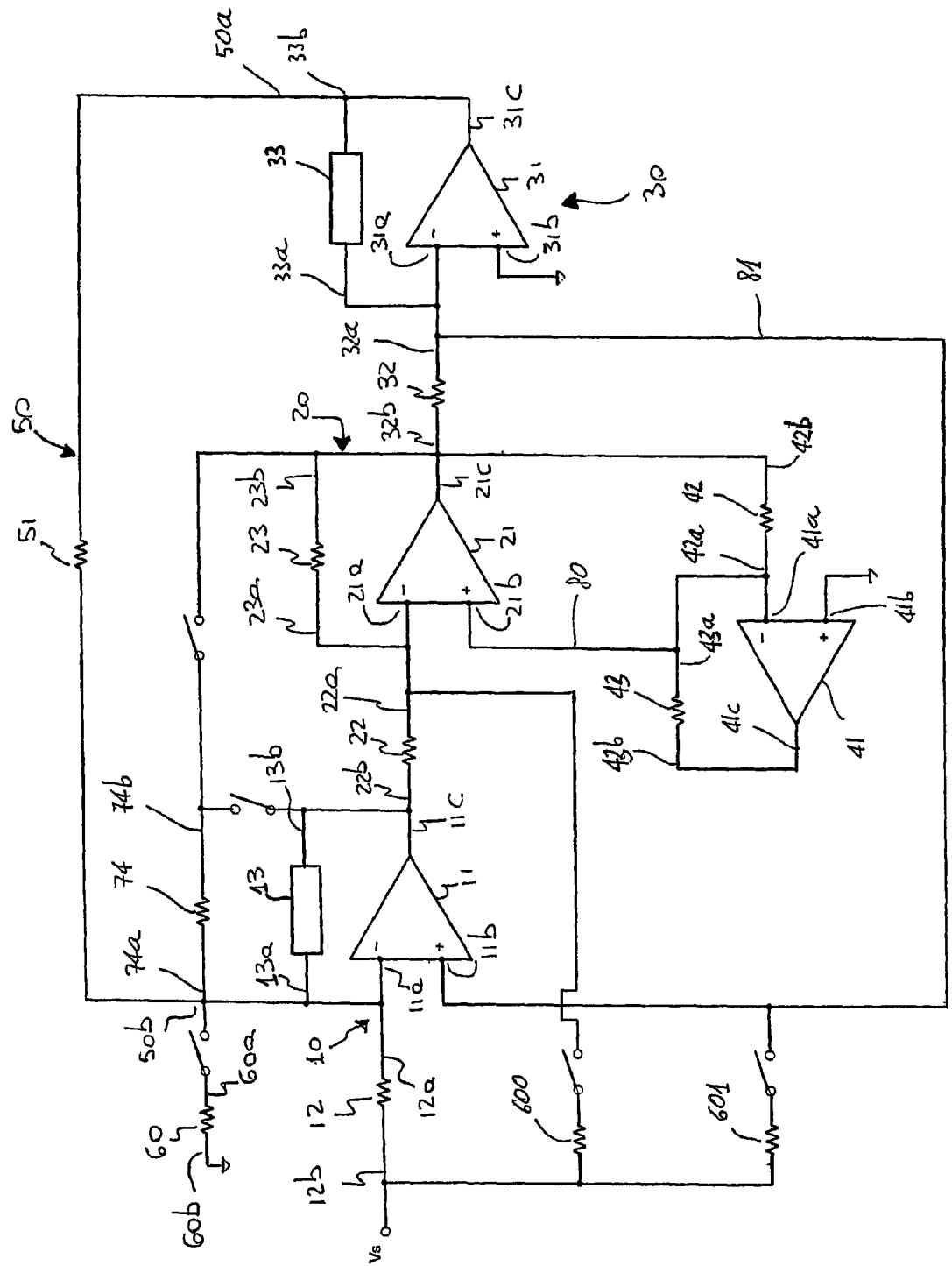
Figure 8:
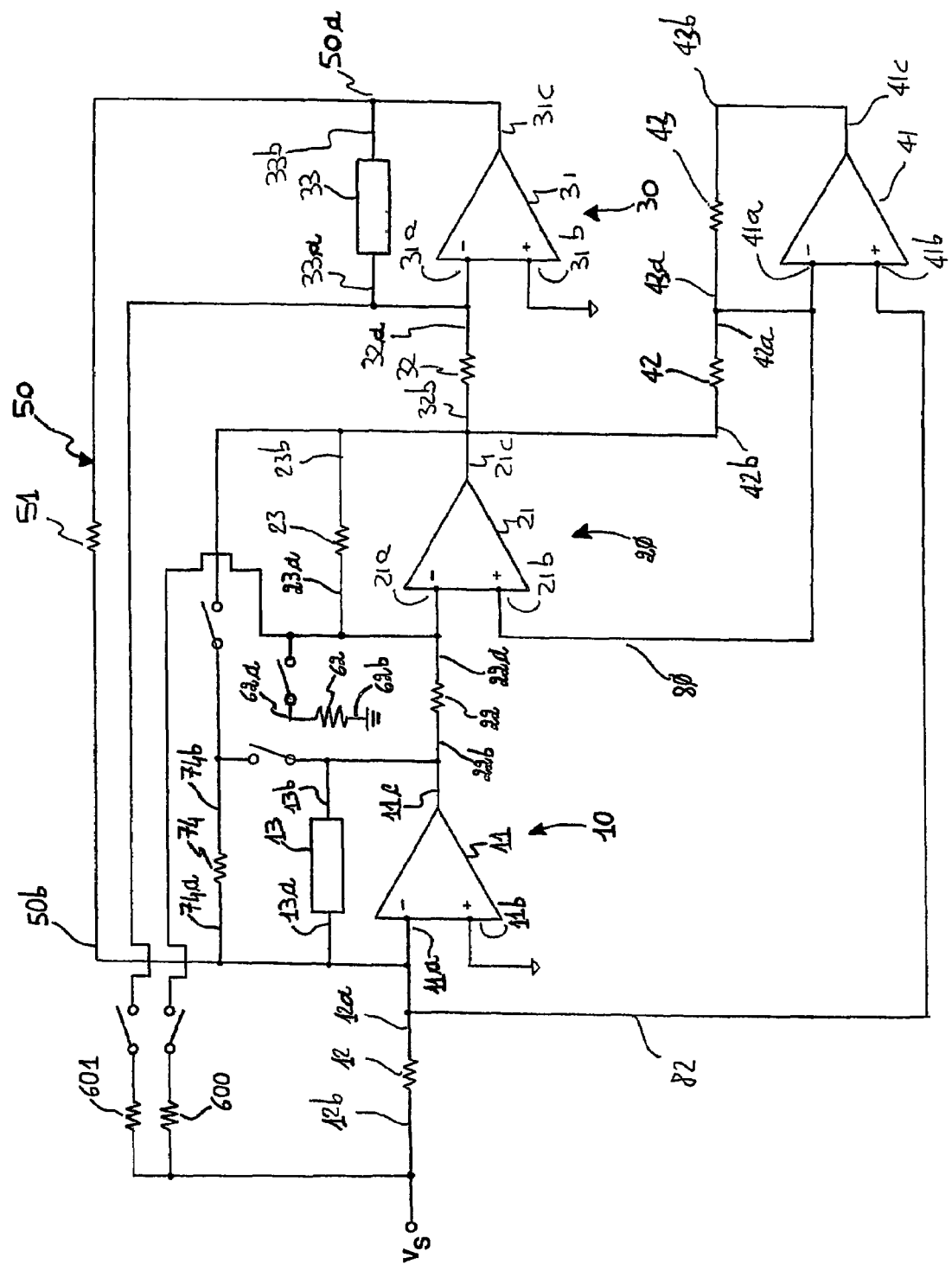
Figure 9:
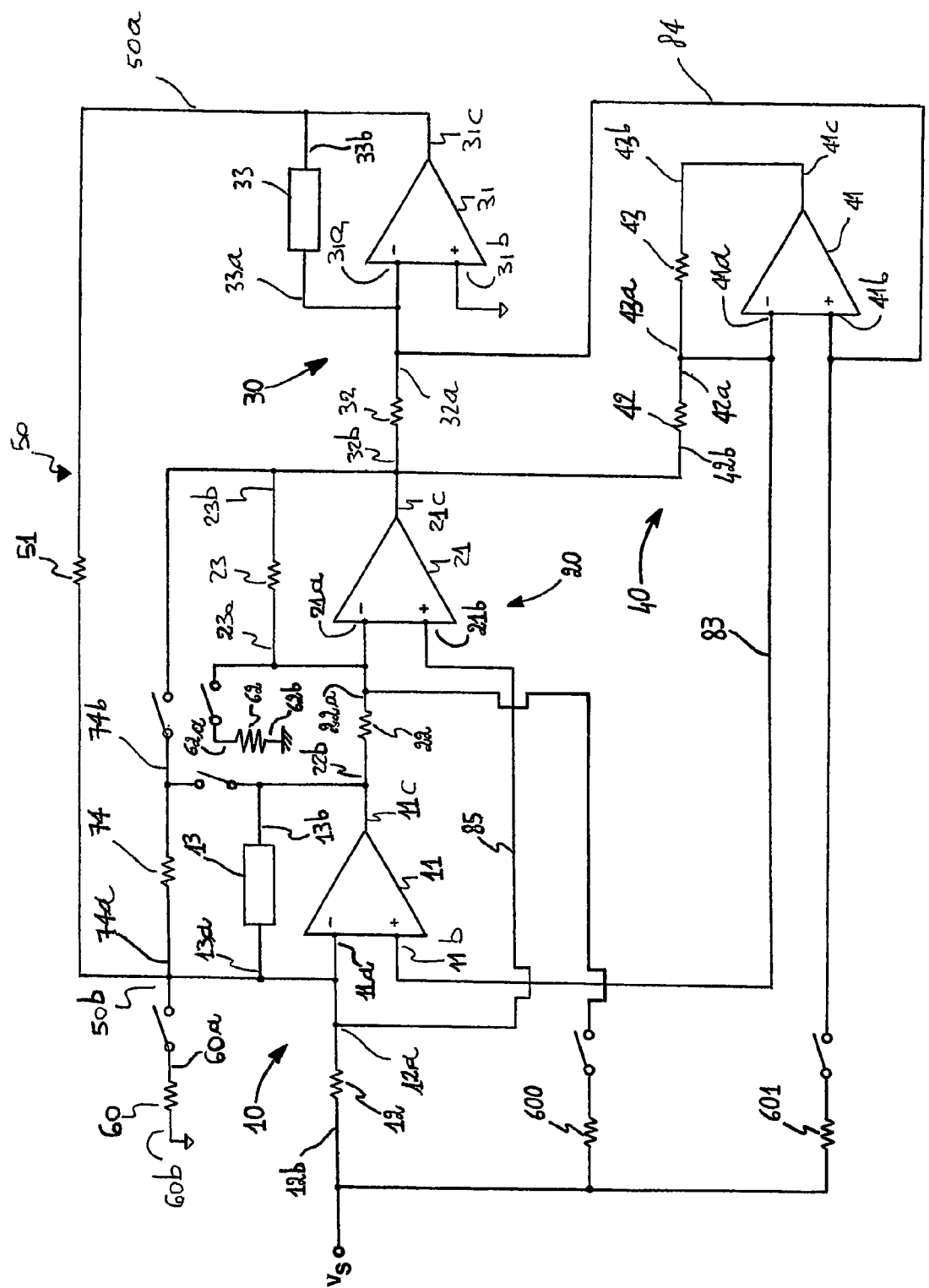
Figure 10:
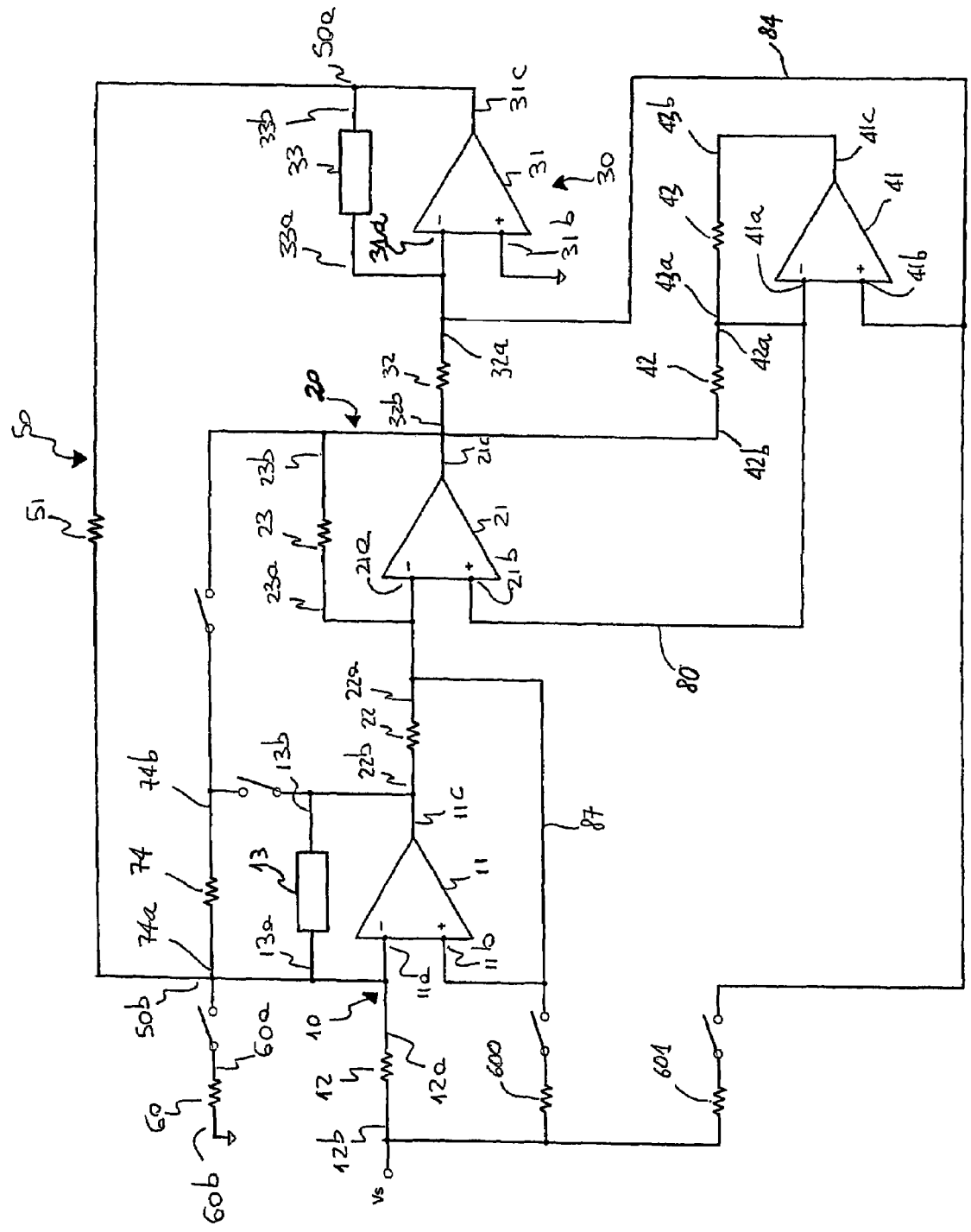

In the circuits in FIGS. 7, 9 and 10 a main resistor 60 is connected between the inverting input 11a of the first opamp 11 and a fixed-potential node, preferably grounded; in the circuits in FIGS. 8 and 9 a secondary resistor 62 is connected between the inverting input 21a of the second opamp 21 and a fixed-potential node, preferably grounded.

In the diagram in FIG. 7, a direct connection 81 is present between the inverting input 31a of the third opamp 31 and the noninverting input 11b of the first opamp 11; the noninverting input 31b of the third opamp 31 is grounded. In addition, a direct connection 80 is present between the inverting input 41a of the fourth opamp 41 and the noninverting input 21b of the second opamp 21; the noninverting input 41b of the fourth opamp 41 is grounded.

In the diagram in FIG. 8 the noninverting input 11b of the first opamp 11 is grounded; the inverting input 11a of the first opamp 11 is connected through the direct connection 82 to the noninverting input 41b of the fourth opamp 41. In addition, the noninverting input 21b of the second opamp 21 is connected, through the direct connection 80, to the inverting input 41a of the fourth opamp 41; the noninverting input 31b of the third opamp 31 is grounded.

In the diagram in FIG. 9 a direct connection 85 is interposed between the inverting input 11a of the first opamp 11 and the noninverting input 21b of the second opamp 21, while a direct connection 83 is interposed between the noninverting input 11b of the first operational amplifier 11 and the inverting input 41a of the fourth opamp 41. A further direct connection 84 connects the inverting input 31a of the third opamp 31 and the noninverting input 41b of the fourth opamp 41 with each other; the noninverting input 31b of the third opamp 31 is grounded.

In the diagram in FIG. 10, a direct connection 87 connects the noninverting input 11b of the first opamp 11 with the inverting input 21a of the second opamp 21 and a direct connection 80 connects the noninverting input 21b of the second opamp 21 with the inverting input 41a of the fourth opamp 41. A direct connection 84 connects the inverting input 31a of the third opamp 31 with the noninverting input 41b of the fourth opamp 41; the noninverting input 31b of the third opamp 31 is connected to the ground.

With reference to the diagrams in FIGS. 7-10, when resistors 600 and 601 are not used, in relation to the input Vs, the output 11c of the first opamp 11 is a −180° out of phase band-pass output, the output 21c of the second opamp 21 is a band-pass output that is not out of phase, the output 31c of the third opamp 31 is a 90° out of phase low-pass output and the output 41c of the fourth opamp 41 is a 180° out of phase band-pass output.

If resistors 600 and 601 are used, the output 11c of the first opamp 11 is a −180° out of phase band-pass output, the output 21c of the second opamp 21 is a notch output, in which the frequencies that are not eliminated are 180° out of phase, the output 31c of the third opamp 31 is a 90° out of phase low-pass output, and the output 41c of the fourth opamp 41 is a notch output in which the frequencies that are not eliminated are not submitted to any phase shift.

FIGS. 11, 13, 13a and 14 show further embodiments of filter 1.

In these diagrams, the feedback means 13 of the first stage 10 can either consist of a single capacitor or comprise a branch defined by a capacitor connected in series to a resistor; likewise, the feedback means 33 of the third stage 30 can comprise a single capacitor or a capacitor series-connected with a resistor.

Alternatively, the feedback means 33 of the third stage 30 can have two branches connected in parallel with each other; the first one consists of a single capacitor or a capacitor series-connected to a resistor, the second one is defined by a single resistor or a resistor series-connected to a capacitor.

The feedback means 23 of the second stage 20, instead, consists of the resistor 23 alone which is connected between the inverting input 21a and the output 21c of the second opamp 21.

Also provided is a fourth stage 40 comprising a fourth opamp 41, a first resistor 42 and a second resistor 43, the latter being connected between the inverting input 41a and the output 41c of the fourth opamp 41; the first resistor 42 has a first end 42a connected with the inverting input 41a of the opamp 41 and a second end 42b. In circuits 11, 14a and 15 a main resistor 60 is preferably connected between the inverting input 11a of the first opamp 11 and a fixed-potential node, preferably grounded; in FIGS. 11, 13 and 13a an auxiliary resistor 61 is connected between the inverting input 31a of the third opamp 31 and a fixed potential node, preferably grounded.

Preferably, a feedback resistor 74 has a first end 74a connected with the inverting input 11a of the first opamp 11 and a second end 74b connected with the output 11c of the first opamp 11 or the output 21 of the second opamp 21.

Preferably, the non inverting input 41b is directly connected (i.e. connected through a short circuit) to the inverting input 21a of the second opamp 21.

Figure 11:
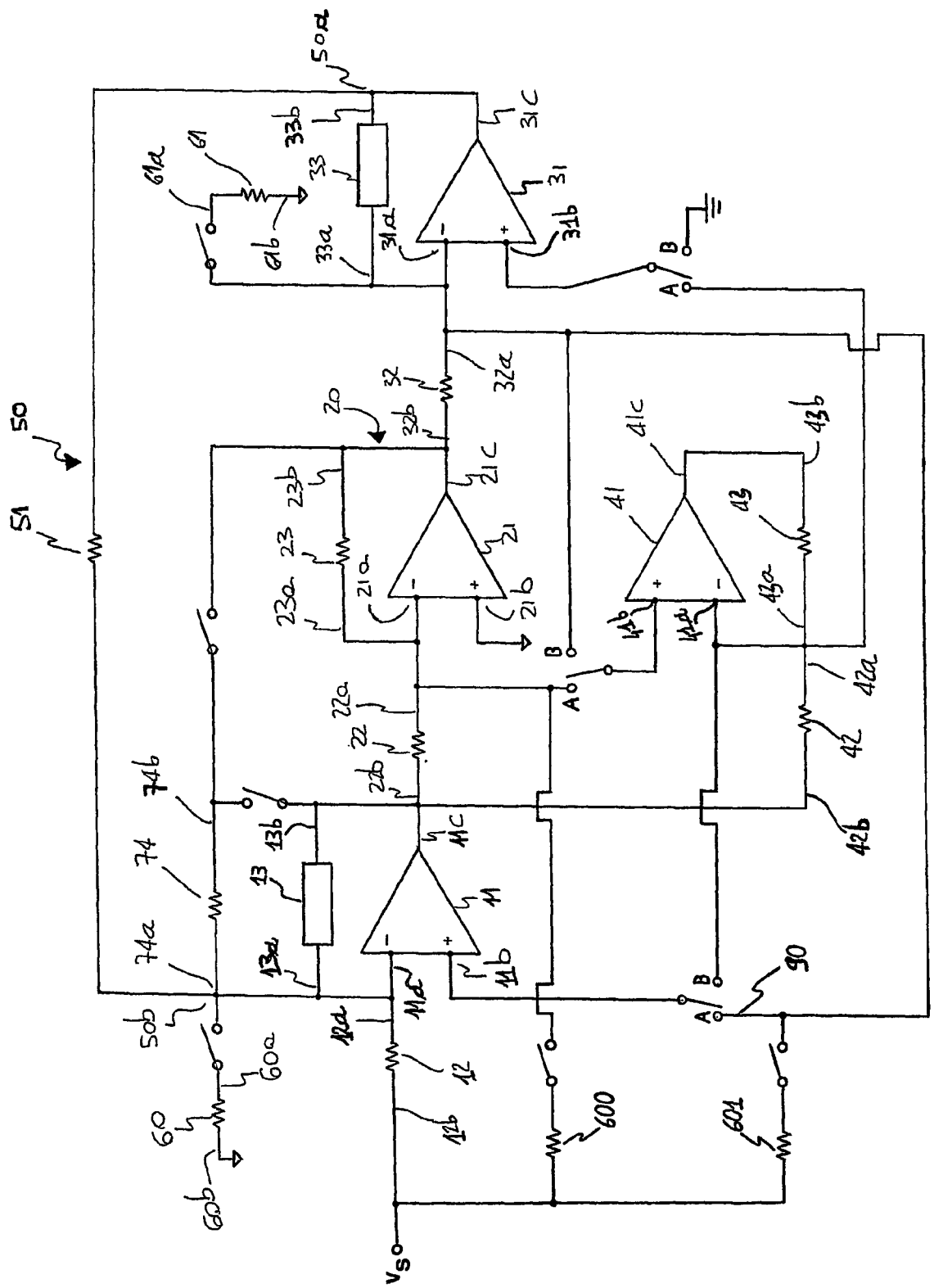

In more detail, in the circuit in FIG. 11 two configurations are provided that correspond to positions "A" and "B" of the switches present in this diagram.

In the configuration ("A"), the noninverting input 11b of the first opamp 11 is connected through the short circuit 90, to the inverting input 31a of the third opamp 31 and the inverting input 21a of the second opamp 21 is connected with the noninverting input 41b of the fourth opamp 41; the noninverting input 21b of the second opamp 21 is connected to the ground. Still in configuration "A" of the circuit in FIG. 11, the noninverting input 31b of the third opamp 31 is connected to the inverting input 41a of the fourth opamp 41 and the second end 42b of the first resistor 42 of the fourth stage 40 is connected to the output 11c of the first opamp 11.

In the second configuration in FIG. 11 ("B"), the noninverting input 11b of the first opamp 11 is directly connected to the inverting input 41a of the fourth opamp 41 and the inverting input 31a of the third opamp 31 is connected with the noninverting input 41b of the fourth opamp 41; the noninverting input 21b of the second opamp 21 and the noninverting input 31b of the third opamp 31 are connected to the ground and the second end 42b of the first resistor 42 is connected to the output 11c of the first opamp 11.

With reference to the input signal Vs, if resistors 600 and 601 are not used, the output 11c of the first opamp 11 is a −180° out of phase band-pass, the output 21c of the second opamp 21 is a band-pass output that is not out of phase, the output 31c of the third opamp 31 is a 90° out of phase low-pass output, and the output 41c of the fourth opamp 41 is a band-pass that is not out of phase.

If, on the contrary, resistors 600 and 601 are used, the output 11c of the first opamp 11 is a −180° out of phase band-pass output, the output 21c of the second opamp 21 is a notch output in which the non eliminated frequencies are 180° out of phase, and the output 41c of the fourth opamp 41 is a band-pass that is not out of phase.

Figure 13:
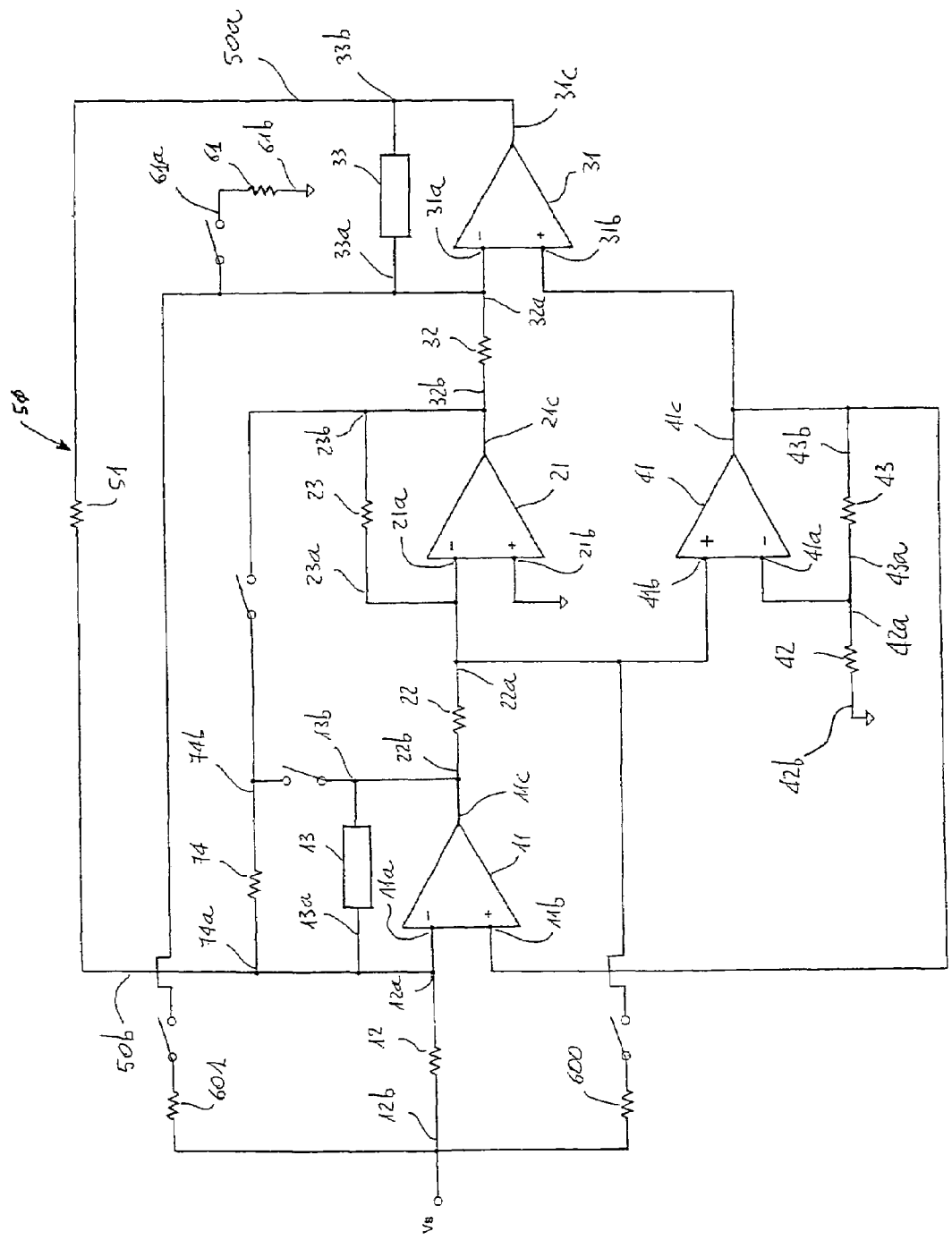

In the circuit in FIG. 13, the inverting input 21a of the second opamp 21 is connected with the noninverting input 41b of the fourth opamp 41 and the output 41c of the fourth opamp 41 is connected to the noninverting input 11b of the first opamp 11 and to the noninverting input 31b of the third opamp 31; the noninverting input 21b of the second opamp 21 is connected to the ground, In addition, the second end 42b of the first resistor 42 is grounded.

Figure 13A:
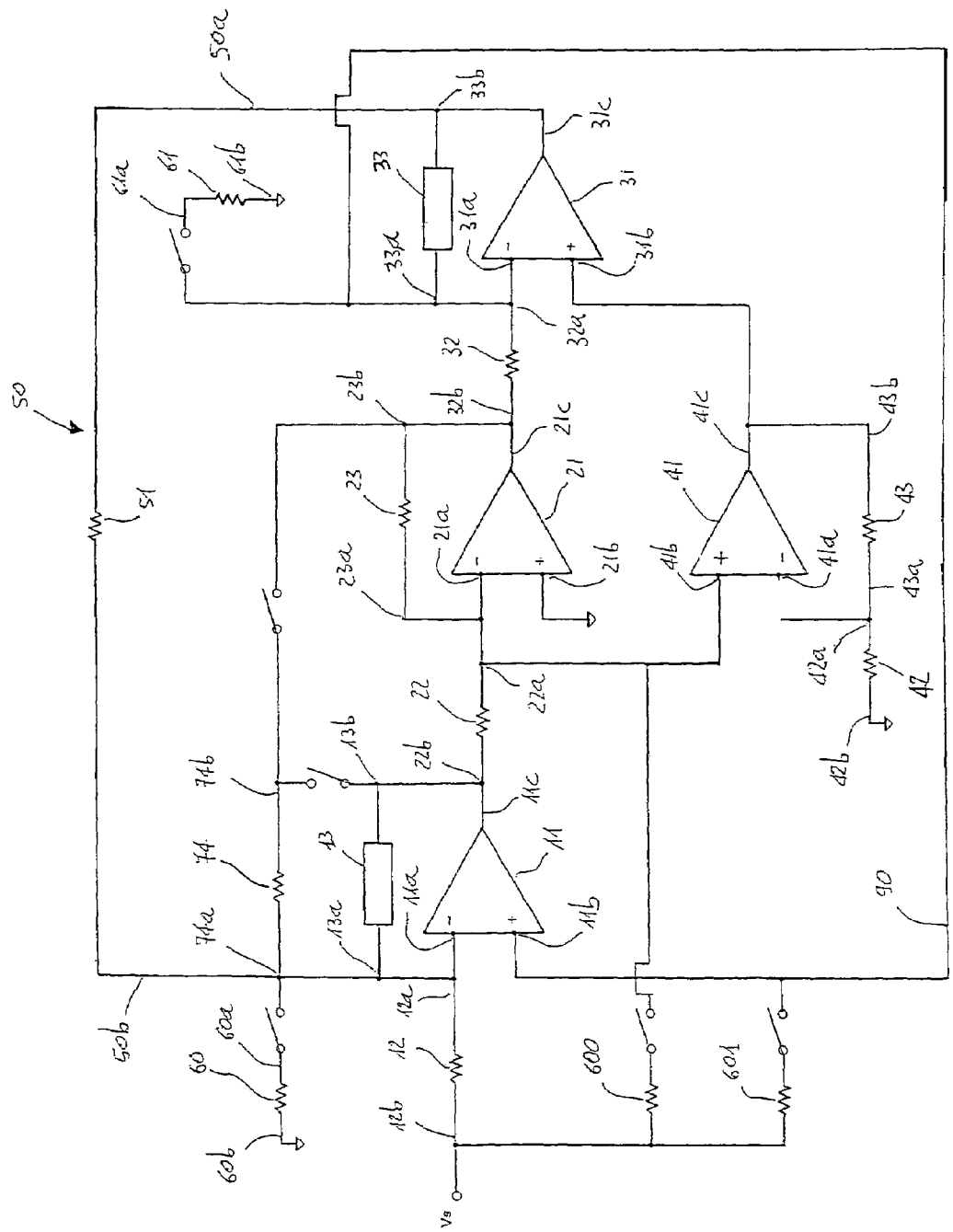

In the circuit in FIG. 13a a direct connection 90 is interposed between the noninverting input 11b of the first opamp 11 and the inverting input 31a of the third opamp 31; in addition the inverting input 21a of the second opamp 21 is connected to the noninverting input 41b of the fourth opamp 41; the output 41c of the latter is connected to the noninverting input 31b of the third opamp 31, whereas the noninverting input 21b of the second opamp 21 and the second end 42b of the first resistor 42 are grounded.

With reference to the diagrams in FIGS. 13 and 13a, in relation to the input signal Vs, if use of resistors 600 and 601 is not provided, the output 11c of the first opamp 11 is a −180° out of phase band-pass output, the output 21c of the second opamp 21 is a band-pass output that is not out of phase, and the output 31c of the third opamp 31 is a 90° out of phase low-pass output.

If on the contrary resistors 600 and 601 are used, the output 11c of the first opamp 11 is a −180° out of phase band-pass output, the output 21c of the second opamp 21 is a notch output, in which the non eliminated frequencies are 180° out of phase, and the output 31c of the third opamp 31 is a 90° out of phase low-pass output.

Figure 14:
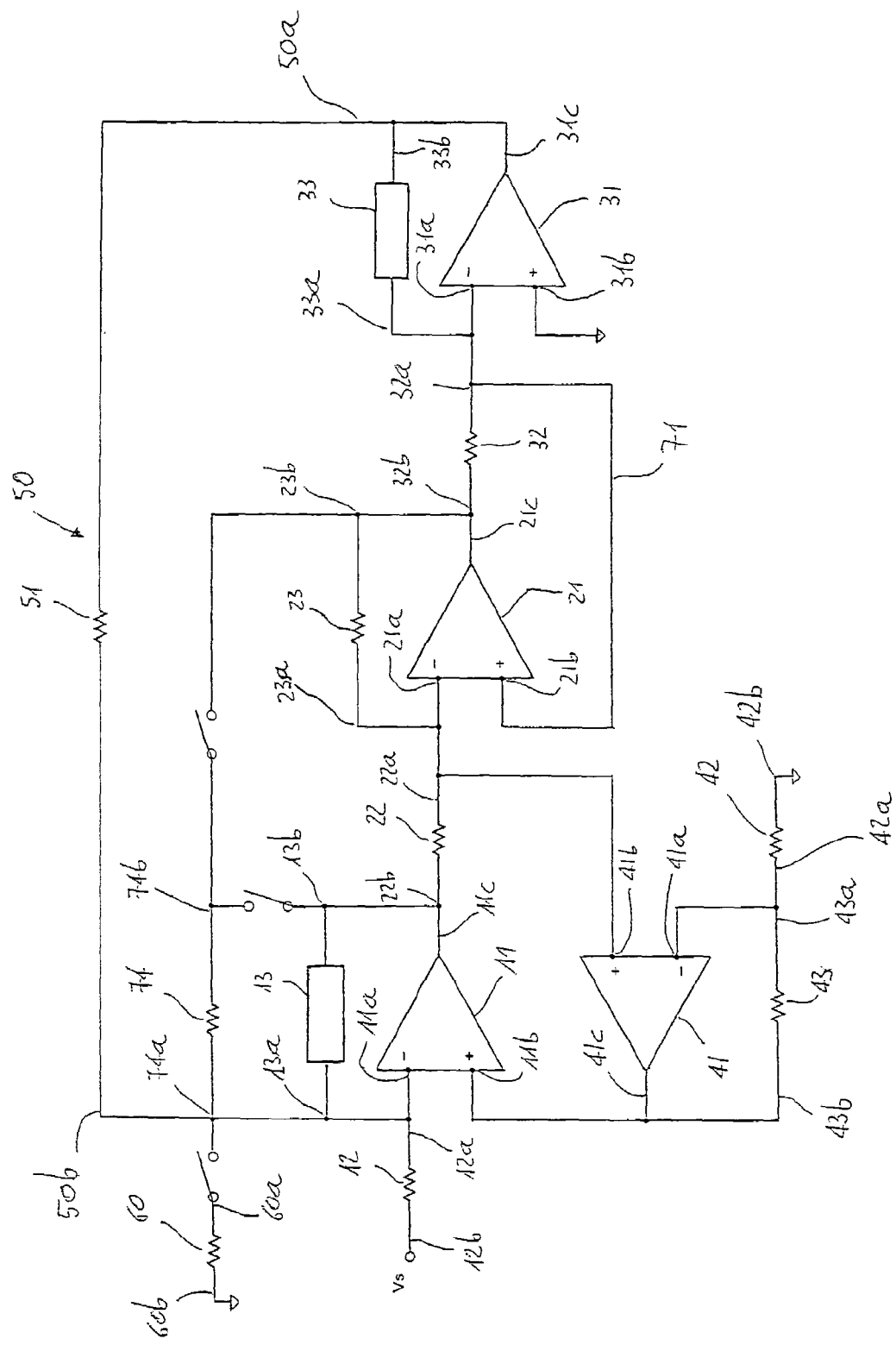

In the circuit in FIG. 14, the inverting input 21a of the second opamp 21 is directly connected with the noninverting input 41b of the fourth opamp 41, and a direct connection 71 is interposed between the noninverting input 21b of the second opamp 21 and the inverting input 31a of the third opamp 31.

The noninverting input 31b of the third opamp 31 and the second end 42b of the first resistor 42 are grounded, whereas the output 41c of the fourth opamp 41 is connected to the noninverting input 11b of the first opamp 11.

Figure 19:
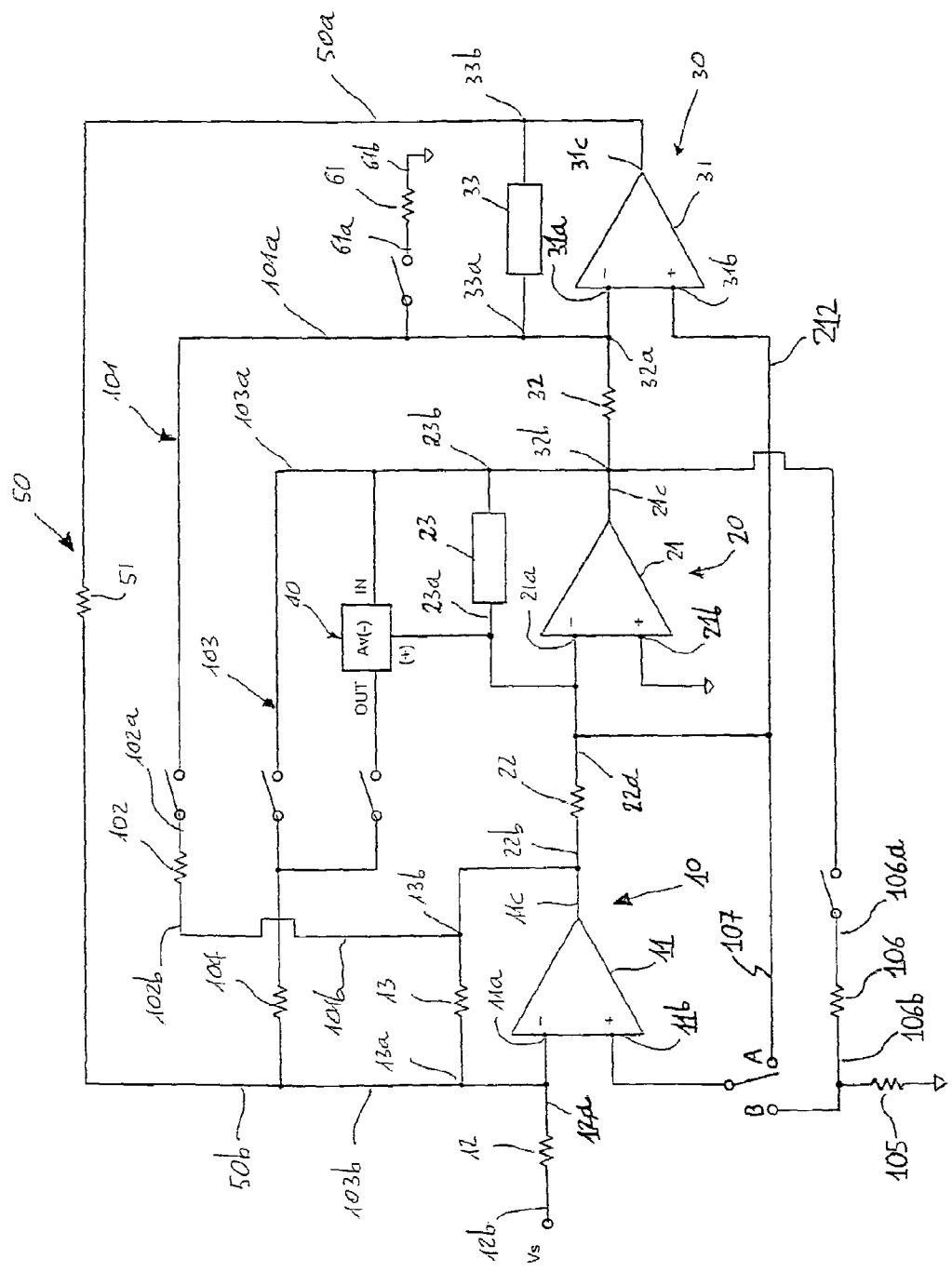
Figure 20:
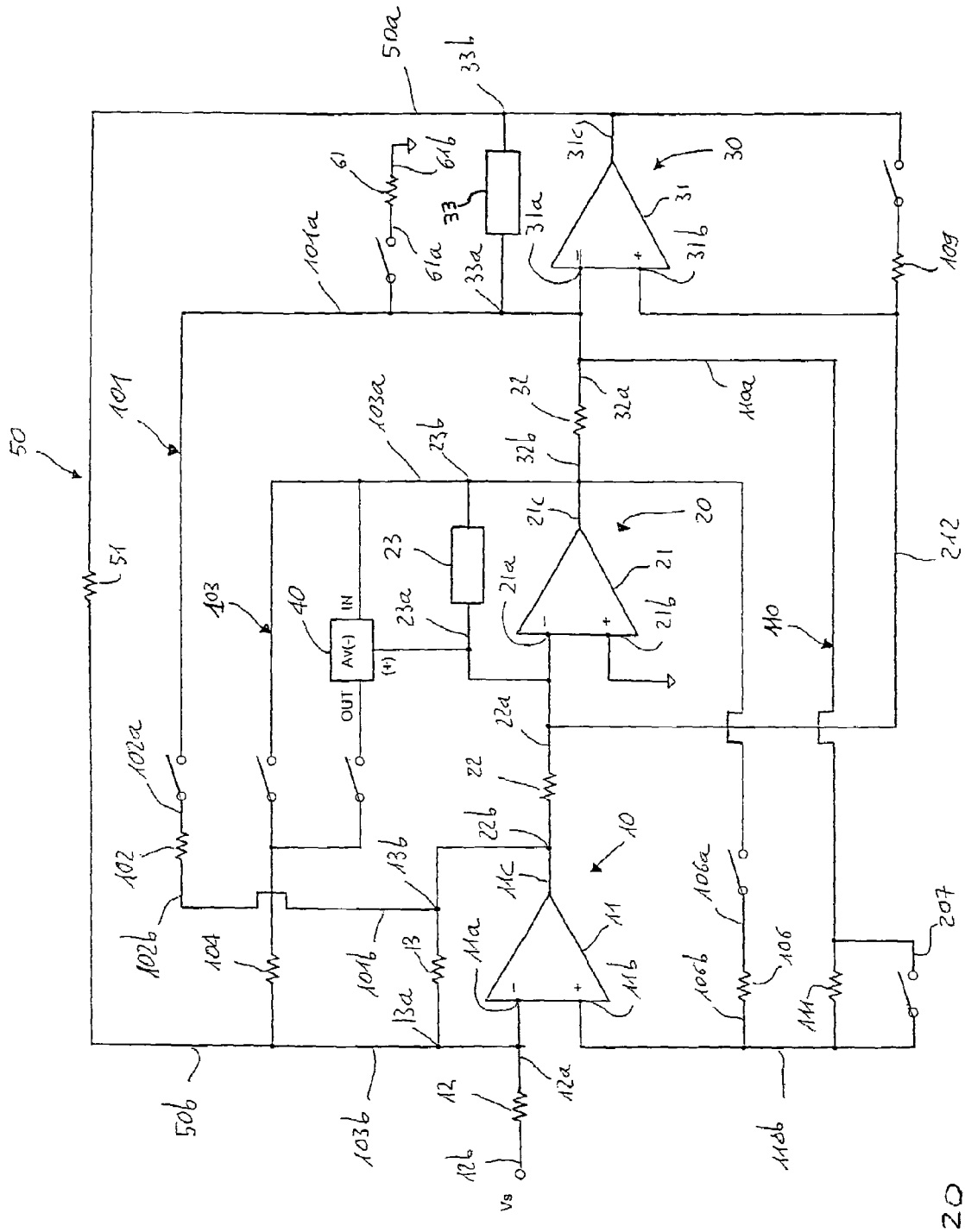

With reference to the diagram in FIG. 14, in relation to the input signal Vs, the output 11c of the first opamp 11 is a −180° out of phase band-pass output, the output 21c of the second opamp 21 is a band-pass output that is not out of phase, and the output 31c of the third opamp 31 is a 90° out of phase low-pass output. FIGS. 19 and 20 show further alternative embodiments of filter 1 in accordance with the present invention.

The first opamp 11 is feedbacked by means of the second resistor 13 of the first stage 10. The feedback means 23 of the second stage 20 preferably consists of a first branch comprising a single capacitor or a capacitor series-connected to a resistor; this branch can be connected in parallel to a second branch defined by a resistor and a capacitor in series with each other. The feedback means 33 of the third stage 30 consists of a single capacitor or a capacitor in series with a resistor.

Alternatively, the feedback means 23 of the second stage 20 is defined by a single capacitor or a capacitor in series with a resistor, while the feedback means 33 of the third stage 30 consists of two branches connected in parallel; the first branch comprises a single capacitor or a capacitor in series with a resistor and the second branch comprises a series capacitor and resistor.

Preferably, a feedback branch 103 has a first end 103a connected to the output 21c of the second opamp 21, and a second end 103b connected with the inverting input 11a of the first opamp 11; preferably, the feedback branch 103 comprises a resistor 104.

Preferably, a feedback branch 101 is provided to be inserted between the inverting input 31a of the third opamp 31 and the output 11c of the first opamp 11; conveniently this feedback branch 101 is defined by a resistor 102.

Figure 33:
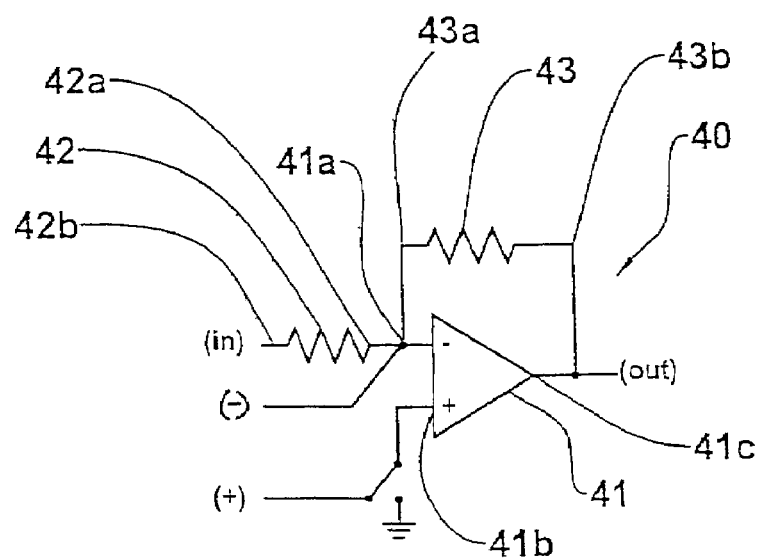

In the diagrams in FIGS. 19 and 20, a fourth stage 40 is preferably present the structure of which is shown in detail in FIG. 33; the fourth stage 40 comprises a fourth operational amplifier 41, a first resistor 42 having a first end 42a connected with the inverting input 41a of the same opamp 41, and a second end 42b connected with the output 21c of the second opamp 21; in addition it comprises a second resistor 43 connected between the inverting input 41a and the output 41c of the fourth opamp 41.

An auxiliary resistor 61 can be connected between the inverting input 31a of the third opamp 31, and a fixed-potential node, preferably grounded; a secondary resistor 62 can be connected between the inverting input 21a of the second opamp 21 and a fixed potential node, preferably grounded.

In FIG. 20 a resistor 109 can be connected between the output 31c of the third opamp 31 and the inverting input 21a of the second opamp 21. In this case the feedback means 23 of the second stage 20 alternatively comprises a resistor parallel-connected to a branch comprising a single capacitor or a capacitor in series with a resistor; the feedback means 33 of the third stage 30 is defined by a single capacitor or a capacitor in series with a resistor.

In more detail, in the circuit in FIG. 19 the output 41c of the fourth opamp 41 can be connected to the inverting input 11a of the first opamp 11 by means of said resistor 104 if said feedback branch 103 is not used; the noninverting input 41b of the fourth opamp 41 is connected with the inverting input 21a of the second opamp 21.

In addition, a direct connection 212 is interposed between the inverting input 21a of the second opamp 21 and the noninverting input 31b of the third opamp 31; a direct connection 107 is interposed between the noninverting input 11b of the first opamp 11 and the inverting input 21a of the second opamp 21.

As an alternative to the mentioned direct connection 107, the noninverting input 11b of the first opamp 11 can be connected to the ground through a resistor 105, and to the output 21c of the second opamp 21 through a resistor 106. Finally, the noninverting input 21b of the second opamp 21 is grounded.

In the circuit in FIG. 20, the connections relating to the fourth stage 40 are the same as in the circuit in FIG. 19. A feedback resistor 106 is connected between the output 21c of the second opamp 21 an the noninverting input 11b of the first opamp 11, while a direct connection 212 is interposed between the inverting input 21a of the second opamp 21 and the noninverting input 31b of the third opamp 31; the noninverting input 21b of the second opamp 21 is grounded. In addition, a connecting branch 110 connects the inverting input 31a of the third opamp 31 with the noninverting input 11b of the first opamp 11; this connecting branch 110 may consist either of a direct connection 207 or of a resistor 111.

With reference to the circuits in FIGS. 19 and 20, in relation to the input signal Vs, the output 11c of the first opamp 11 is a −90 out of phase high-pass output, the output 21c of the second opamp 21 is a band-pass output that is not out of phase, the output 31c of the third opamp 31 is a 90° out of phase low-pass output, and the output 41c of the fourth opamp 41 (i.e. the output "out" of the fourth stage 40) is a −180° out of phase band-pass output.

Figure 21:
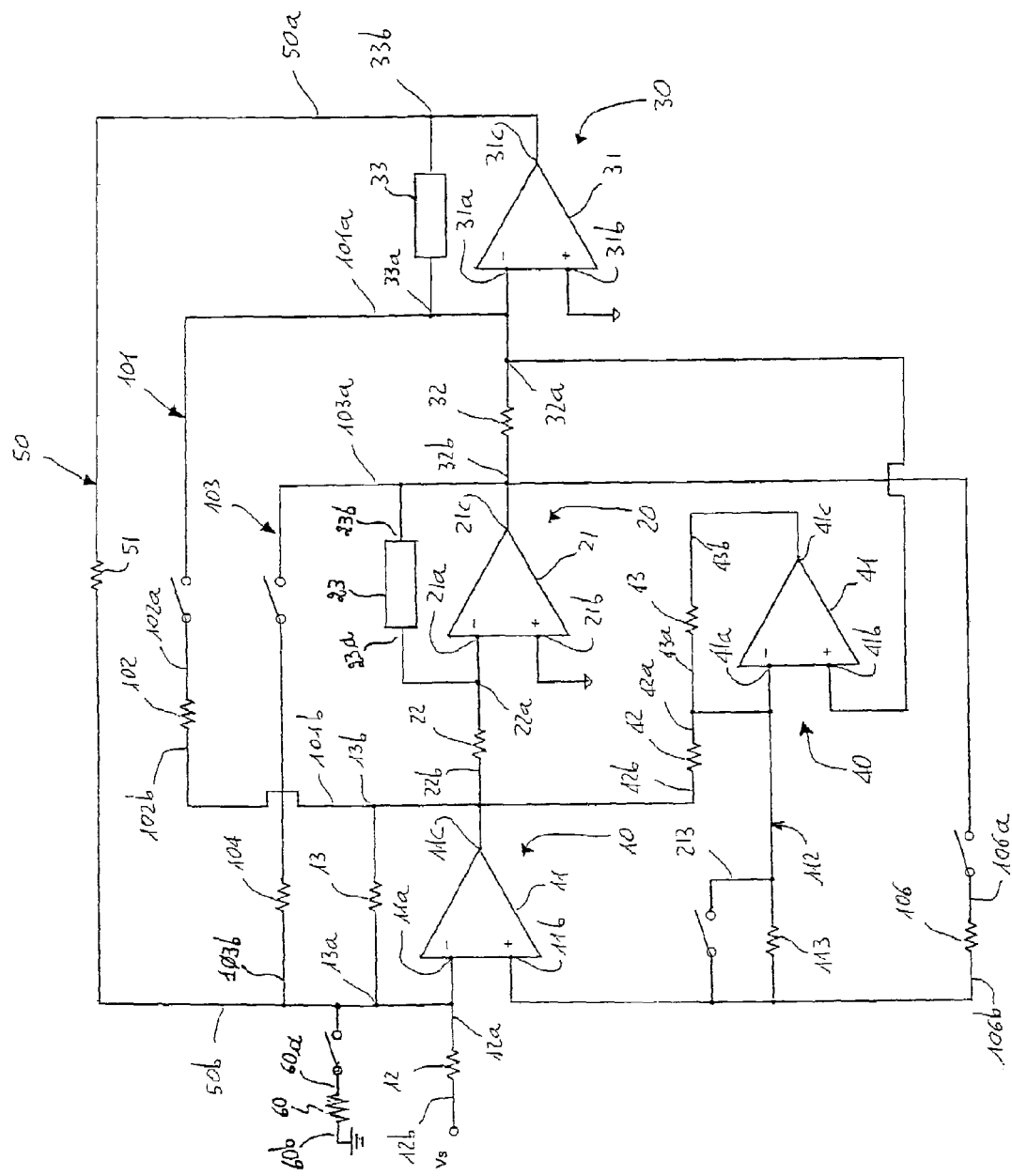
Figure 22:
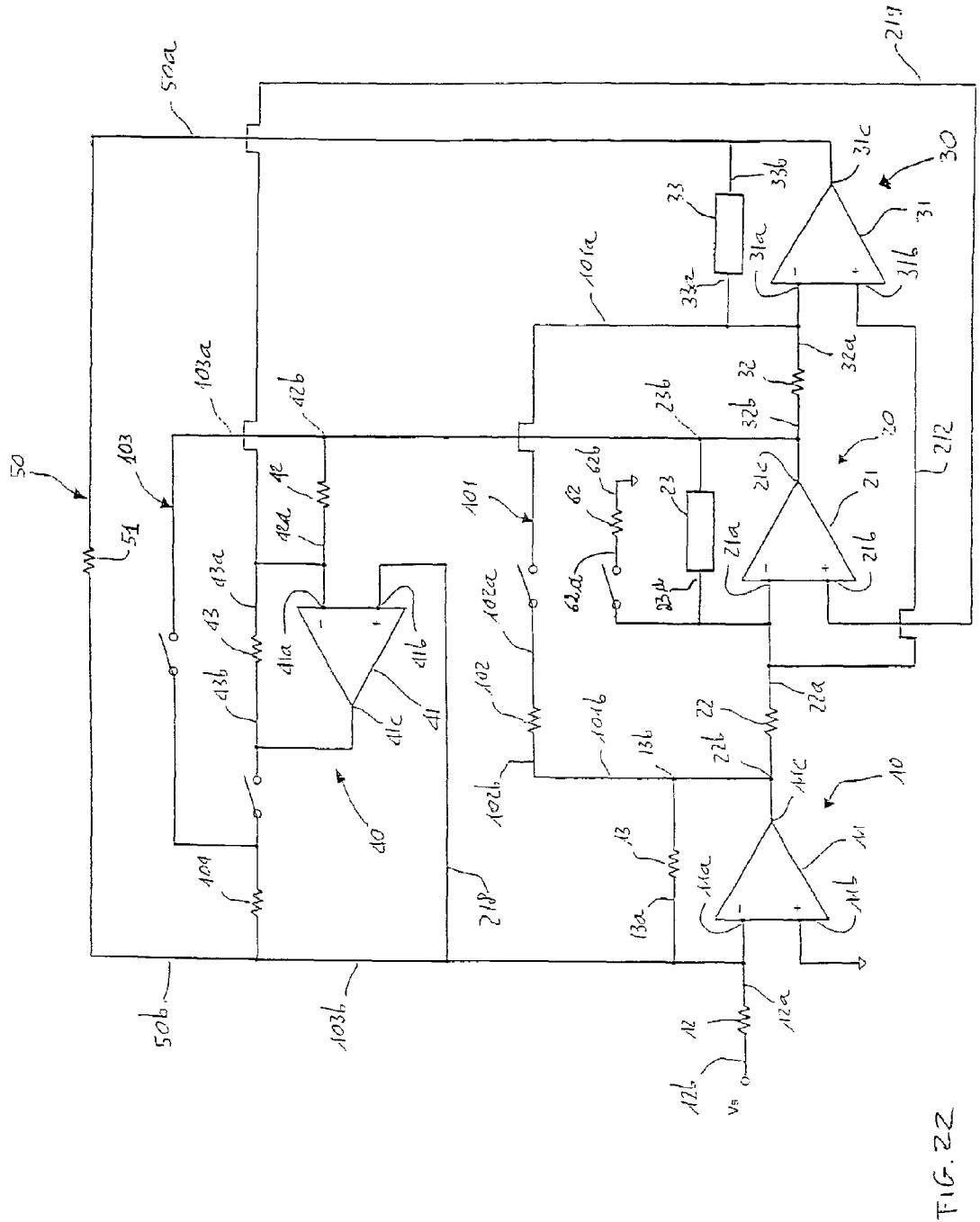
Figure 23:
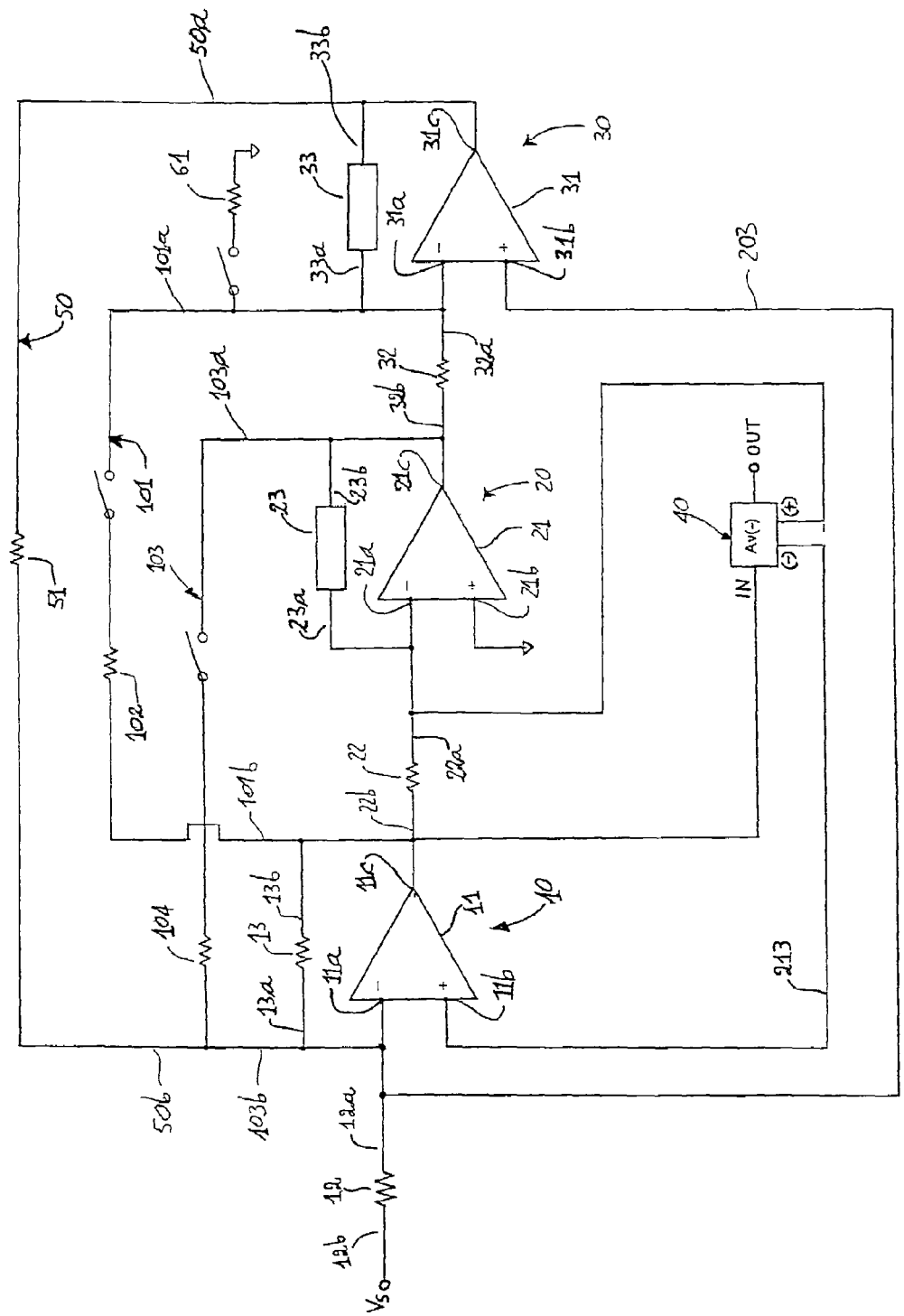

FIGS. 21-23 show further embodiments of filter 1. The first stage 10 is feedbacked through the respective second resistor 13 connected between the output 11c and the inverting input 11a of the first opamp 11.

The feedback means 23 of the second stage 20 preferably consists of a first branch comprising either a single capacitor or a capacitor series-connected to a resistor; this branch can be parallel-connected to a second branch defined by a resistor and a capacitor in series with each other; the feedback means 33 of the third stage 30 consists of a single capacitor or a capacitor in series with a resistor.

Alternatively, the feedback means 23 of the second stage 20 is defined by a single capacitor or a capacitor in series with a resistor, while the feedback means 33 of the third stage 30 consists of two parallel-connected branches; the first branch comprises a single capacitor or a capacitor in series with a resistor and the second branch comprises a capacitor and a resistor in series.

A feedback branch 101, defined in particular by a resistor 102, connects the inverting input 31a of the third opamp 31 with the output 11c of the first opamp 11, and a feedback branch 103, preferably defined by a resistor 104, connects the output 21c of the second opamp 21 with the inverting input 11a of the first opamp 11.

In addition to the above, a fourth stage 40 is connected to the other stages; this fourth stage 40 is provided with a fourth opamp 41, a first resistor 42 and a second resistor 43, said second resistor 43 being connected between the inverting input 41a and the output 41c of the fourth opamp 41. The second resistor 42 has a first end 42a connected with the inverting input 41a of the fourth opamp 41.

The inverting input 41a is preferably connected with the non inverting input 11b, 21b, 31b of at least one of said first, second and third opamp 11, 21, 31, either directly or through a resistor.

In the circuit in FIG. 23, an auxiliary resistor 61 is connected between the inverting input 31a of the third opamp 31 and a fixed-potential node, preferably grounded; in the circuit in FIG. 22 a secondary resistor 62 is connected between the inverting input 21a of the second opamp 21 and a fixed-potential node, preferably grounded; in the circuit in FIG. 21, a main resistor 60 is connected with the inverting input 11a of the first opamp 11 and a fixed-potential node, preferably grounded.

In the circuit in FIG. 21, the noninverting input 11b of the first opamp 11 is connected to the inverting input 41a of the fourth opamp 41, through either a direct connection 213 or a resistor 113; the noninverting input 11b of the first opamp 11 can also be connected to the output 21c of the second opamp 21, through the feedback resistor 106.

The output 11c of the first opamp 11 is connected with the second end 42b of the first resistor 42 of the fourth stage 40, and the noninverting input 41b of the fourth opamp 41 is directly connected with the inverting input, 31a of the third opamp 31. The noninverting input 21b and 31b of the second and third operational amplifiers 21, 31 respectively are connected to the ground.

In the circuit in FIG. 22, the noninverting input 11b of the first opamp 11 is grounded while a direct connection 212 is interposed between the inverting input 21a of the second opamp 21 and the noninverting input 31b of the third opamp 31; a direct connection 219 connects the noninverting input 21b of the second opamp 21 with the inverting input 41a of the fourth opamp 41 and a further direct connection 218 connects the noninverting input 41b of the fourth opamp 41 with the inverting input 11a of the first opamp 11. The second end 42b of the first resistor 42 of the fourth stage 40 is connected to the output 21c of the second opamp 21.

In the circuit in FIG. 23, a connection 203 connects the inverting input 11a of the first opamp 11 with the noninverting input 31b of the third opamp 31; with reference to the fourth stage 40, the inverting input 41a is connected (direct connection 213) with the noninverting input 11b of the first opamp 11, the second end 42b of the first resistor 42 is connected with the output 11c of the first opamp 11 and the noninverting input 41b is connected with the inverting input 21a of the second opamp 21. The noninverting input 21b of the second opamp 21 is grounded.

In both the circuits shown in FIGS. 21 and 23, in relation to the input signal Vs, the output 11c of the first opamp 11 is a −90° out of phase high-pass output, the output 21c of the second opamp 21 is a band-pass output that is not out of phase, the output 31c of the third opamp 31 is a 90° out of phase low-pass output, and the output 41c of the fourth opamp 41 (i.e. the output of the fourth stage 40) is a 90° out of phase high-pass output.

In the circuit in FIG. 22, in relation to the input signal Vs, the output 11c of the first opamp 11 is a −90° out of phase high-pass output, the output 21c of the second opamp 21 is a band-pass output that is not out of phase, the output 31c of the third opamp 31 is a 90° out of phase low-pass output and the output 41c of the fourth opamp 41 is a −180° out of phase band-pass output.

Figure 15:
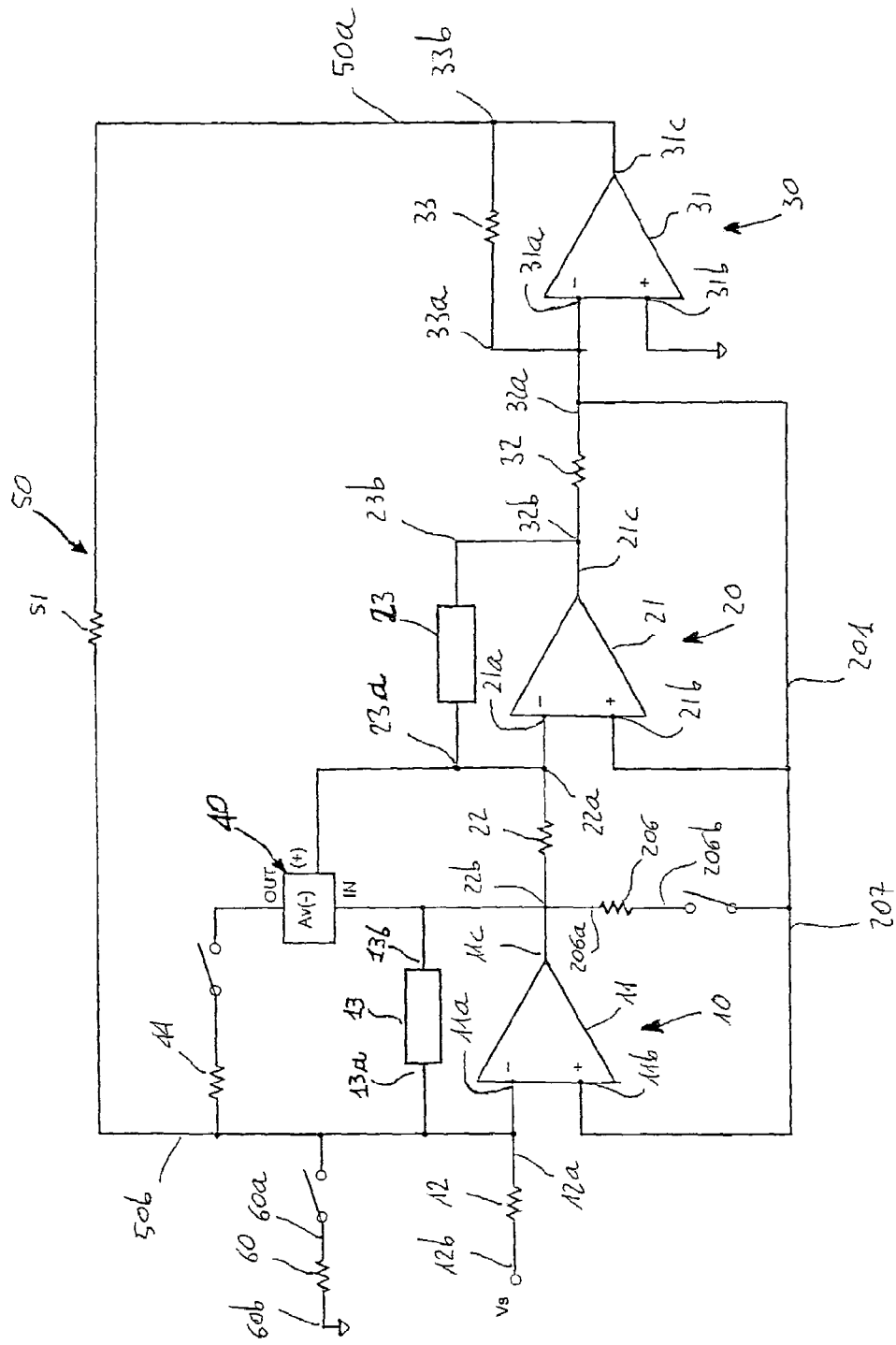
Figure 16:
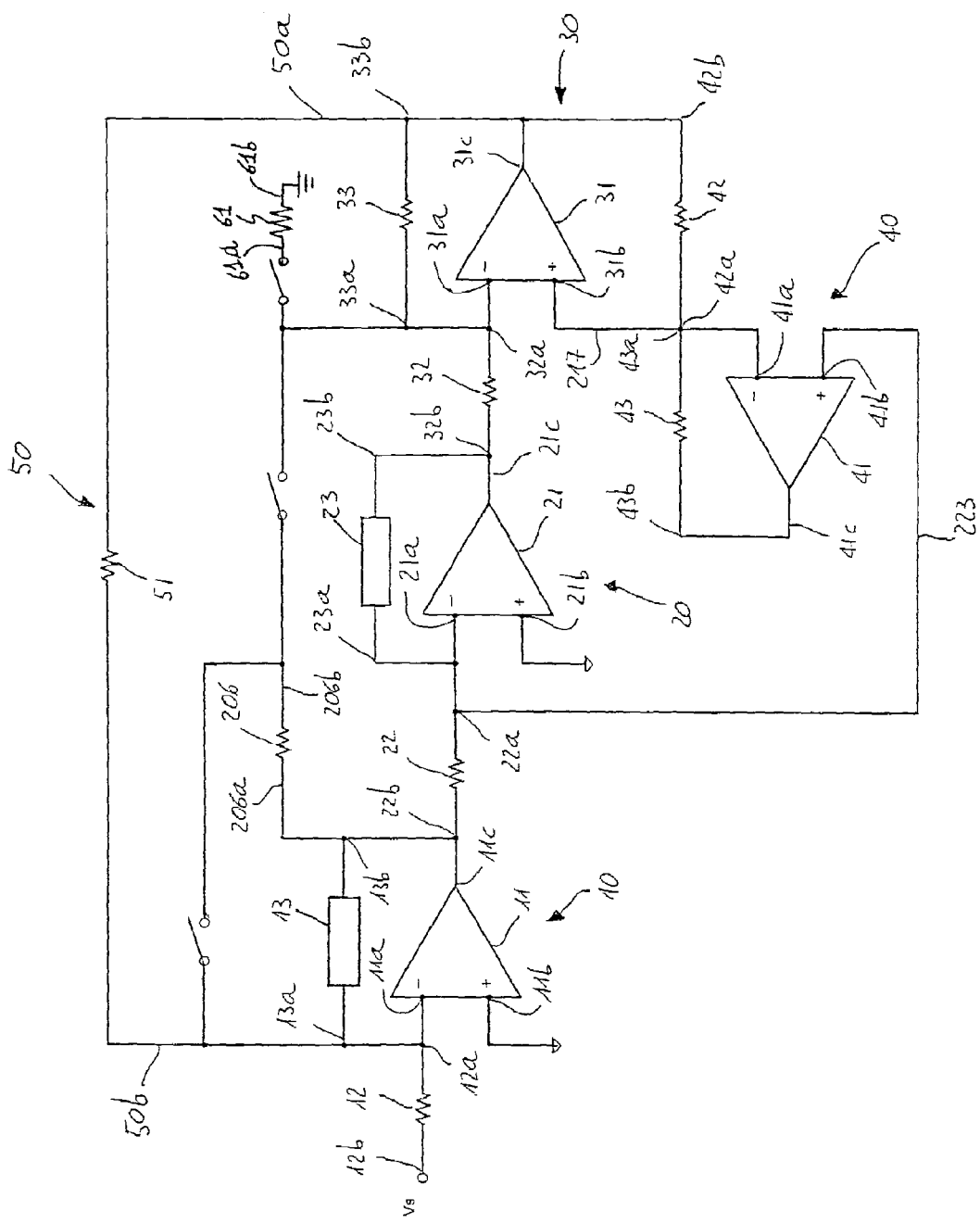

The diagram in FIG. 15 shows a further embodiment of filter 1. The feedback means 13 of the first stage 10 can consist of a branch comprising a single capacitor or a capacitor in series with a resistor; this branch can be connected in parallel with a resistor.

The feedback means 23 of the second stage 20 may comprise a single capacitor or a capacitor series-connected with a resistor.

The third opamp 31 is feedbacked through second resistor 33.

Also provided is preferably a fourth stage 40 the structure of which is shown in FIG. 33; the output 41c of the fourth opamp 41 can be connected to the inverting input 11a of the first opamp 11, through a resistor 44, and the second end 42b of the first resistor 42 is connected with the output 11c of the first opamp 11.

A feedback resistor 206 is preferably connected between the output 11c of the first opamp 11 and the inverting input 31a of the third opamp 31.

In addition, a main resistor 60 is connected between the inverting input 11a of the first opamp 11 and a fixed-potential node, preferably a grounded node.

A secondary resistor 62 can be connected between the inverting input 21a of the second opamp 21 and a fixed-potential node, preferably grounded.

A direct connection 207 preferably connects the noninverting input 11b of the first opamp 11 with the inverting input 31a of the third opamp 31 and a direct connection 201 connects the noninverting input 21b of the second opamp 21 with the inverting input 31a of the third opamp 31. The noninverting input 31b of the third opamp 31 is grounded and the noninverting input 41b of the fourth opamp 41 is connected to the inverting input 21a of the second opamp 21.

With reference to the same circuit in FIG. 15, in relation to the input signal Vs, the output 11c of the first opamp 11 is a −180° out of phase band-pass output, the output 21c of the second opamp 21 is a −90° out of phase low-pass output, the output 31c of the third opamp 31 is a 90° out of phase low-pass output, and the output 41c of the fourth opamp 41 (i.e. the "out" output of the fourth stage 40) is a band-pass output that is not out of phase.

Figure 17:
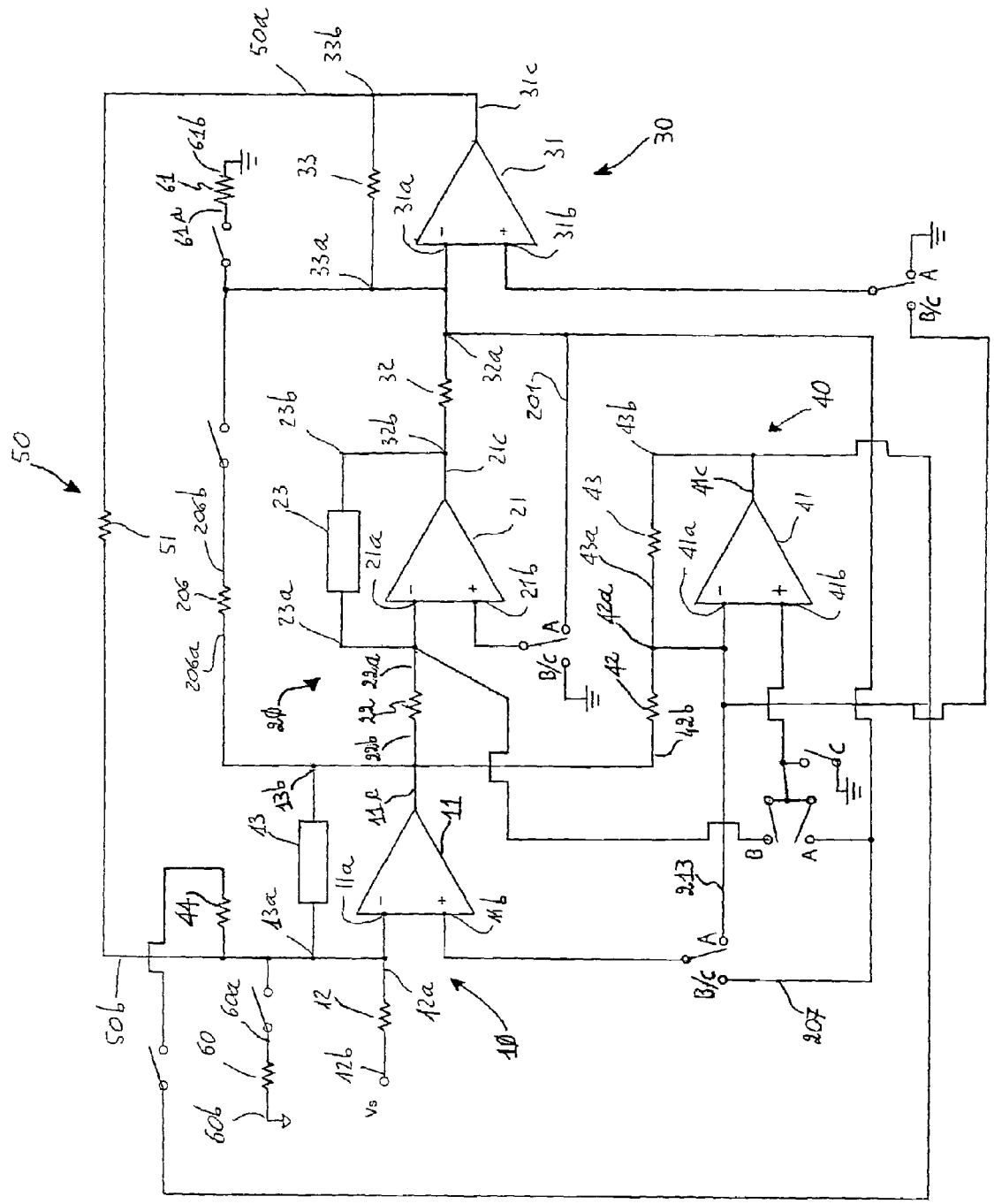

The diagram in FIG. 17 shows a further embodiment of filter 1. The feedback means 13 of the first stage 10 can consist of a single capacitor, or of a capacitor series- or parallel-connected with a resistor, or of a resistor parallel-connected with a branch defined by a capacitor and a resistor in series with each other. The feedback means 23 of the second stage comprises a single capacitor or a capacitor in series with a resistor; the third stage 30 is feedbacked by means of resistor 33.

A main resistor 60 is connected between the inverting input 11a of the first opamp and a fixed-potential node, preferably a grounded node; in addition, an auxiliary resistor 61 is connected between the inverting input 31a of the third opamp 31 and a fixed-potential node, preferably a grounded node.

A feedback resistor 206 can be interposed between the output 11c of the first opamp 11 and the inverting input 31a of the third opamp 31; also provided is a fourth stage 40 having a fourth opamp 41, a first resistor 42 and a second resistor 43.

The first resistor 42 is connected between the output 11c of the first opamp 11 and the inverting input 41a of the fourth opamp 41, and the second resistor 43 is connected between the inverting input 41a and the output 41c of the fourth opamp 41 itself. The output 41c of the fourth opamp 41 can be connected with the inverting input 11a of the first opamp 11, through a resistor 44.

The circuit in FIG. 17 shows two possible configurations, the first one being identified by position "A" (17(A)), the second one being identified by positions "B, "B/C" and "C" of the switches therein present. In the first configuration ("A") a direct connection 213 connects the noninverting input 11b of the first opamp 11 with the inverting input 41a of the fourth opamp 41, while the noninverting input 41b of the fourth opamp 41 is directly connected with the inverting input 31a of the third opamp 31. A direct connection 201 is interposed between the noninverting input 21b of the second opamp 21 and the inverting input 31a of the third opamp 31, while the input 31b of the third opamp 31 is grounded.

In the second configuration ("B", "B/C", "C"), a direct connection 207 connects the noninverting input 11b of the first opamp 11 with the inverting input 31a of the third opamp 31 and the noninverting input 41b of the fourth opamp 41 is connected either to the ground (position "C"), or to the inverting input 21a of the second opamp 21 (position "B"). The noninverting input 21b of the second opamp 21 is connected to the ground and the noninverting input 31b of the third opamp 31 is directly connected with the inverting input 41a of the fourth opamp 41.

With reference to the same circuit in FIG. 17, in relation to the input signal Vs, the output 11c of the first opamp 11 is a −180° out of phase band-pass output, the output 21c of the second opamp 21 is a −90° out of phase low-pass output, the output 31c of the third opamp 31 is a 90° out of phase low-pass output, and the output 41c of the fourth opamp 41 is a band-pass output that is not out of phase.

Figure 18:
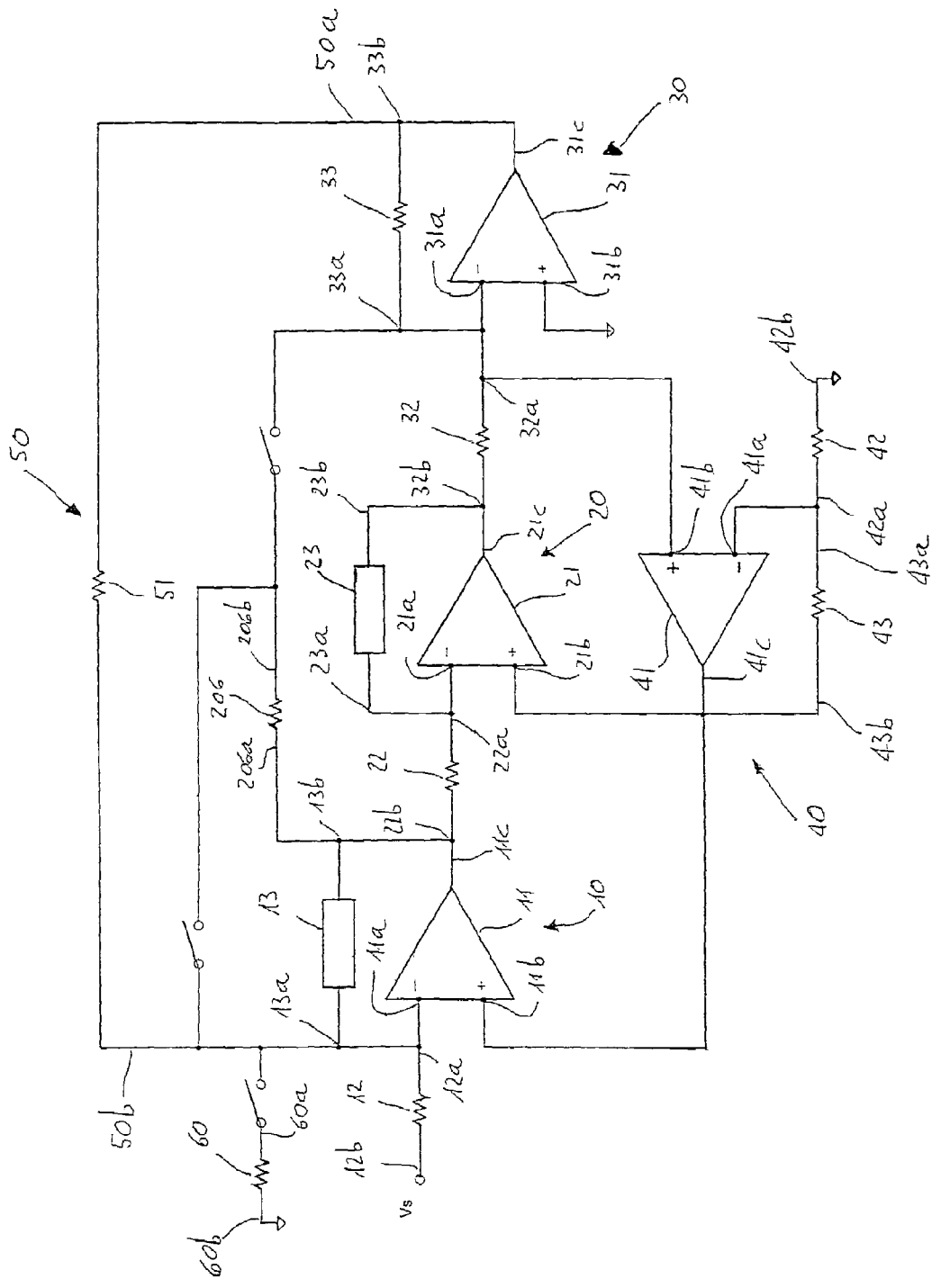

The circuit in FIG. 18 shows a further embodiment of filter 1. The feedback means 13 of the first stage 10 can consist either of a single capacitor, or of a capacitor and a resistor connected in series with each other. The feedback means 23 of the second stage 20 can consist of a single capacitor, a capacitor connected in series with a resistor, or two branches connected with each other in parallel; the first branch is defined by a single capacitor or a capacitor series-connected with a resistor and the second branch is defined by a single resistor or a resistor series connected with a capacitor.

The third stage 30 is feedbacked through resistor 33. A fourth stage 40 has a fourth opamp 41, a first resistor 42 and a second resistor 43; the first resistor 42 is connected between the inverting input 41a and a fixed potential node, preferably grounded, while the second resistor 43 is connected between the inverting input 41a and the output 41c of the fourth opamp 41; the noninverting input 41b of the fourth opamp 41 is directly connected with the inverting input 31a of the third opamp 31.

The output 41c of the fourth opamp 41 is preferably connected with the noninverting inputs 11b, 21b of the first and second operational amplifiers 11, 21 and the noninverting input 31b of the third opamp 31 is grounded.

Figure 24:
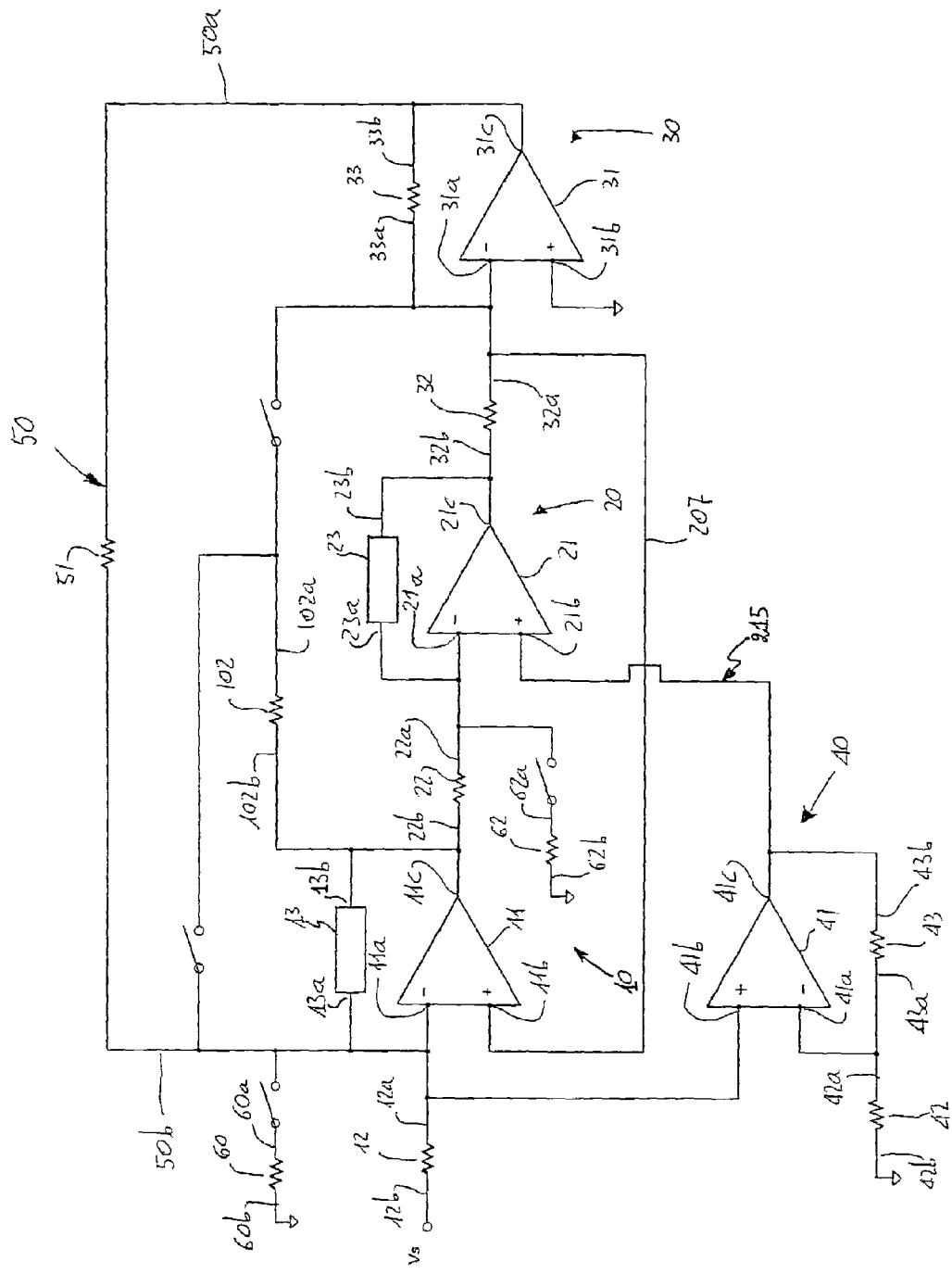

With reference to the same circuit in FIG. 18, in relation to the input signal Vs, the output 11c of the first opamp 11 is a −180° out of phase band-pass output, the output 21c of the second opamp 21 is a −90° out of phase low-pass output, and the output 31c of the third opamp 31 is a 90° out of phase low-pass output. FIG. 24 shows a further embodiment of filter 1. The feedback means 13 of the first stage 10 can consist of a single capacitor or a capacitor in series with a resistor. The feedback means 23 of the second stage 20 can consist of a single capacitor or a capacitor in series with a resistor. The third stage 30 is feedbacked through resistor 33.

Preferably feedback resistor 102 has a first end 102a connected with the inverting input 11a of the first opamp 11 or the inverting input 31a of the third opamp 31, and a second end 102b connected with the output 11c of the first opamp 11. A main resistor 60 can be connected between the inverting input 11a of the first opamp 11 and a fixed-potential node, preferably a grounded node. A secondary resistor 62 can be connected between the inverting input 21a of the second opamp 21 and a fixed-potential node, preferably a grounded node. A fourth stage 40 is provided with a fourth opamp 41, a first resistor 42 and a second resistor 43, the latter being connected between the inverting input 41a and the output 41c of the fourth opamp 41; the first resistor 42 is connected between the inverting input 41a of the fourth opamp 41 and a fixed potential node, preferably grounded. The noninverting input 41b of the fourth opamp 41 is connected to the inverting input 11a of the first opamp 11. The output 41c of the fourth opamp 41 can be connected, preferably in a direct manner (connection 215), to the noninverting input 21b of the second opamp 21. A direct connection 207 preferably connects the noninverting input 11b of the first opamp 11 with the inverting input 31a of the third opamp 31; the noninverting input 31b of the third opamp 31 is connected to a fixed potential node, preferably grounded.

With reference to the diagram in FIG. 24, in relation to the input signal Vs, the output 11c of the first opamp 11 is a −180° out of phase band-pass output, the output 21c of the second opamp 21 is a −90° out of phase low-pass output, and the output 31c of the third opamp 31 is a 90° out of phase low-pass output.

The diagrams in FIGS. 25-29 show further embodiments of filter 1.

The first stage 10 comprises, in addition to the first opamp 11, a first connecting block 13 having a first end 13a connected with the inverting input 11a of the first opamp 11, and a second end 13b; a first connecting branch 15 has a first end 15a connected to the second end 13b of the first connecting block 13, and a second end 15b connected with the output 11c of the first opamp 11. The second stage 20 comprises, in addition to the second opamp 21, a second connecting block 23 having a first end 23a connected with the inverting input 21a of the second opamp 21 and a second end 23b; a second connecting branch 25 has a first end 25a connected with the second end 23b of the second connecting block 23 and a second end 25b connected to the output 21c of the second opamp 21. The third stage 30 comprises, in addition to the third opamp 31, a third connecting block 33 having a first end 33a connected with the inverting input 31a of the third opamp 31 and a second end 33b; a third connecting branch 35 has a first end 35a connected to the second end 33b of the third connecting block 33 and a second end 35b connected to the output 31c of the third opamp 31.

Resistors 12 (for receiving an input signal Vs), 22 (for connection between the output 11c of the first opamp 11 and the inverting input 21a of the second opamp 21), and 32 (for connection between the output 21c of the second opamp 21 and the inverting input 31a of the third opamp 31) can be provided.

At least one predetermined connecting branch between said first, second and third connecting branches 15, 25, 35 comprises a fourth stage 40 provided with a fourth opamp 41; the output 41c of the fourth opamp 41 defines the first end 15a, 25a, 35a of the predetermined connecting branch, the noninverting input 41b of the fourth opamp 41 defining the second end 15b, 25b, 35b of the predetermined connecting branch. Alternatively, the second end of the predetermined connecting branch can be coincident with an end of a first resistor 42 having the other end connected to the noninverting input 41b of the fourth opamp 41. A feedback branch 91 defined by a short circuit or a resistor 44 is connected between the inverting input 41a and the output 41c of the fourth opamp 41.

Figure 25:
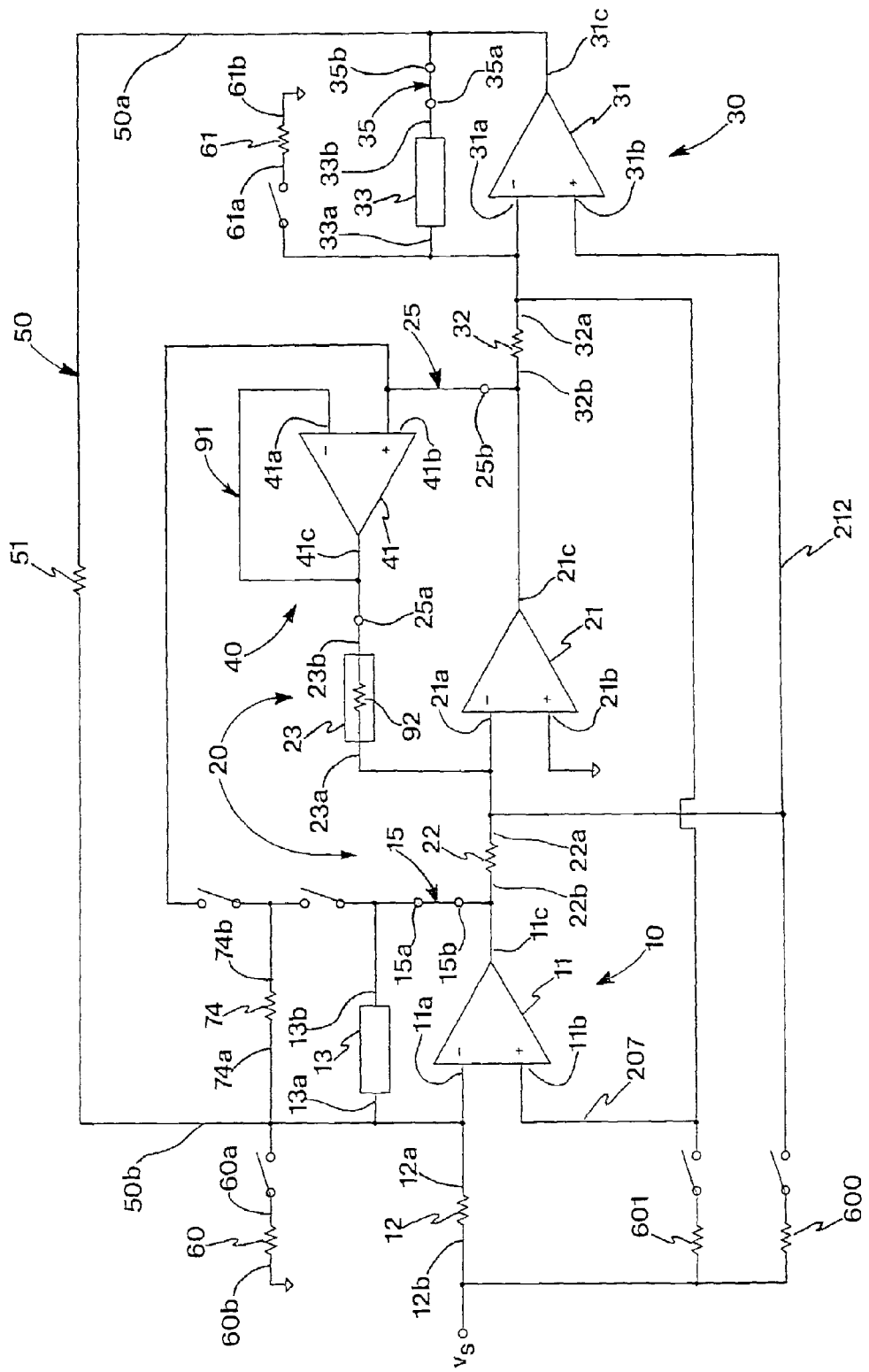
Figure 26:
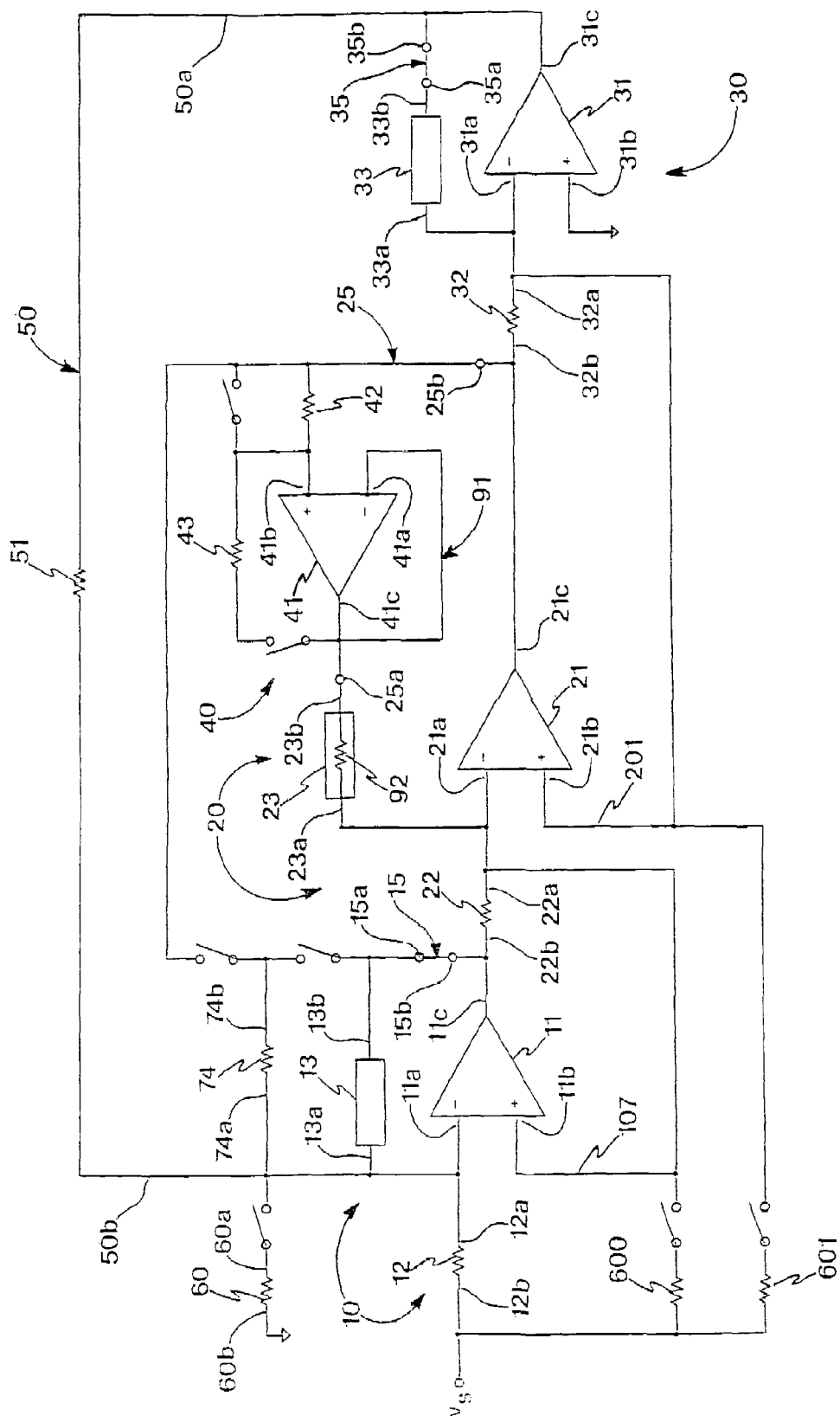
Figure 2H:
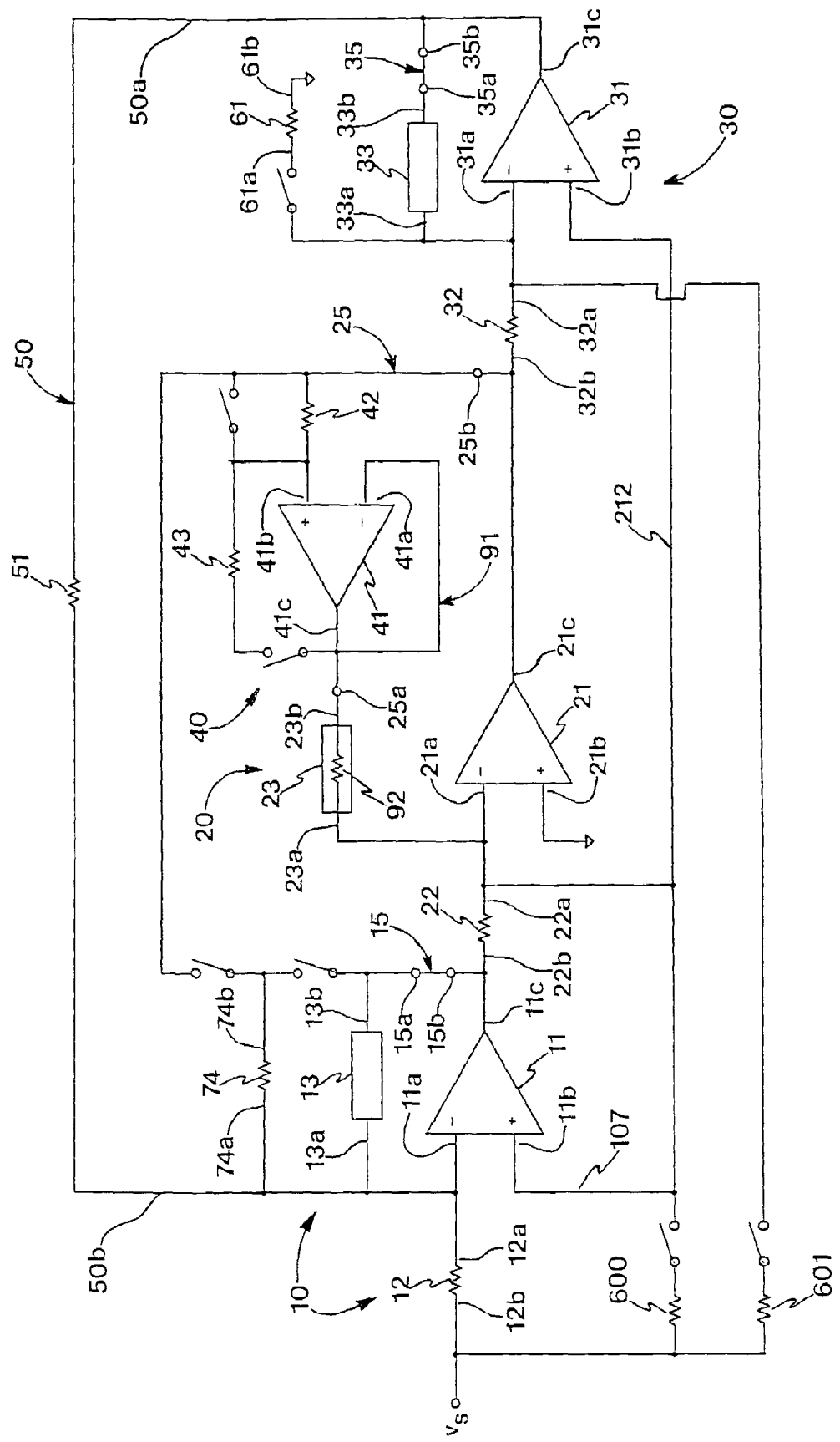

In the diagrams in FIGS. 25-27 the fourth stage 40 is included in the second connecting branch 25; the second connecting block 23 is preferably defined by a resistor 92. The first connecting block 13 can consist of a single capacitor or a capacitor in series with a resistor; the third connecting block 33 can consist of a single capacitor or a capacitor in series with a resistor.

Alternatively, the first connecting block 13 consists of a single capacitor or a capacitor in series with a resistor, whereas the third connecting block 33 comprises two branches connected in parallel; a first branch being defined by a single capacitor or a capacitor in series with a resistor, and a second branch being defined by a single resistor or a resistor in series with a capacitor.

A feedback resistor 74 has a first end 74a connected with the inverting input 11a of the first opamp 11, and a second end 74b connected either to the output 11c of the first opamp 11 or to the second end 25b of the second connecting branch 25.

In the diagrams in FIGS. 25 and 26 a main resistor 60 is connected between the inverting input 11a of the first opamp 11 and a fixed-potential node, preferably a grounded node; in the diagrams in FIGS. 25 and 27, an auxiliary resistor 61 is connected between the inverting input 31a of the third opamp 31 and a fixed-potential node, preferably a grounded node. The first and third connecting branches 15, 35 are short circuits.

In the circuit in FIG. 25a direct connection 207 connects the noninverting input 11b of the first opamp 11 to the inverting input 31a of the third opamp 31; a direct connection 212 connects the inverting input 21a of the second opamp 21 to the noninverting input 31b of the third opamp 31. The noninverting input 21b of the second opamp 21 is grounded, and the second end 25b of the second connecting branch 25 is defined by the noninverting input 41b of the fourth opamp 41.

In the circuit in FIG. 26, a second resistor 43 can be interposed between the noninverting input 41b and the output 41c of the fourth opamp 41; a direct connection 107 connects the noninverting input 11b of the first opamp 11 with the inverting input 21a of the second opamp 21. A direct connection 201 connects the noninverting input 21b of the second opamp 21 with the inverting input 31a of the third opamp 31; the noninverting input 31b of the third opamp 31 is grounded and the noninverting input 41b of the fourth opamp 41 can be connected to the second end 25b of the second connecting branch 25, through the first resistor 42.

In the circuit in FIG. 27, with reference to the fourth stage 40, a first resistor 42 can be interposed between the noninverting input 41b of the fourth opamp 41 and the second end 25b of the second connecting branch 25, and a second resistor 43 can be connected between the noninverting input 41b and the output 41c of the fourth opamp 41. A direct connection 107 is interposed between the noninverting input 11b of the first opamp 11 and the inverting input 21a of the second opamp 21; a direct connection 212 connects the inverting input 21a of the second opamp 21 to the noninverting input 31b of the third opamp 31, while the noninverting input 21b of the second opamp 21 is connected to the ground.

With reference to the circuits in FIGS. 25-27, if resistors 600 and 601 are not used, in relation to the input signal Vs, the output 11c of the first opamp 11 is a −180° out of phase band-pass output, the output 21c of the second opamp 21 is a band-pass output that is not out of phase, the output 31c of the third opamp 31 is a 90° out of phase low-pass output; if on the contrary resistors 600 and 601 are used, the output 11c of the first opamp 11 is a −180° out of phase band-pass output, the output 21c of the second opamp 21 is a notch output in which the frequencies that are not eliminated are out of phase by 180°, and the output 31c of the third opamp 31 is a 90° out of phase low-pass output.

Figure 28:
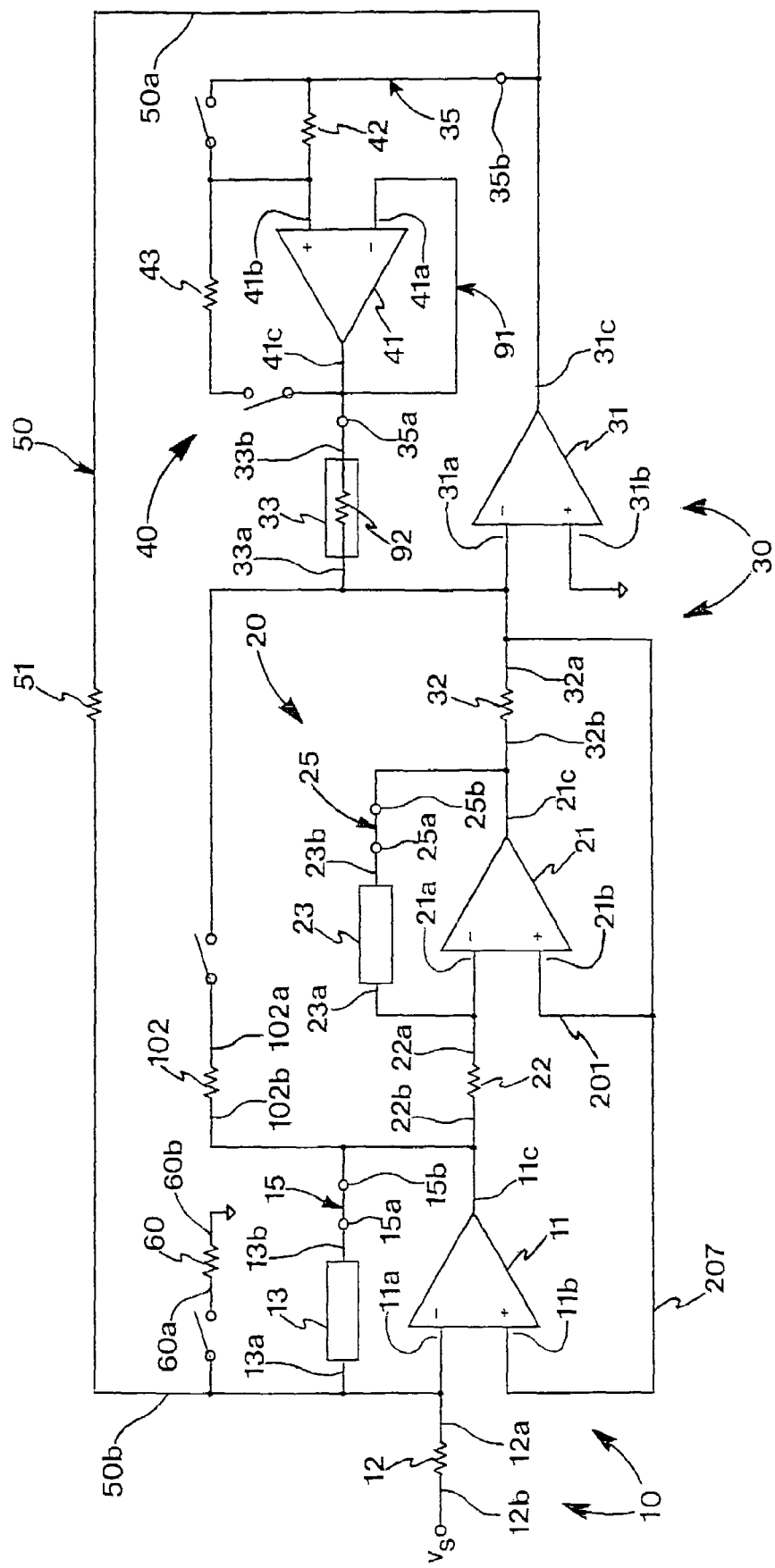
Figure 28:
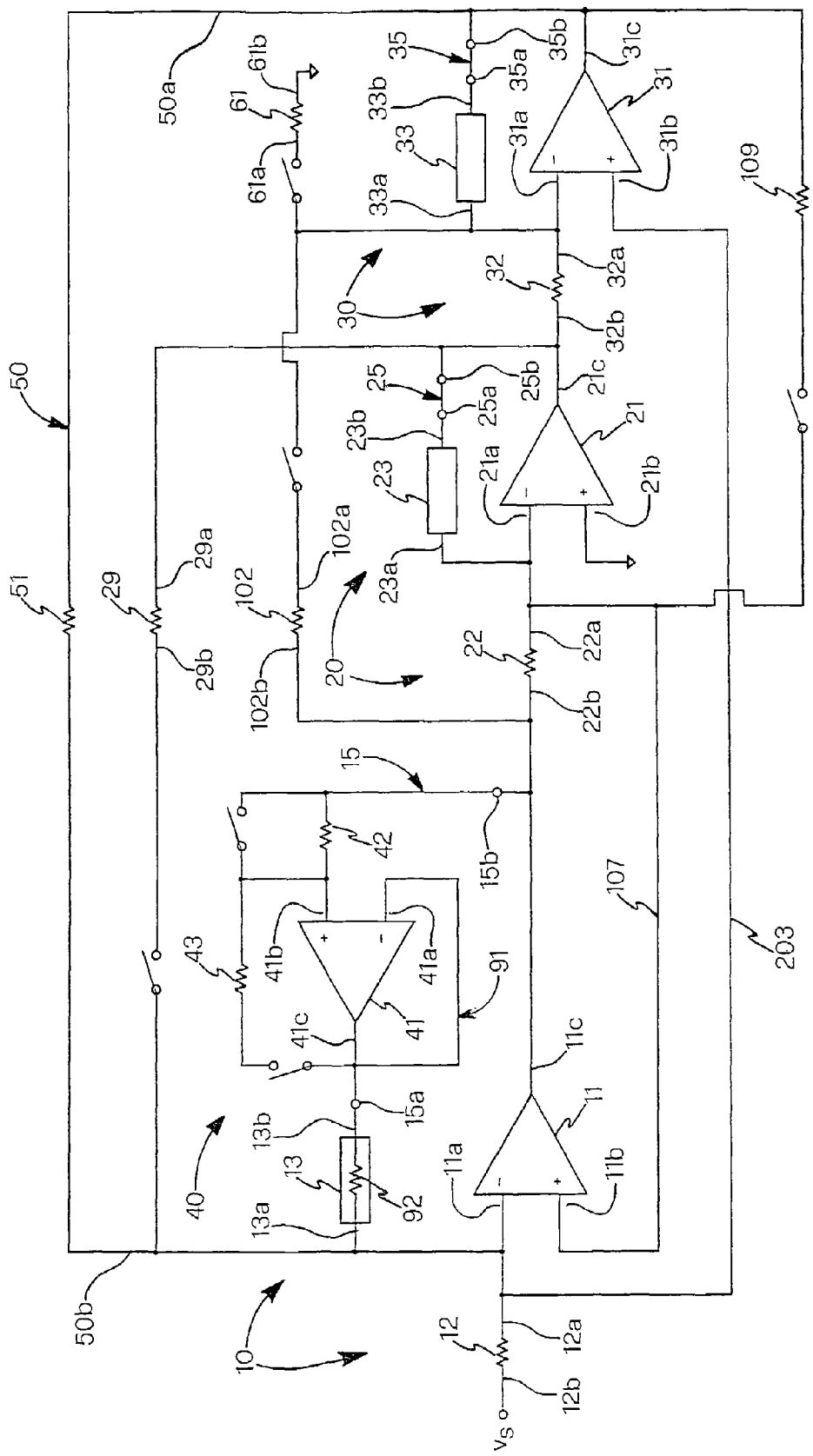

In the diagram in FIG. 28, the fourth stage 40 is included in the third connecting branch 35; the third connecting block 33 is preferably defined by a resistor 92. The first connecting block 13 can consist of a single capacitor or a capacitor in series with a resistor; alternatively, said first block may consist of a resistor connected in parallel to a branch comprising a single capacitor or a capacitor in series with a resistor. The second connecting block 23 can be defined by a single capacitor or a capacitor connected in series with the inverting input 31a of the third opamp 31.

A main resistor 60 is connected between the inverting input 11a of the first opamp 11 and a fixed-potential node, preferably a grounded node.

A direct connection 207 connects the input 11b of the first opamp 11 to the inverting input 31a of the third opamp 31, and a direct connection 201 connects the noninverting input 21b of the second opamp 21 to the inverting input 31a of the third opamp 31; the noninverting input 31b of the third opamp 31 is grounded. The noninverting input 41b of the fourth opamp 41 can be connected to the second end 35b of the third connecting branch 35, through a first resistor 42; a second resistor 43 can be connected between the noninverting input 41b and the output 41c of the fourth opamp 41.

With reference to the circuit in FIG. 28, in relation to the input signal Vs, the output 11c of the first opamp 11 is a −180° out of phase band-pass output, the output 21c of the second opamp 21 is a −90° out of phase low-pass output, and the output 31c of the third opamp 31 is a 90° out of phase low-pass output.

In the circuit in FIG. 29, the fourth stage 40 is included in the first connecting branch 15; the first connecting block 13 is preferably defined by a resistor 92. The second connecting block 23 can consist of two branches connected in parallel; the first branch being defined either by a single capacitor or a capacitor in series with a resistor and the second branch being defined by a single resistor or a resistor in series with a capacitor; the third connecting block 33 is defined by a single capacitor or a capacitor in series with a resistor.

Alternatively, the second connecting block 23 can consist of a single capacitor or a capacitor in series with a resistor, while the third connecting block 33 can comprise two parallel-connected branches; the first branch being defined by a single capacitor or a capacitor in series with a resistor, and the second branch being defined by a resistor connected in series with a capacitor.

In a further alternative embodiment the feedback means 23, 33 are each defined by a single capacitor or a capacitor in series with a resistor, without mutual links. The second and third connecting branches 25, 35 are defined by corresponding short circuits. Also provided is a feedback resistor 29 connected between the inverting input 11a of the first opamp 11 and the output 21c of the second opamp 21; a feedback resistor 102 is connected between the output 11c of the first opamp 11 and the inverting input 31a of the third opamp 31. A feedback resistor 109 is connected between the output 31c of the third opamp 31 and the inverting input 21a of the second opamp 21; with reference to use of this resistor 109, it is more desirable for the feedback means 23 of the second stage 20 to be, alternatively, defined by a resistor connected in parallel with a branch comprising a single capacitor or a capacitor in series with a resistor, while the feedback means 33 of the third stage 30 is defined by a single capacitor or a capacitor in series with a resistor.

An auxiliary resistor 61 is connected between the inverting input 31a of the third opamp 31 and a fixed-potential node, preferably a grounded node.

In the same circuit in FIG. 29, a direct connection 203 connects the inverting input 11a of the first opamp 11 to the noninverting input 31b of the third opamp 31; a direct connection 107 connects the noninverting input 11b of the first opamp 11 to the inverting input 21a of the second opamp 21. The second end 15b of the first connecting branch 15 is defined either by the noninverting input 41b of the fourth opamp 41 or by an end of a first resistor 42 the other end of which is connected with the noninverting input 41b of the fourth opamp 41; a second resistor 43 can be connected between the noninverting input 41b and the output 41c of the fourth opamp 41. In addition, the noninverting input 21b of the second opamp 21 is connected to the ground. It is to be noted that the diagrams in FIGS. 25-29 can be modified, in particular as regards the mode of use of the fourth stage 40 for feedback of a single stage 10, 20 or 30; in FIGS. 35-37 alternative embodiments of this feedback are shown.

A first operational amplifier is generally denoted at 401 and a second operational amplifier is denoted at 501; in the following it will be specified to which of the operational amplifiers 11, 21, 31, 41 they can correspond.

The first opamp 401 has an inverting input 401a, a noninverting input 401b and an output 401c; connected to the inverting input 401a is a resistor 402 a first end 402a of which is connected with the inverting input 401a and a second end 402b of which is set to receive an input signal "Vin" from a general stage located upstream.

The second operational amplifier 501 too has an inverting input 501a, a noninverting input 501b and an output 501c; the noninverting input 501b is connected to the output 401c of the first opamp 401 through a connecting branch 396 that can be defined either by a direct connection or by a first resistor 502. The inverting input 501a and the output 501c of the second opamp 501 are connected with each other by means of a feedback branch 395 defined by a second resistor 503 or a direct connection.

In the diagram in FIG. 35, in accordance with the present invention, the simplest case is shown in which both the connecting branch 396 and the feedback branch 395 are defined by a direct connection; thus the second opamp 501 appears to have the configuration of a buffer.

In the diagram in FIG. 36 the connecting branch 396 is defined by said first resistor 502, the feedback branch 395 is preferably a direct connection whereas a connecting resistor 504 is provided to be in particular connected between the noninverting input 501b and the output 501c of the second opamp 501.

In FIG. 37 the connecting branch 396 is defined by a direct connection, the feedback branch 395 is in particular defined by the second resistor 503, whereas the connecting resistor 504 is provided to be connected between the output 401c of the first opamp 401 and the inverting input 501a of the second opamp 501.

A connecting block 450 connects the output 501c of the second opamp to the inverting input 401a of the first opamp 401 and can consist of a single resistor, a single capacitor, or a resistor and a capacitor connected in series with each other. Alternatively, the circuit structure of the connecting block 450 can be more complicated and can comprise two parallel-connected branches; the first branch being defined by a single resistor or a resistor in series with a capacitor and the second branch comprising a single capacitor or a capacitor in series with a resistor. The active stage shown in FIG. 35 can be used in the diagrams of FIGS. 25-29 as the input stage, i.e. the first opamp 401 is inserted in place of the first opamp 11 in the stated figures, and the second opamp 501 corresponds to the fourth opamp 41 in said figures. The active stage shown in FIG. 35 can be also used, in the same diagrams (FIGS. 25-29), as the intermediate stage, i.e. the first opamp 401 is inserted in place of the second opamp 21 in the stated figures, and the second opamp 501 corresponds to the fourth opamp 41 in these figures. The active stage shown in FIG. 35 can further be used in said diagrams (FIGS. 25-29) as the final stage, i.e. the first opamp 401 is inserted in place of the third opamp 31 in the stated figures, and the second opamp 501 corresponds to the fourth opamp 41 in said figures.

The active stage shown in FIG. 36 can be used in the diagrams of said FIGS. 25-29 as the input stage, i.e. the first opamp 401 is inserted in place of the first opamp 11 in the stated figures, and the second opamp 501 corresponds to the fourth opamp 41 in said figures. The active stage shown in FIG. 36 can also be used in the diagrams of the same figures (25-29) as the intermediate stage, i.e. the first opamp 401 is inserted in place of the second opamp 21 in the stated figures, and the second opamp 501 corresponds to the fourth opamp 41 in said figures. The active stage shown in FIG. 36 can further be used as the final stage, i.e. the first opamp 401 is inserted in place of the third opamp 31 in the stated figures (25-29), and the second opamp 501 corresponds to the fourth opamp 41 in said figures.

The active stage shown in FIG. 37 can be used in the diagrams of the same FIGS. 25-29 as the input stage, i.e. the first opamp 401 is inserted in place of the first opamp 11 in the stated figures, and the second opamp 501 corresponds to the fourth opamp 41 in said figures. The active stage shown in FIG. 37 can be also used as the intermediate stage, i.e. the first opamp 410 is inserted in place of the second opamp 21 in the stated figures (25-29) and the second opamp 501 corresponds to the fourth opamp 41 in said figures. The active stage shown in FIG. 37 can further be used as the final stage, i.e. the first opamp 401 is inserted in place of the third opamp 31 in the stated figures (25-29), and the second opamp 501 corresponds to the fourth opamp 41 in said figures.

It is to be noted that shown in FIGS. 37a-37b are the possible configurations that the connecting block 450 can take; these figures can also refer to the feedback means or the connecting blocks 13, 23, 33 of the previously described figures.

Figure 31:
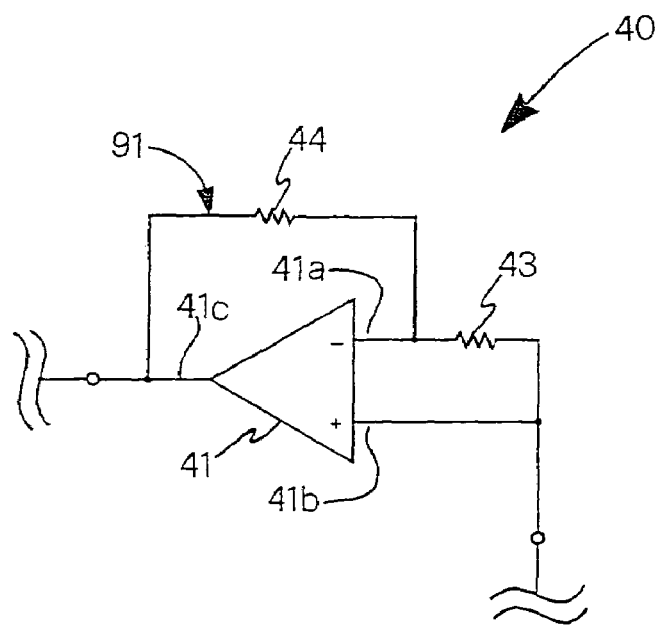

It is also to be noted that the fourth stage 40, with reference to the diagrams in FIGS. 25-29, can take the configuration shown in FIG. 31 in which a resistor 44 is connected between the inverting input 41a and the output 41c of the fourth opamp 41, and a resistor 43 has an end connected to the inverting input 41a of the fourth opamp 41; the noninverting input 41b of the fourth opamp 41 is connected to the opposite end of resistor 43.

Figure 30:
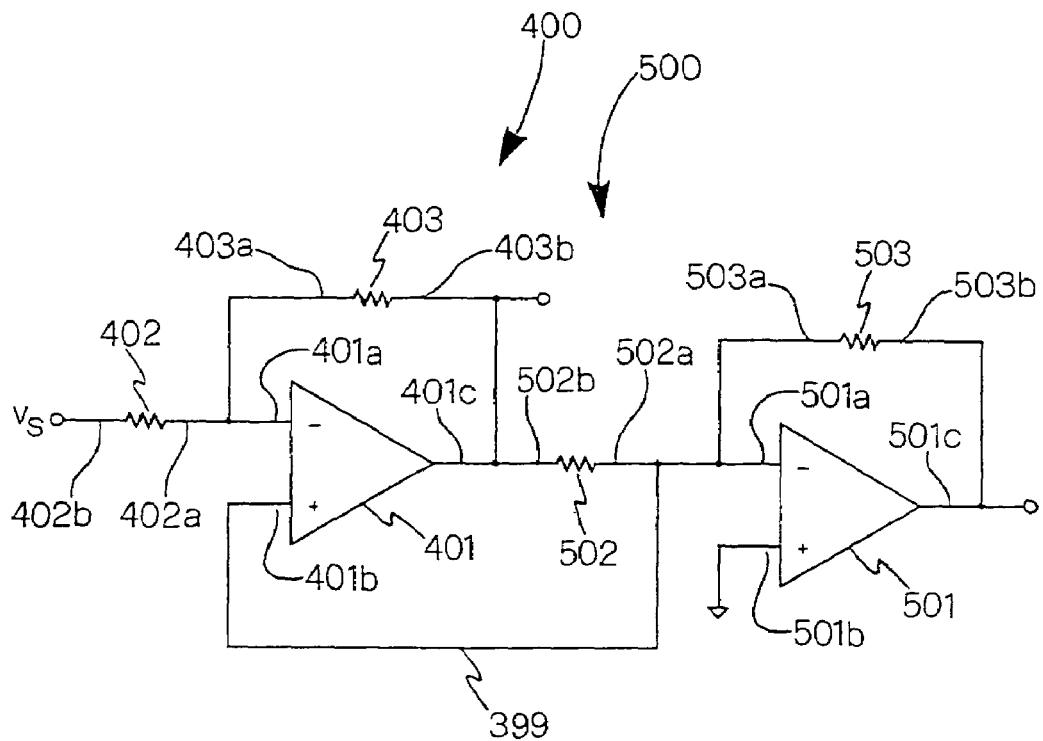

The circuit in FIG. 30 shows an amplifying stage comprising two operational amplifiers 401, 501 that can be used in filter 1. The first opamp 401 is associated with a first resistor 402 having a first end 402a connected with the inverting input 401a of the first opamp 401 and a second end 402b set to receive an input signal Vs; a second resistor 403 is connected between the inverting input 401a and the output 401c of the first opamp 401.

A first resistor 502 is connected between the inverting input 501a of the second opamp 501 and the output 401c of the first opamp 401; a second resistor 503 is connected between the inverting input 501a and the output 501c of the second opamp 501. A direct connection 399 connects the noninverting input 401b of the first opamp 401 to the inverting input 501a of the second opamp 501; the noninverting input 501b of the second opamp 501 is preferably connected to a fixed-potential node, in particular grounded.

Figure 32:
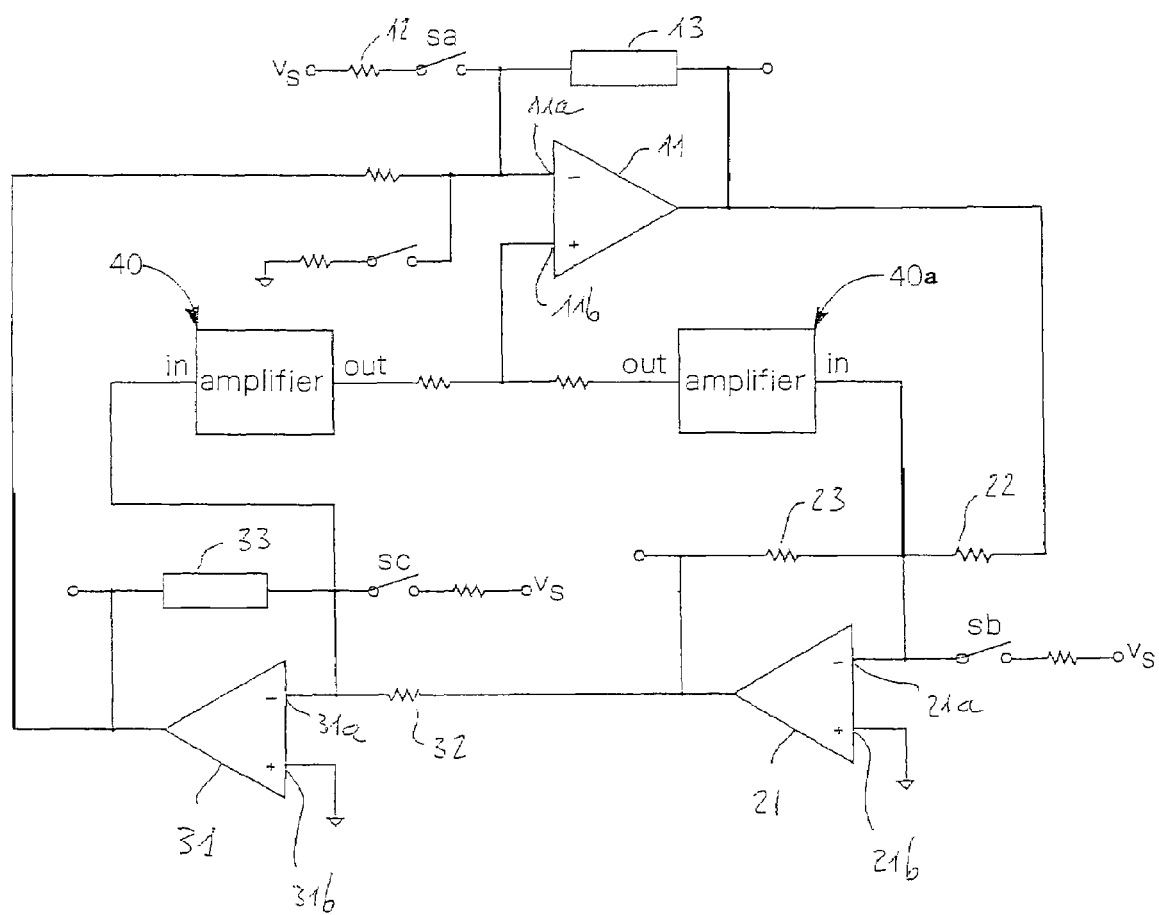

FIG. 32 shows a further configuration of filter 1, in which both the third opamp 31 and the second opamp 21 are connected to the first opamp 11, respectively by means of a fourth and a fifth amplifying stage 40, 40a. A fourth stage 40 in fact has an input "in" connected to the inverting input 31a of the third opamp 31, and an output "out" connected to the noninverting input 11b of the first opamp 11, through a respective resistor.

Also provided between the first and second operational amplifiers 11, 21 is a fifth stage 40a having an input "in" connected to the inverting input 21a of the second opamp 21 and an output "out" connected to the noninverting input 11b of the first opamp, through a respective resistor.

It is to be noted that the noninverting inputs 21b, 31b of the second and third operational amplifiers 21, 31 respectively, are connected to the ground. It is also to be pointed out that the input signal Vs can be supplied, through a suitable resistor, to the inverting input 11a, 21a, 31a of one of the mentioned operational amplifiers 11, 21 and 31, depending on the required type of filtering.

Figure 34:
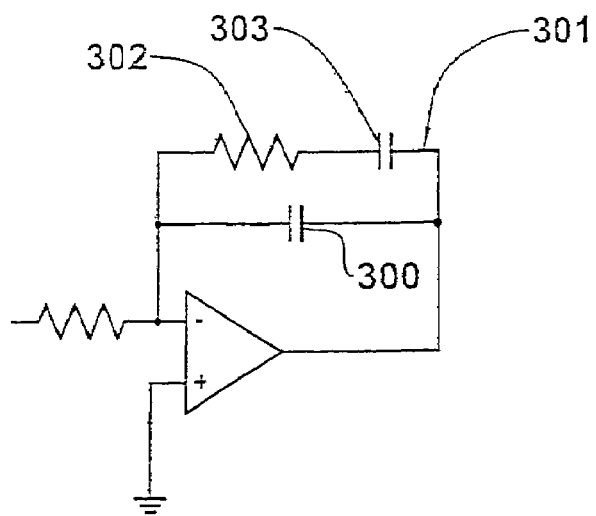

FIG. 34 shows a possible configuration of the feedback means or connecting blocks 13, 23, 33 present in the above described circuits; particularly represented are a resistor 302 and a capacitor 303 that are connected in series and define a branch 301 connected in parallel to a capacitor 300.

Example of a Typical Design of the Filter being the Object of the Invention

In order to verify the functional character of the invention, three different prototypes have been made and among them the one relating to the biquadratic configuration in FIG. 17(A) which has three main outputs: VoBP, VoLP1 and VoLP2, of the band-pass, low-pass and inverting low-pass types, respectively.

Planning Parameters and Operation Conditions of the Prototype:

$Q=100$; $fo=9.952$ KHz;

$|AvoBO|=|AvoLP1|=|AvoLP2|=Avo=1$; $T=27°$ C.

Filter measurement: the feedback means 13 is in particular defined by a capacitor C1 and a resistor RQ in parallel to each other, the feedback means 23 is preferably defined by a capacitor C2 while the resistors 44 and 206 are not used. The simple ideal formulas of the conventional biquadratic filters has been used and the solution with equal components has been adopted.

$C1=C2=C=1$ nF ($\pm 10\%$);

$R22=R32=R33=R51=R=1/(6.28*fo*C)=16$ K$\Omega$ ($\pm 5\%$);

$R60=R=16$ K$\Omega$ ($\pm 5\%$); $RQ=Q*R=1.6$ M$\Omega$; $R12=RQ/Avo=1.6$ M$\Omega$;

Analytical Study of the "Q" Dispersion

In order to analytically prove the exceptional level of stability, in terms of selectivity, of the filter being the object of the invention, three histograms of the "Q" have been drawn up.

Figure 38A:
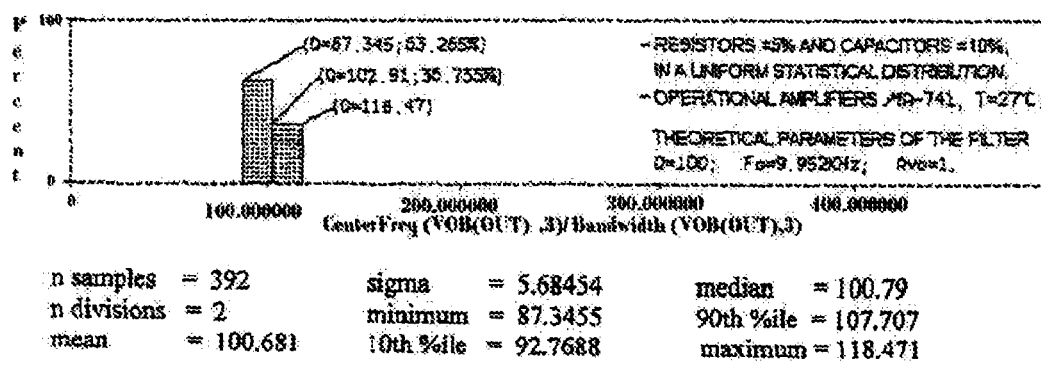
FIGS. 38a, 38b and 38c show distribution histograms relating to the invention.

The first one (FIG. 38a) relates to a normal biquadratic filter, with ideal operational amplifiers.

Figure 38B:
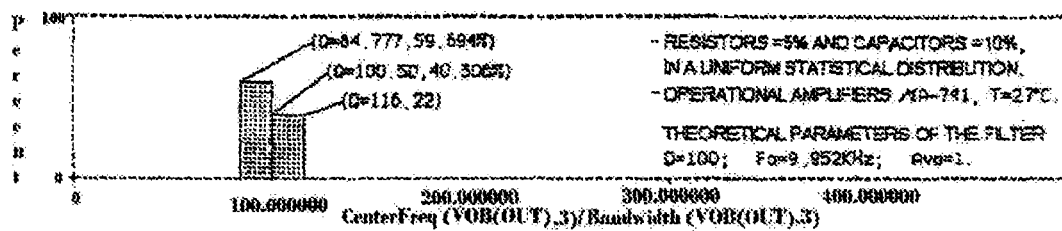

The second one (FIG. 38b) refers to the same configuration but with real operational amplifiers (μa-741) and utilising a self-compensating solution of the invention (see FIG. 17).

Figure 1C:
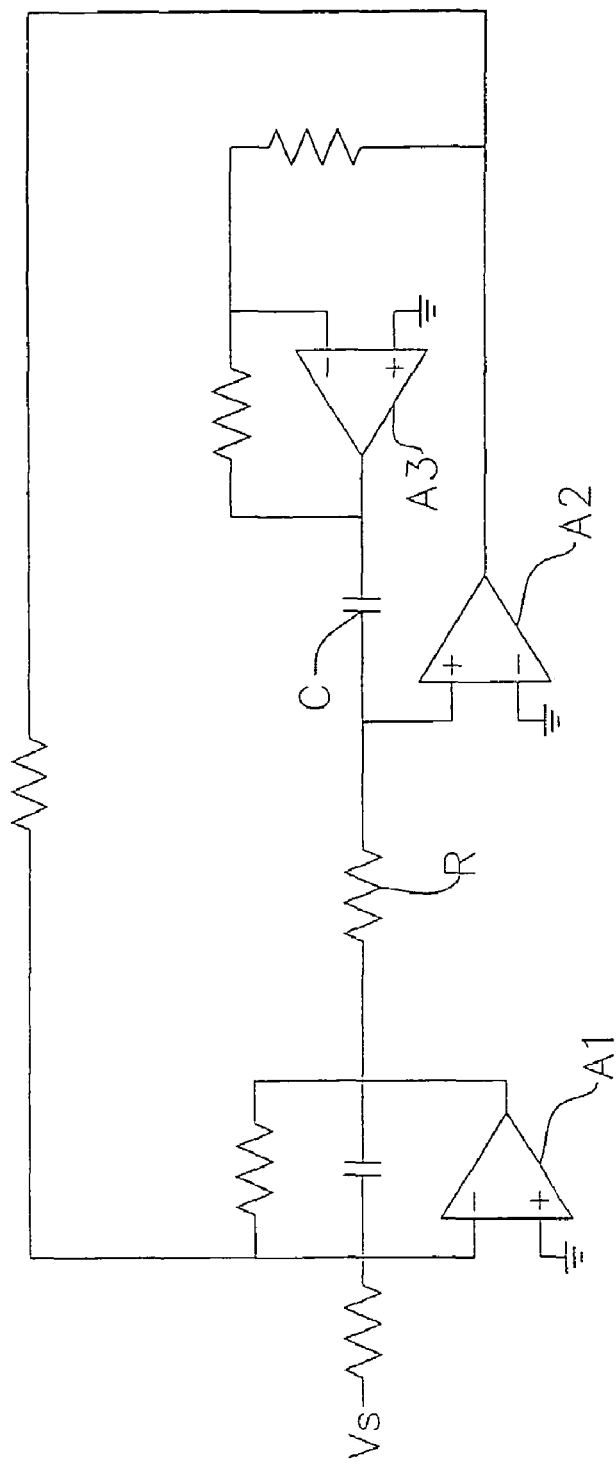
Figure 38C:
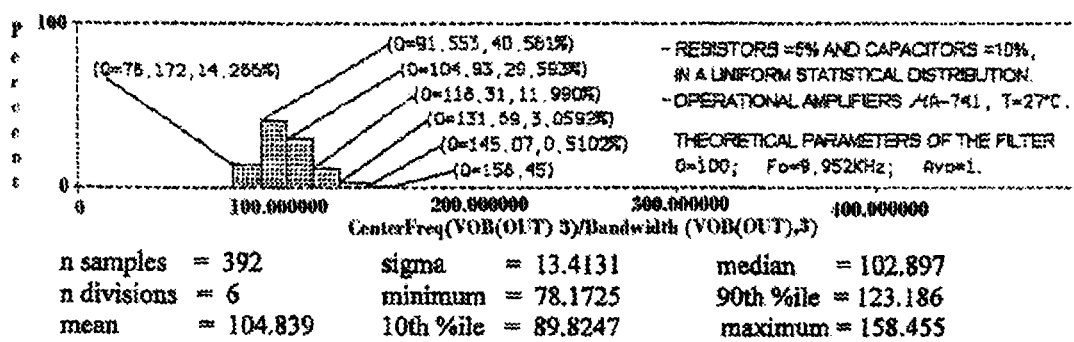

Finally, the third histogram (FIG. 38c) relates to a filter belonging to the same typology as the preceding ones, put in the same achievement conditions as the second one but with a configuration obtained with the technique of the active compensation of the poles, shown in FIG. 1c.

Analysis and Interpretation of the Histograms

In order to process the three histograms, the computer has carried out the same number of Monte Carlo analyses, each comprising 392 A.C. simulations, calculating many of the values that the real "Q" can take, in each of the three filters; then the computer has drawn up the statistical distribution thereof, also carrying out a mathematical-statistical analysis the results of which are reproduced herein.

By comparing the first and second histograms relating to the biquadratic filter with ideal operational amplifiers and to the object of the invention respectively, the following is ascertained.

The ideal filter: has the maximum value assumable by the "Q", equal to 118.47, with an error of +18.47%, in relation to the theoretical nominal "Q"; on the contrary, to the minimum value, which is 87.345, an error of −12.655% corresponds.

The invention: has a maximum "Q" of 116.22, with an error of +16.22%, and a minimum value the error of which corresponds to −15.222%.

The ideal filter: has a mean of the "Q" that is equal to 100.79, to which an average error of +0.79% relative to the theoretical nominal value corresponds.

The object of the invention: gives a mean of 98.358, with an error of −1.642%.

The ideal filter: has a two-division histogram (by division being intended the intervals into which the histogram is divided), and the one of greater probability with 63.265% is delimited by "Q" values included between 87.345 and 102.91.

The most frequently assumable "Q" value is equal to 100.681. The object of the invention too has a two-division histogram; which means a "Q"-variation range which is advantageously very limited. The division comprising the most probable value group with 59.694% is delimited by "Q" values in the range of 84.777 and 100.50; advantageously included among them is the most recurring one, of 99.08, that is almost equal to the theoretical "Q".

The "sigma" is a very important parameter stating the amount of the standard deviation taken by the Gaussian distribution of a parameter (in this case the "Q"), relative to the mean thereof; generally the smaller this deviation, the more stable a device is.

The ideal filter has a "sigma" of 5.6845 and a mean equal to 100.79; consequently it supplies a "Q" that, with a 68% probability, can take values included between 95.105 and 106.47.

The object of the invention has a "sigma" equal to 6.470; taking into account the mean, the "Q" thereof is assumed to be able to have a value included between 91.888 and 104.83, still with a 68% probability.

In terms of statistical distribution, the filter with ideal operational amplifiers has an average concentration that is somewhat higher, since the "sigma" thereof is lower; however it should be taken into account the fact that by increasing the value of "RQ" by 50% and decreasing the values of "R60" by 17.2%, a "sigma" equal to 5.440 is obtained that is advantageously 4.3% lower than the ideal one.

The "sigma" values reproduced in this document are very precise because they are drawn from a high number of A.C. analysis (392 that is more than twice the number normally used for obtaining reliable data); however even if a potential approximate error is considered, the "sigma" of the invention and that of the ideal non-operational filters would appear to be practically identical.

Afterwards, the histogram of the invention (the second one) has been also compared with the one relating to the known filter (the third one). From a first analysis it is possible to see at once that the second histogram is much more performing that the third one.

After a more in-depth study the following is deduced:

The filter being the object of the invention: has a maximum "Q" of 116.22 (+16.22% in comparison with the ideal value) and a minimum "Q" of 84.778 (−15.222%). The filter in FIG. 1c, on the contrary, is submitted to a maximum "Q" of 158.45 (+58.45%). The minimum "Q" is equal to 78.172 and consequently the maximum error by defect is of −21.827%. The whole range delimited by the maximum and minimum values of the "Q" is equal to 80.282 that disadvantageously overcomes that of the filter being the object of the invention by 155.30% (in fact it takes up six divisions instead of two); this involves a "sigma" that is greater than that of the invention.

The filter being the object of the invention: has a range of greater probability of the "Q" with 59.694% in which the assumable values are included between 84.777 and 100.50. The most frequent "Q" is that of 99.08 and it advantageously falls into said range; the most recurring error therefore is equal to −0.92%. The filter in FIG. 1c: has a range in which the "Q" has a maximum concentration of 40.561% and can take values included between 91.553 and 104.93 in which also the most frequent one that is equal to 104.84 is included.

The object of the invention: has a "sigma" equal to 6.4699 that is advantageously lower by 51.764% than that of Sedra's filter; in addition the error of the real mean "Q" as compared with the ideal one is −1.642% instead of +2.897%. This means that in the invention not only the "Q" has a greater stability and is more reduced, but on an average it also takes a value that is more similar to the theoretical one; in fact, the whole range of the standard deviation taken by the filter in FIG. 1c is delimited by two "Q" values equal to 89.484 and 116.31, instead of 91.888 and 104.83, respectively, as it happens in the filter being the object of the present invention.

CONCLUSIONS

From the study on the "Q" dispersion it is possible to conclude that the filter of the diagram in FIG. 17(A) is much more performing than all other known filters of the same kind.

The present invention in fact, unlike the preceding ones, utilises processing of the parasitic voltages caused by the non-ideality of the operational amplifiers; these voltages are in inverse proportion to the open-loop dynamic gain, "A(S)" of the operational amplifiers themselves. The final signal that is used to compensate for the parasitic poles is obtained from the amplification or the amplified sum of said voltages. This processing alters the real transfer function of the filter, makes it virtually ideal and reduces sensitiveness of same towards the passive components. In order to make the compensation effect more efficient, it is necessary that all the operational amplifiers used to make the filter should be of same type and preferably coupled, i.e. belonging to a single integrated circuit; this is necessary because the devices originating from the same manufacturing process have practically identical features that therefore enable a perfect phase counter-balancing in self-compensation processes, also under the most different environmental conditions.

In the light of the above, the great efficiency of the filter of the invention emerges. It is also to be pointed out that the in-line tuning of the frequency "of" is simplified because it is sufficient to act on a single resistor; within limits it is even not necessary to carry out said tuning since the compensation techniques also contemplate an automatic restoration of the "of" itself.

The invention achieves important advantages.

The filter in accordance with the invention is able to compensate for the non idealities introduced by the active elements present in the filter, in an optimal manner.

In particular, through the above described simple expedients in terms of circuits it is possible to compensate for the effects due to the parasitic poles in a very precise manner, irrespective of the number of said poles and the number of the amplification-filtering stages used.

In other words, the above described compensation techniques enable the filter to obtain a behaviour quite similar to the ideal theoretical one that is predictable a priori by means of standard mathematical calculations.

In addition, the above described expedients in terms of circuits are very simple and cheap because generally they are obtained by means of short circuits and single resistors or through a fourth operational amplifier with a useful output that in several cases would be at all events necessary even if the filter were not compensated for in accordance with the techniques of the present invention.

In addition to the above, by virtue of the adopted compensation techniques the operational amplifiers used in the different configurations are not destabilized at high frequency.

The invention claimed is:

1. An active filter comprising:
   a first stage (10) provided with:
   a first operational amplifier (11) having an inverting input (11a), a noninverting input (11b) and an output (11c);
   a resistor (12) having a first end (12a) connected with the inverting input (11a) of said first operational amplifier (11) and a second end (12b) set to receive an input signal (Vs);
   a second resistor (13) having a first end (13a) connected to the inverting input (11a) of said first operational amplifier (11) and a second end (13b) connected with the output (11c) of said first operational amplifier (11);
   a second stage (20) provided with:
   a second operational amplifier (21), having an inverting input (21a), a noninverting input (21b) and an output (21c);
   a resistor (22) having a first end (22a) connected with the inverting input (21a) of said second operational amplifier (21) and a second end (22b) connected to the output (11c) of said first operational amplifier (11);
   feedback means (23) having a first end (23a) connected to the inverting input (21a) of said second operational amplifier (21) and a second end (23b) connected to the output (21c) of said second operational amplifier (21);
   a third stage (30) provided with:
   a third operational amplifier (31) having an inverting input (31a), a noninverting input (31b) and an output (31c);
   a resistor (32) having a first end (32a) connected to the inverting input (31a) of said third operational amplifier (31) and a second end (32b) connected to the output (21c) of said second operational amplifier (21);
   feedback means (33) having a first end (33a) connected to the inverting input (31a) of said third operational amplifier (31), and a second end (33b) connected to the output (31c) of said third operational amplifier (31);
   a main feedback branch (50) defined by a resistor (51) and having a first end (50a) connected to the output (310) of said third operational amplifier (31), and a second end (50b) connected to the inverting input (11a) of said first operational amplifier (11),
   further comprising a fourth stage (40) provided with:
   a fourth operational amplifier (41) having an inverting input (41a), a noninverting input (41b) and an output (41c), said inverting input (41a) being connected to the noninverting input (11b, 21b or 31b) of one of said first, second and third operational amplifiers (11, 21, 31), either directly or through a resistor;
   a first resistor (42) having a first end (42a) connected to the inverting input (41a) of said fourth operational amplifier (41) and a second end (42b);
   a second resistor (43) having a first end (43a) connected to the inverting input (41a) of said fourth operational amplifier (41) and a second end (43b) connected to the output (41c) of said fourth operational amplifier (41).

2. A filter as claimed in claim 1, wherein the feedback means (23) of said second stage (20) is defined by a branch comprising a capacitor and a resistor connected to each other in series, this branch being parallel-connected to a capacitor.

3. A filter as claimed in claim 1, wherein the second end (42b) of the first resistor (42) of said fourth stage (40) is connected to the output (11c) of said first operational amplifier (11).

4. A filter as claimed in claim 3, wherein the inverting input (31a) of said third operational amplifier (31) is directly connected to the noninverting input (41b) of said fourth operational amplifier (41), the inverting input (41a) of said fourth operational amplifier (41) being connected to the noninverting input (11b) of said first operational amplifier (11), either directly or through a resistor.

5. A filter as claimed in claim 4, further comprising a feedback resistor (106) having a first end (106a) connected to the output (21c) of said second operational amplifier (21), and a second end (106b) connected to the noninverting input (11b) of said first operational amplifier (11).

6. A filter as claimed in claim 3, wherein the noninverting input (41b) of said fourth operational amplifier (41) is directly connected to the inverting input (21a) of said second operational amplifier (21), the inverting input (41a) of said fourth operational amplifier (41) being directly connected to the noninverting input (11b) of said first operational amplifier (11), a direct connection (203) being between the inverting input (11a) of said first operational amplifier (11) and the noninverting input (31b) of said third operational amplifier (31).

7. A filter as claimed in claim 6, further comprising an auxiliary resistor (61) connected between the inverting input (31a) of said third operational amplifier (31) and a fixed-potential node.

8. An active filter comprising:
   a first stage (10) provided with:
   a first operational amplifier (11) having an inverting input (11a), a noninverting input (11b) and an output (11c);
   a resistor (12) having a first end (12a) connected with the inverting input (11a) of said first operational amplifier (11) and a second end (12b) set to receive an input signal (Vs);
   feedback means (13) having a first end (13a) connected to the inverting input (11a) of said first operational amplifier (11) and a second end (13b) connected with the output (11c) of said first operational amplifier (11);
   a second stage (20) provided with:
   a second operational amplifier (21), having an inverting input (21a), a noninverting input (21b) and an output (21c);
   a resistor (22) having a first end (22a) connected with the inverting input (21a) of said second operational amplifier (21) and a second end (22b) connected to the output (11c) of said first operational amplifier (11);
   feedback means (23) having a first end (23a) connected to the inverting input (21a) of said second operational amplifier (21) and a second end (23b) connected to the output (21c) of said second operational amplifier (21);
   a third stage (30) provided with:
   a third operational amplifier (31) having an inverting input (31a), a noninverting input (31b) and an output (31c);
   a first resistor (32) having a first end (32a) connected to the inverting input (31a) of said third operational amplifier (31) and a second end (32b) connected to the output (21c) of said second operational amplifier (21);
   a second resistor (33) having a first end (33a) connected to the inverting input (31a) of said third operational amplifier (31), and a second end (33b) connected to the output (31c) of said third operational amplifier (31);

a main feedback branch (50) defined by a resistor (51) and having a first end (50a) connected to the output (31c) of said third operational amplifier (31), and a second end (50b) connected to the inverting input (11a) of said first operational amplifier (11), further comprising a fourth stage (40) provided with:
a fourth operational amplifier (41) having an inverting input (41a), a noninverting input (41b) and an output (41c), said inverting input (41a) being directly connected either to the noninverting input (11b) of said first operational amplifier (11) or to the noninverting input (31b) of said third operational amplifier (31);
a first resistor (42) having a first end (42a) connected to the inverting input (41a) of said fourth operational amplifier (41), and a second end (42b) connected to the output (11c) of said first operational amplifier (11);
a second resistor (43) having a first end (43a) connected to the inverting input (41a) of said fourth operational amplifier (41), and a second end (43b) connected to the output (41c) of said fourth operational amplifier (41).

9. A filter as claimed in claim 8, wherein the inverting input (31a) of said third operational amplifier (31) is directly connected to the noninverting input (41b) of said fourth operational amplifier (41), a direct connection (201) being between the inverting input (31a) of said third operational amplifier (31) and the noninverting input (21b) of said second operational amplifier (21), the inverting input (41a) of said fourth operational amplifier (41) being directly connected to the noninverting input (11b) of said first operational amplifier (11).

10. A filter as claimed in claim 9, further comprising a main resistor (60) connected between the inverting input (11a) of said first operational amplifier (11) and a fixed-potential node.

11. An active filter comprising:
a first stage (10) provided with:
a first operational amplifier (11) having an inverting input (11a), a noninverting input (11b) and an output (11c);
a resistor (12) having a first end (12a) connected with the inverting input (11a) of said first operational amplifier (11) and a second end (12b) set to receive an input signal (Vs);
feedback means (13) having a first end (13a) connected to the inverting input (11a) of said first operational amplifier (11) and a second end (13b) connected with the output (11c) of said first operational amplifier (11);
a second stage (20) provided with:
a second operational amplifier (21), having an inverting input (21a), a noninverting input (21b) and an output (21c);
a first resistor (22) having a first end (22a) connected with the inverting input (21a) of said second operational amplifier (21) and a second end (22b) connected to the output (11c) of said first operational amplifier (11);
a second resistor (23) having a first end (23a) connected to the inverting input (21a) of said second operational amplifier (21) and a second end (23b) connected to the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31) and a second end (32b) connected to the output (21c) of said second operational amplifier (21);
feedback means (33) having a first end (33a) connected to the inverting input (31a) of said third operational amplifier (31) and a second end (33b) connected to the output (31c) of said third operational amplifier (31);
a main feedback branch (50) defined by a resistor (51) and having a first end (50a) connected to the output (31c) of said third operational amplifier (31), and a second end (50b) connected to the inverting input (11a) of said first operational amplifier (11), further comprising a fourth stage (40) provided with:
a fourth operational amplifier (41) having an inverting input (41a), a noninverting input (41b) and an output (41c), said inverting input (41a) being directly connected with the noninverting input (11b) of said first operational amplifier (11) or the noninverting input (21b) of said second operational amplifier (21);
a first resistor (42) having a first end (42a) connected to the inverting input (41a) of said fourth operational amplifier (41) and a second end (42b) connected to the output (21c) of said second operational amplifier (21);
a second resistor (43) having a first end (43a) connected to the inverting input (41a) of said fourth operational amplifier (41) and a second end (43b) connected to the output (41c) of said fourth operational amplifier (41).

12. A filter as claimed in claim 11, further comprising a main resistor (60) having a first end (60a) connected to the inverting input (11a) of said first operational amplifier (11) and a second end (60b) connected to a fixed-potential node.

13. A filter as claimed in claim 11, further comprising a direct connection (81) between the inverting input (31a) of said third operational amplifier (31) and the noninverting input (11b) of said first operational amplifier (11), the noninverting input (41b) of said fourth operational amplifier (41) being connected to a fixed-potential node, the inverting input (41a) of said fourth operational amplifier (41) being directly connected to the noninverting input (21b) of said second operational amplifier (21).

14. A filter as claimed in claim 11, further comprising a direct connection (82) between the inverting input (11a) of said first operational amplifier (11) and the noninverting input (41b) of said fourth operational amplifier (41), the inverting input (41a) of said fourth operational amplifier (41) being directly connected to the noninverting input (21b) of said second operational amplifier (21).

15. A filter as claimed in claim 11, further comprising a direct connection (84) between the inverting input (31a) of said third operational amplifier (31) and the noninverting input (41b) of said fourth operational amplifier (41).

16. A filter as claimed in claim 12, further comprising a direct connection (84) between the inverting input (31a) of said third operational amplifier (31) and the noninverting input (41b) of said fourth operational amplifier (41).

17. A filter as claimed in claim 15, further comprising a direct connection (85) between the inverting input (11a) of said first operational amplifier (11) and the noninverting input (21b) of said second operational amplifier (21), the inverting input (41a) of said fourth operational amplifier (41) being directly connected to the noninverting input (11b) of said first operational amplifier (11).

18. A filter as claimed in claim 15, further comprising a direct connection (87) between the inverting input (21a) of said second operational amplifier (21) and the noninverting input (11b) of said first operational amplifier (11), the inverting input (41a) of said fourth operational amplifier (41) being directly connected to the noninverting input (21b) of said second operational amplifier (21).

19. A filter as claimed in claim 12, further comprising a direct connection (81) between the inverting input (31a) of said third operational amplifier (31) and the noninverting input (11b) of said first operational amplifier (11), the noninverting input (41b) of said fourth operational amplifier (41) being connected to a fixed-potential node, the inverting input (41a) of said fourth operational amplifier (41) being directly connected to the noninverting input (21b) of said second operational amplifier (21).

20. A filter as claimed in claim 16, further comprising a direct connection (87) between the inverting input (21a) of said second operational amplifier (21) and the noninverting input (11b) of said first operational amplifier (11), the inverting input (41a) of said fourth operational amplifier (41) being directly connected to the noninverting input (21b) of said second operational amplifier (21).

21. An active filter comprising:
a first stage (10) provided with:
a first operational amplifier (11) having an inverting input (11a), a noninverting input (11b) and an output (11c);
feedback means (13) having a first end (13a) connected to the inverting input (11a) of said first operational amplifier (11) and a second end (13b) connected to the output (11c) of said first operational amplifier (11);
a resistor (12) having a first end (12a) connected to the inverting input (11a) of said first operational amplifier (11) and a second end (12b) set to receive an input signal (Vs);
a second stage (20) provided with:
a second operational amplifier (21), having an inverting input (21a), a noninverting input (21b) and an output (21c);
feedback means (23) having a first end (23a) connected to the inverting input (21a) of said second operational amplifier (21) and a second end (23b) connected to the output (21c) of said second operational amplifier (21);
a resistor (22) having a first end (22a) connected with the inverting input (21a) of said second operational amplifier (21) and a second end (22b) connected to the output (11c) of said first operational amplifier (11);
a third stage (30) provided with:
a third operational amplifier (31) having an inverting input (31a), a noninverting input (31b) and an output (31c);
a first resistor (32) having a first end (32a) connected to the inverting input (31a) of said third operational amplifier (31) and a second end (32b) connected to the output (21c) of said second operational amplifier (21);
a second resistor (33) having a first end (33a) connected to the inverting input (31a) of said third operational amplifier (31) and a second end (33b) connected to the output (31c) of said third operational amplifier (31);
a main feedback branch (50) defined by a resistor (51) and having a first end (50a) connected to the output (31c) of said third operational amplifier (31) and a second end (50b) connected to the inverting input (11a) of said first operational amplifier (11),
further comprising a fourth stage (40) provided with:
a fourth operational amplifier (41) having an inverting input (41a), a noninverting input (41b) and an output (41c);
a first resistor (42) having a first end (42a) connected to the inverting input (41a) of said fourth operational amplifier (41) and a second end (42b) connected to the output (31c) of said third operational amplifier (31), the inverting input (41a) of said fourth operational amplifier (41) being directly connected with the noninverting input (21b) of said second operational amplifier (21) or with the noninverting input (31b) of said third operational amplifier (31);

a second resistor (43) having a first end (43a) connected to the inverting input (41a) of said fourth operational amplifier (41) and a second end (43b) connected to the output (41c) of said fourth operational amplifier (41).

22. A filter as claimed in claim 21, further comprising a direct connection (223) between the inverting input (21a) of said second operational amplifier (21) and the noninverting input (41b) of said fourth operational amplifier (41), the inverting input (41a) of said fourth operational amplifier (41) being directly connected to the noninverting input (31b) of said third operational amplifier (31).

23. An active filter comprising:
a first stage (10) provided with:
a first operational amplifier (11) having an inverting input (11a), a noninverting input (11b) and an output (11c);
a resistor (12) having a first end (12a) connected with the inverting input (11a) of said first operational amplifier (11) and a second end (12b) set to receive an input signal (Vs);
feedback means (13) having a first end (13a) connected to the inverting input (11a) of said first operational amplifier (11) and a second end (13b) connected with the output (11c) of said first operational amplifier (11);
a second stage (20) provided with:
a second operational amplifier (21), having an inverting input (21a), a noninverting input (21b) and an output (21c);
a first resistor (22) having a first end (22a) connected with the inverting input (21a) of said second operational amplifier (21) and a second end (22b) connected to the output (11c) of said first operational amplifier (11);
a second resistor (23) having a first end (23a) connected to the inverting input (21a) of said second operational amplifier (21) and a second end (23b) connected to the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31) and a second end (32b) connected to the output (21c) of said second operational amplifier (21);
feedback means (33) having a first end (33a) connected to the inverting input (31a) of said third operational amplifier (31) and a second end (33b) connected to the output (31c) of said third operational amplifier (31);
a main feedback branch (50) defined by a resistor (51) and having a first end (50a) connected to the output (31c) of said third operational amplifier (31) and a second end (50b) connected to the inverting input (11a) of said first operational amplifier (11), characterised in that it further comprises a fourth stage (40) provided with:
a fourth operational amplifier (41) having an inverting input (41a) directly connected to the noninverting input (21b) of said second operational amplifier (21) or the noninverting input (31b) of said third operational amplifier (31), a noninverting input (41b) and an output (41c);
a first resistor (42) having a first end (42a) connected to the inverting input (41a) of said fourth operational amplifier (41) and a second end (42b) connected to the output (31c) of said third operational amplifier (31);
a second resistor (43) having a first end (43a) connected to the inverting input (41a) of said fourth operational amplifier (41) and a second end (43b) connected to the output (41c) of said fourth operational amplifier (41).

24. A filter as claimed in claim 23, further comprising a direct connection (77) between the inverting input (31a) of said third operational amplifier (31) and the noninverting input (11b) of said first operational amplifier (11).

25. A filter as claimed in claim 24, wherein the noninverting input (41b) of said fourth operational amplifier (41) is directly connected to the inverting input (21a) of said second operational amplifier (21), said filter further comprising an auxiliary resistor (61) connected between the inverting input (31a) of said third operational amplifier (31) and a fixed-potential node, the inverting input (41a) of said fourth operational amplifier (41) being directly connected to the noninverting input (31b) of said third operational amplifier (31).

26. An active filter comprising:
a first stage (10) provided with:
a first operational amplifier (11) having an inverting input (11a), a noninverting input (11b) and an output (11c);
a resistor (12) having a first end (12a) connected to the inverting input (11a) of said first operational amplifier (11) and a second end (12b) set to receive an input signal (Vs);
feedback means (13) having a first end (13a) connected to the inverting input (11a) of said first operational amplifier (11) and a second end (13b) connected to the output (11c) of said first operational amplifier (11);
a second stage (20) provided with:
a second operational amplifier (21), having an inverting input (21a), a noninverting input (21b) and an output (21c);
a resistor (22) having a first end (22a) connected to the inverting input (21a) of said second operational amplifier (21) and a second end (22b) connected to the output (11c) of said first operational amplifier (11);
feedback means (23) having a first end (23a) connected to the inverting input (21a) of said second operational amplifier (21) and a second end (23b) connected to the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31) and a second end (32b) connected to the output (21c) of said second operational amplifier (21);
feedback means (33) having a first end (33a) connected to the inverting input (31a) of said third operational amplifier (31) and a second end (33b) connected to the output (31c) of said third operational amplifier (31);
a main feedback branch (50) defined by a resistor (51) and having a first end (50a) connected to the output (31c) of said third operational amplifier (31) and a second end (50b) connected to the inverting input (11a) of said first operational amplifier (11),
further comprising a first connecting branch having a first end connected to
the inverting input of said first or second operational amplifier, and a second end connected to the noninverting input of at least one of the two operational amplifiers among said operational amplifiers (11, 21, 31) different from the operational amplifier whose inverting input is connected to the first end of the first connecting branch, said first connecting branch being also defined by a respective fourth stage provided with an amplifier and having an input ("in") connected to the first end of said first connecting branch, and an output ("out") connected to the second end of the same branch.

27. A filter as claimed in claim 26, further comprising a second connecting branch having a first end connected to the inverting input of said third operational amplifier and a second end connected to the noninverting input of said first operational amplifier.

28. A filter as claimed in claim 27, wherein said second connecting branch is defined by a direct connection.

29. A filter as claimed in claim 27, wherein said second connecting branch is defined by a respective fifth stage provided with an amplifier and having an input ("in") connected to the first end of said second connecting branch and an output ("out") connected to the second end of the same branch.

30. A filter as claimed in claim 26, further comprising a second connecting branch having a first end connected to the inverting input (31a) of said third operational amplifier (31), and a second end connected to the noninverting input (21b) of said second operational amplifier (21).

31. A filter as claimed in claim 26 wherein the output ("out") of said fourth stage is connected to the second end of the first connecting branch through a respective resistor, the second end of said first connecting branch being also connected to an end of a respective resistor different from said respective resistor of the output ("out") of said fourth stage.

32. An active filter comprising:
a first stage (10) provided with:
a first operational amplifier (11) having an inverting input (11a), a noninverting input (11b) and an output (11c);
a resistor (12) having a first end (12a) connected with the inverting input (11a) of said first operational amplifier (11) and a second end (12b) set to receive an input signal (Vs);
feedback means (13) having a first end (13a) connected to the inverting input (11a) of said first operational amplifier (11) and a second end (13b) connected with the output (11c) of said first operational amplifier (11);
a second stage (20) provided with:
a second operational amplifier (21), having an inverting input (21a), a noninverting input (21b) and an output (21c);
a first resistor (22) having a first end (22a) connected with the inverting input (21a) of said second operational amplifier (21) and a second end (22b) connected to the output (11c) of said first operational amplifier (11);
feedback means (23) having a first end (23a) connected to the inverting input (21a) of said second operational amplifier (21), and a second end (23b) connected with the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31), and a second end (32b) connected to the output (21c) of said second operational amplifier (21);
feedback means (33) having a first end (33a) connected to the inverting input (31a) of said third operational amplifier (31), and a second end (33b) connected to the output (31c) of said third operational amplifier (31);
a main feedback branch (50), preferably defined by a resistor (51), and having a first end (50a) connected to the output (31c) of said third operational amplifier (31), and a second end (50b) connected to the inverting input (11a) of said first operational amplifier (11),
further comprising a first resistor connected between the inverting input of said first operational amplifier and a fixed-potential node,
a direct connection being provided between the noninverting input of said first operational amplifier and the inverting input of said second or third operational amplifier.

33. A filter as claimed in claim 32 further comprising a second resistor connected between the inverting input of said third operational amplifier and a fixed-potential node.

34. An active filter comprising:
a first stage (10) provided with:
a first operational amplifier (11) having an inverting input (11a), a noninverting input (11b) and an output (11c);
a resistor (12) having a first end (12a) connected to the inverting input (11a) of said first operational amplifier (11), and a second end (12b) set to receive an input signal (Vs);
a first connecting block (13) having a first end (13a) connected to the inverting input (11a) of said first operational amplifier (11), and a second end (13b);
a first connecting branch (15) having a first end (15a) connected to the second end (13b) of said first connecting block (13), and a second end (15b) connected to the output (11c) of said first operational amplifier (11);
a second stage (20) provided with:
a second operational amplifier (21) having an inverting input (21a), a noninverting input (21b) and an output (21c);
a resistor (22) having a first end (22a) connected to the inverting input (21a) of said second operational amplifier (21), and a second end (22b) connected to the output (11c) of said first operational amplifier (11);
a second connecting block (23) having a first end (23a) connected to the inverting input (21a) of said second operational amplifier (21), and a second end (23b);
a second connecting branch (25) having a first end (25a) connected to the second end (23b) of said second connecting block (23), and a second end (25b) connected to the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31), and a second end (32b) connected to the output (21c) of said second operational amplifier (21);
a third connecting block (33) having a first end (33a) connected to the inverting input (31a) of said third operational amplifier (31), and a second end (33b);
a third connecting branch (35) having a first end (35a) connected to the second end (33b) of said third connecting block (33), and a second end (35b) connected to the output (31c) of said third operational amplifier (31);
a main feedback branch (50) defined by a resistor (51), and having a first end (50a) connected to the output (31c) of said third operational amplifier (31), and a second end (50b) connected to the inverting input (11a) of said first operational amplifier (11), a predetermined one of said first, second and third connecting branches (15, 25, 35) comprising a fourth stage (40) provided with:
a fourth operational amplifier (41) having an inverting input (41a), a noninverting input (41b) and an output (41c), the latter being connected to the first end (15a, 25a, or 35a) of said predetermined connecting branch (15, 25 or 35), the noninverting input (41b) of said fourth operational amplifier (41) being connected to the second end (15b, 25b, or 35b) of said predetermined connecting branch (15, 25 or 35);
a feedback branch (91) connected between the output (41c) and the inverting input (41a) of said fourth operational amplifier (41),
further comprising a direct connection between the noninverting input (11b) of said first operational amplifier (11), and the inverting input (21a, 31a) of said second or third operational amplifier (21, 31).

35. A filter as claimed in claim 34, wherein said fourth stage (40) further comprises a resistor (43), connected between the noninverting input (41b) and the output (41c) of said fourth operational amplifier (41), said noninverting input (41b) being connected to the second end (15b, 25b, 35b) of said predetermined connecting branch (15, 25, 35) through a resistor (42), said feedback branch (91) being defined by a short circuit.

36. A filter as claimed in claim 34, wherein said fourth stage (40) further comprises a resistor (43), connected between the inverting input (41a) of said fourth operational amplifier (41) and the second end (15b, 25b, 35b) of said predetermined connecting branch (15, 25, 35), said feedback branch (91) being defined by a resistor (44).

37. An active filter comprising:
a first stage (10) provided with:
a first operational amplifier (11) having an inverting input (11a), a noninverting input (11b) and an output (11c);
a resistor (12) having a first end (12a) connected to the inverting input (11a) of said first operational amplifier (11), and a second end (12b) set to receive an input signal (Vs);
feedback means (13) having a first end (13a) connected to the inverting input (11a) of said first operational amplifier (11) and a second end (13b) connected to the output (11c) of said first operational amplifier (11);
a second stage (20) provided with:
a second operational amplifier (21) having an inverting input (21a), a noninverting input (21b) and an output (21c);
a resistor (22) having a first end (22a) connected to the inverting input (21a) of said second operational amplifier (21) and a second end (22b) connected to the output (11c) of said first operational amplifier (11);
feedback means (23) having a first end (23a) connected to the inverting input (21a) of said second operational amplifier (21) and a second end (23b) connected to the output (21c) of said second operational amplifier (21);
a third stage (30) provided with:
a third operational amplifier (31) having an inverting input (31a), a noninverting input (31b) and an output (31c);
a resistor (32) having a first end (32a) connected to the inverting input (31a) of said third operational amplifier (31) and a second end (32b) connected to the output (21c) of said second operational amplifier (21);
feedback means (33) having a first end (33a) connected to the inverting input (31a) of said third operational amplifier (31) and a second end (33b) connected to the output (31c) of said third operational amplifier (31);
a main feedback branch (50) defined by a resistor (51) and having a first end (50a) connected to the output (31c) of said third operational amplifier (31) and a second end (50b) connected to the inverting input (11a) of said first operational amplifier (11),
further comprising a connecting branch having a first end connected to the inverting input (31a) of said third operational amplifier (31), and a second end connected to the noninverting input of at least one of the two operational amplifiers among said operational amplifiers (11, 21, 31), different from said third operational amplifier (31), said connecting branch being also defined by a respective fourth stage provided with an amplifier, and having an input ("in") connected to the first end of said connecting branch and an output ("out") connected to the second end of the same branch.

* * * * *

UNITED STATES PATENT AND TRADEMARK OFFICE
CERTIFICATE OF CORRECTION

PATENT NO. : 7,683,703 B2 Page 1 of 1
APPLICATION NO. : 10/566456
DATED : March 23, 2010
INVENTOR(S) : Roberto Cavazzoni It is certified that error appears in the above-identified patent and that said Letters Patent is hereby corrected as shown below:

In column 23, line 48, please delete "(310)" and insert --(31c)--.

In column 31, line 32, please delete "(310)" and insert --(31c)--.

Signed and Sealed this

Twentieth Day of July, 2010

David J. Kappos
*Director of the United States Patent and Trademark Office*